United States Patent
Cui et al.

(10) Patent No.: US 10,192,784 B1
(45) Date of Patent: Jan. 29, 2019

(54) THREE-DIMENSIONAL MEMORY DEVICE CONTAINING SELF-ALIGNED CONTACT VIA STRUCTURES AND METHODS OF MANUFACTURING THE SAME

(71) Applicant: SANDISK TECHNOLOGIES LLC, Plano, TX (US)

(72) Inventors: Zhixin Cui, Yokkaichi (JP); Hiroshi Minakata, Yokkaichi (JP); Keigo Kitazawa, Yokkaichi (JP); Yoshiyuki Okura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/902,169

(22) Filed: Feb. 22, 2018

(51) Int. Cl.
 *H01L 27/11524* (2017.01)
 *H01L 21/768* (2006.01)
 (Continued)

(52) U.S. Cl.
 CPC .. *H01L 21/76897* (2013.01); *H01L 21/76816* (2013.01); *H01L 23/528* (2013.01); *H01L 23/5226* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01);
 (Continued)

(58) Field of Classification Search
 CPC ........ H01L 21/76897; H01L 21/76816; H01L 23/5226; H01L 27/11565; H01L 27/11573; H01L 27/1157; H01L 27/11519; H01L 27/11529; H01L 27/11556; H01L 27/11524; H01L 27/11582; H01L 23/528
 See application file for complete search history.

(56) References Cited

U.S. PATENT DOCUMENTS 5,915,167 A 6/1999 Leedy
8,349,681 B2 1/2013 Alsmeier et al.
(Continued)

OTHER PUBLICATIONS

U.S. Appl. No. 15/251,374, filed Aug. 30, 2016, Sandisk Technologies LLC.
(Continued)

*Primary Examiner* — Jarrett J Stark
(74) *Attorney, Agent, or Firm* — The Marbury Law Group PLLC

(57) ABSTRACT

An alternating stack of insulating layers and sacrificial material layers including stepped surfaces is formed over a substrate. After formation of a retro-stepped dielectric material portion over the stepped surfaces, an array of cylindrical openings is formed through the retro-stepped dielectric material portion and the alternating stack. A continuous cavity is formed by isotropically etching the insulating layers and the retro-stepped dielectric material portion selective to the sacrificial material layers. Remaining portions of the retro-stepped dielectric material portion include dielectric pillar structures. A continuous fill material portion is formed in the continuous cavity. Memory stack structures are formed through the alternating stack. The sacrificial material layers and the dielectric pillar structures are replaced with combinations of an electrically conductive layer and a contact via structure. The contact via structures are self-aligned to the electrically conductive layers.

12 Claims, 76 Drawing Sheets

(51) Int. Cl.
*H01L 27/11556* (2017.01)
*H01L 27/11529* (2017.01)
*H01L 27/11519* (2017.01)
*H01L 27/11582* (2017.01)
*H01L 27/11573* (2017.01)
*H01L 27/11565* (2017.01)
*H01L 23/522* (2006.01)
*H01L 23/528* (2006.01)
*H01L 27/1157* (2017.01)

(52) U.S. Cl.
CPC .. *H01L 27/11573* (2013.01); *H01L 27/11582* (2013.01)

(56) References Cited

U.S. PATENT DOCUMENTS

| | | | |
|---|---|---|---|
| 8,658,499 B2 | 2/2014 | Makala et al. | |
| 8,847,302 B2 | 9/2014 | Alsmeier et al. | |
| 9,023,719 B2 | 5/2015 | Pachamuthu et al. | |
| 9,177,966 B1 | 11/2015 | Rabkin et al. | |
| 9,356,031 B2 | 5/2016 | Lee et al. | |
| 9,412,753 B2 | 8/2016 | Izumi et al. | |
| 9,419,012 B1 | 8/2016 | Shimabukuro et al. | |
| 9,449,983 B2 | 9/2016 | Yada et al. | |
| 9,455,263 B2 | 9/2016 | Zhang et al. | |
| 9,460,931 B2 | 10/2016 | Pachamuthu et al. | |
| 9,502,429 B2 | 11/2016 | Hironaga | |
| 9,515,023 B2 | 12/2016 | Tobitsuka et al. | |
| 9,515,085 B2 | 12/2016 | Rabkin et al. | |
| 9,524,901 B2 | 12/2016 | Izumi et al. | |
| 9,576,975 B2* | 2/2017 | Zhang | H01L 27/11582 |
| 9,728,499 B2 | 8/2017 | Shimabukuro et al. | |
| 9,853,038 B1 | 12/2017 | Cui | |
| 9,875,929 B1 | 1/2018 | Shukla et al. | |
| 2005/0051831 A1* | 3/2005 | Kajimoto | H01L 21/76838 257/314 |
| 2013/0341701 A1 | 12/2013 | Blomme et al. | |
| 2015/0011094 A1 | 1/2015 | Narishige et al. | |
| 2016/0148835 A1 | 5/2016 | Shimabukuro et al. | |
| 2016/0293621 A1* | 10/2016 | Huang | H01L 27/0207 |
| 2017/0125433 A1* | 5/2017 | Ogawa | H01L 23/5226 |
| 2017/0179144 A1* | 6/2017 | Han | H01L 21/76877 |
| 2018/0019257 A1* | 1/2018 | Son | H01L 23/5283 |

OTHER PUBLICATIONS

U.S. Appl. No. 15/367,791, filed Dec. 2, 2016, Sandisk Technologies LLC.
U.S. Appl. No. 15/451,773, filed Mar. 7, 2017, Sandisk Technologies LLC.
U.S. Appl. No. 15/468,519, filed Mar. 24, 2017, Sandisk Technologies LLC.
U.S. Appl. No. 15/478,637, filed Apr. 4, 2017, Sandisk Technologies LLC.
U.S. Appl. No. 15/488,924, filed Apr. 17, 2017, Sandisk Technologies LLC.
U.S. Appl. No. 15/638,672, filed Jun. 30, 2017, Sandisk Technologies LLC.
U.S. Appl. No. 15/720,556, filed Sep. 29, 2017, Sandisk Technologies LLC.
U.S. Appl. No. 15/805,599, filed Nov. 7, 2017, Sandisk Technologies LLC.
U.S. Appl. No. 15/826,796, filed Nov. 30, 2017, Sandisk Technologies LLC.
U.S. Appl. No. 15/834,261, filed Dec. 7, 2017, Sandisk Technologies LLC.
U.S. Appl. No. 15/892,228, filed Feb. 8, 2018, Sandisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

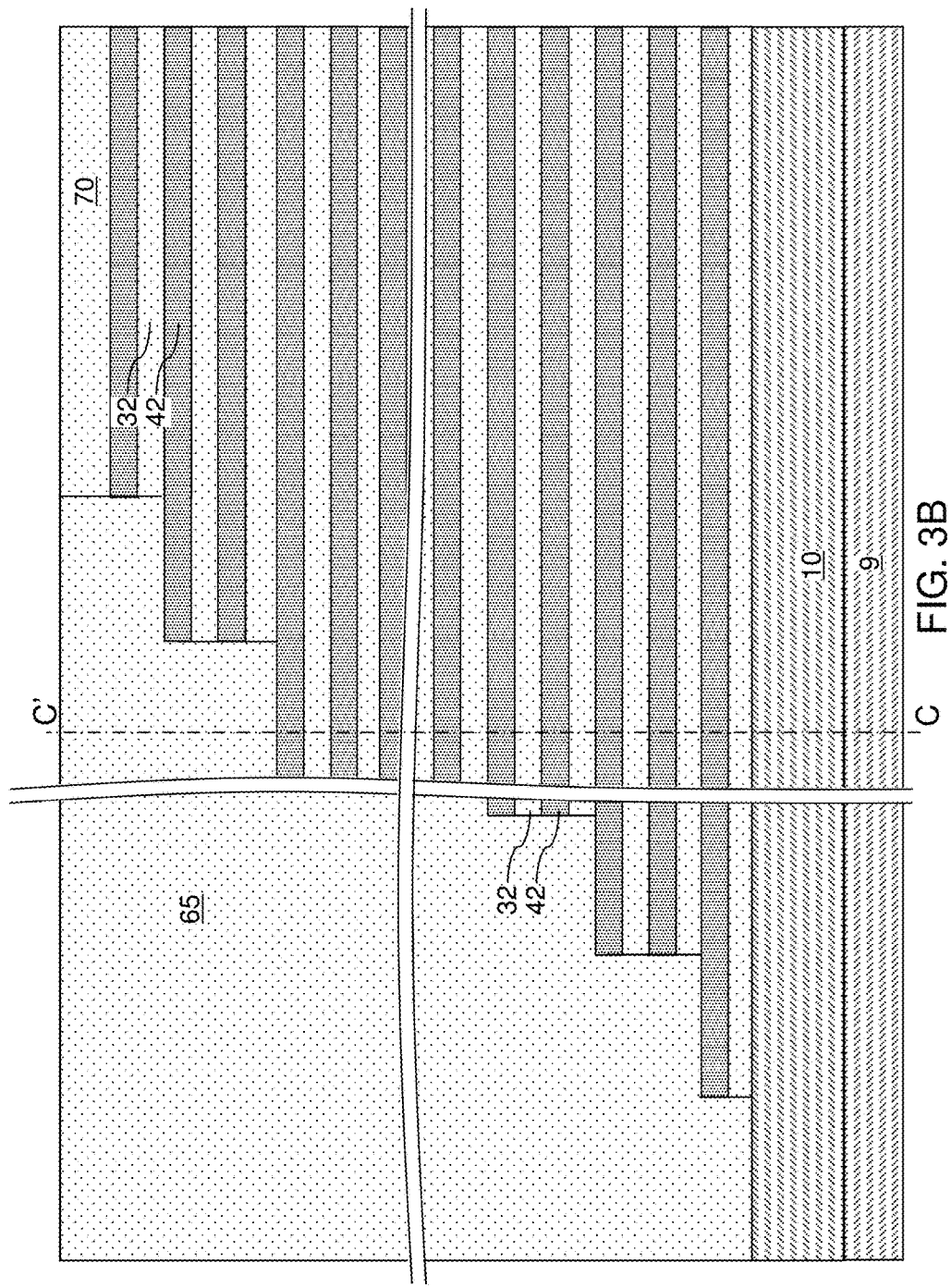

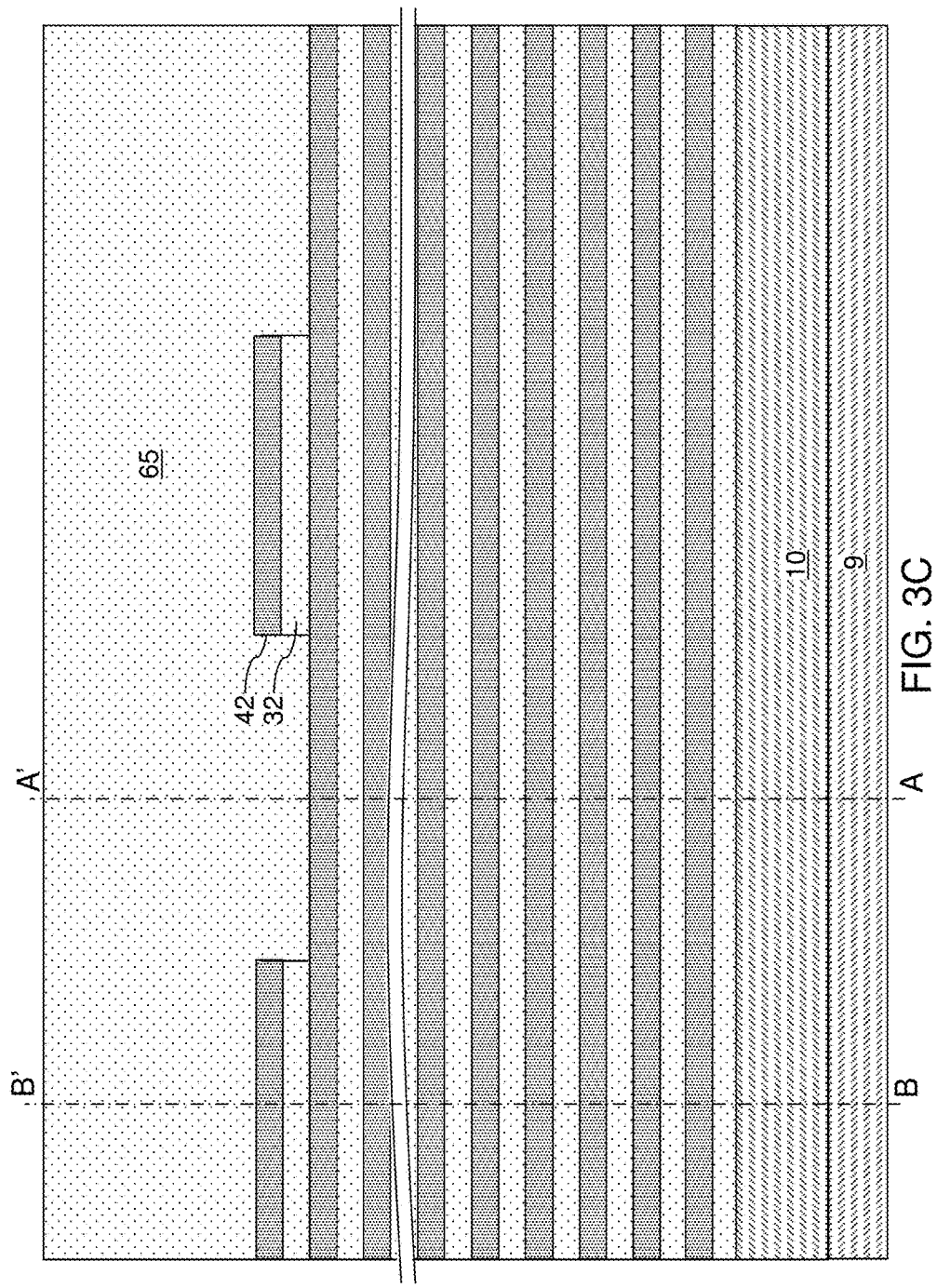

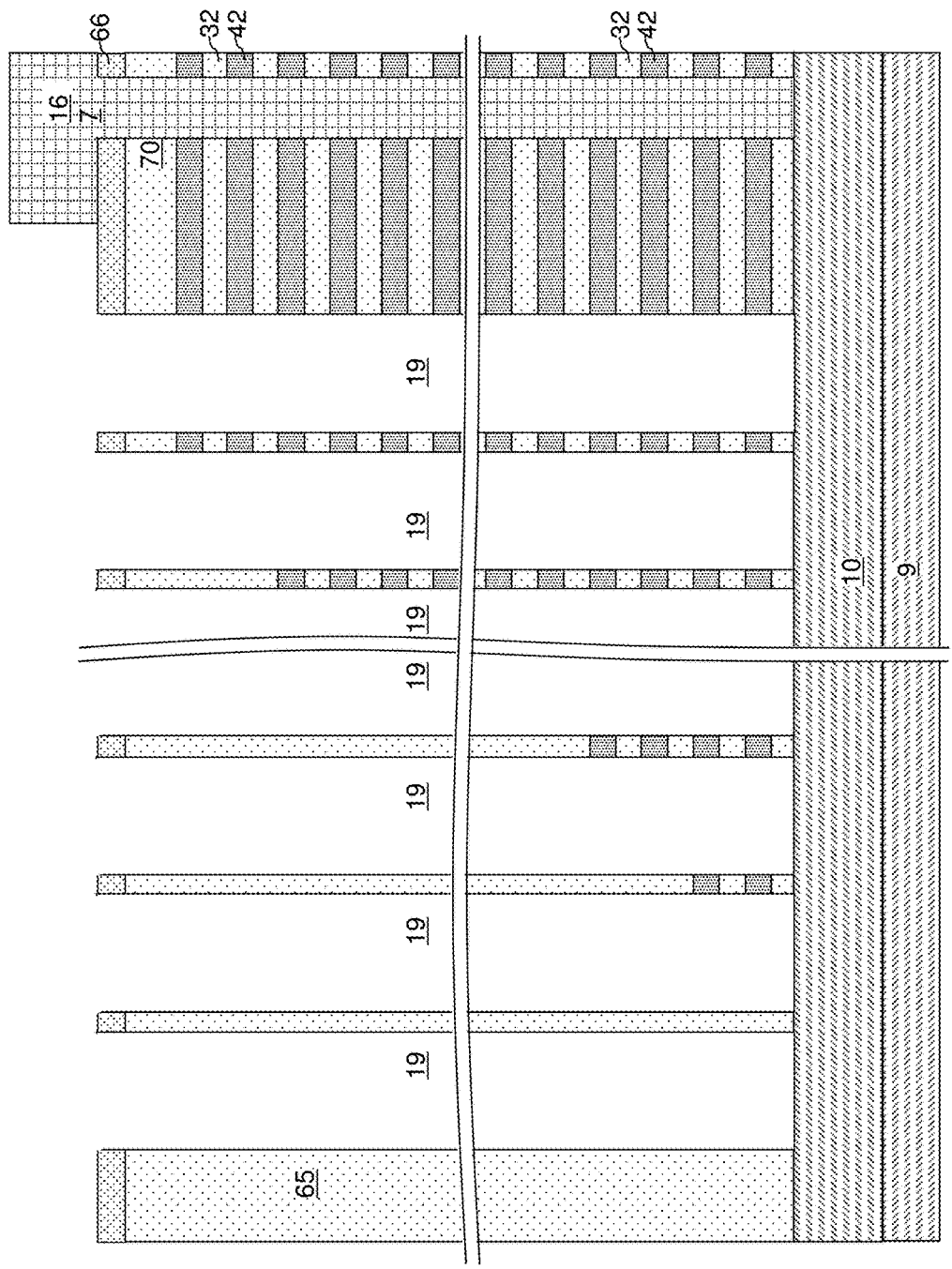

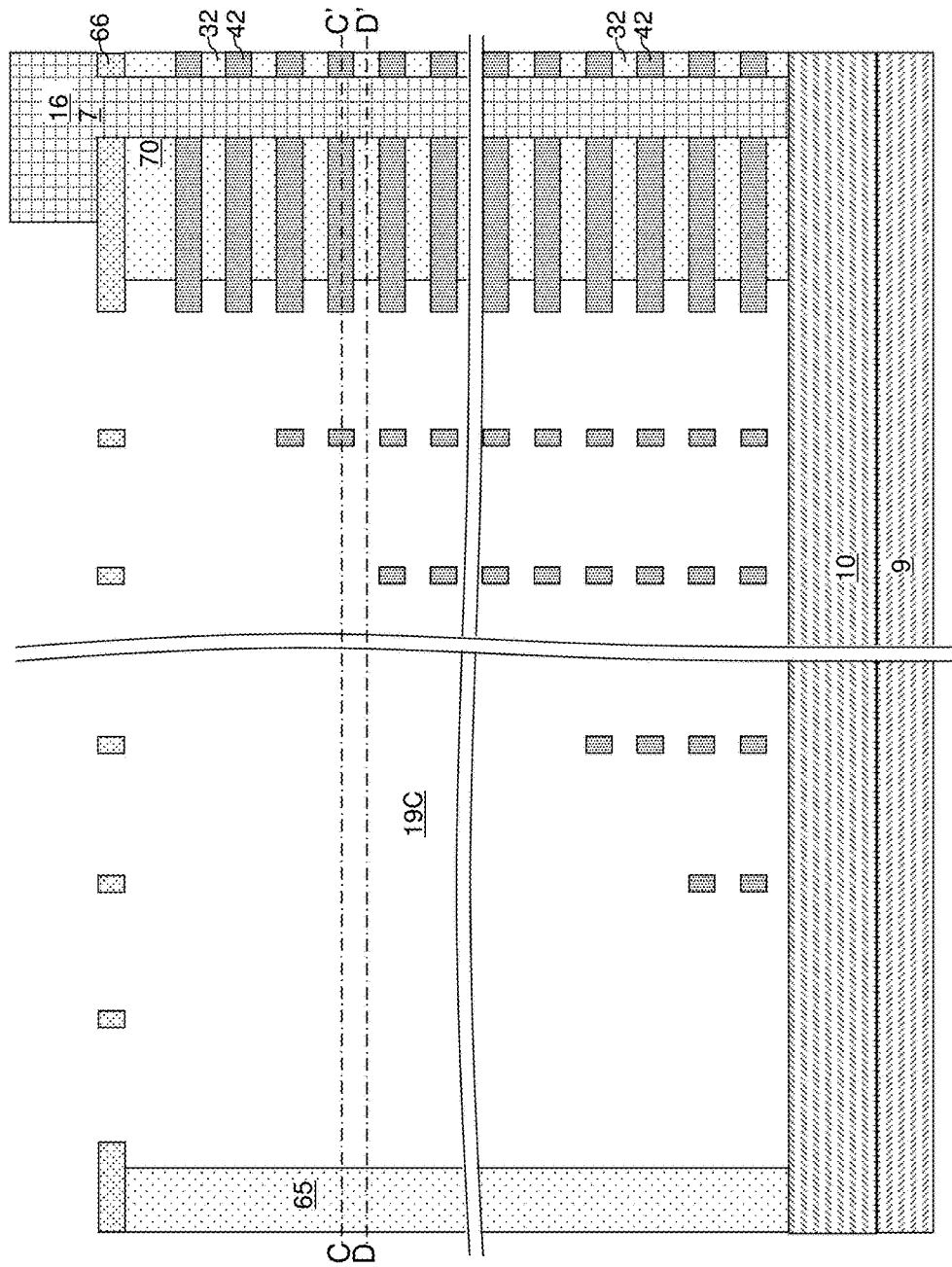

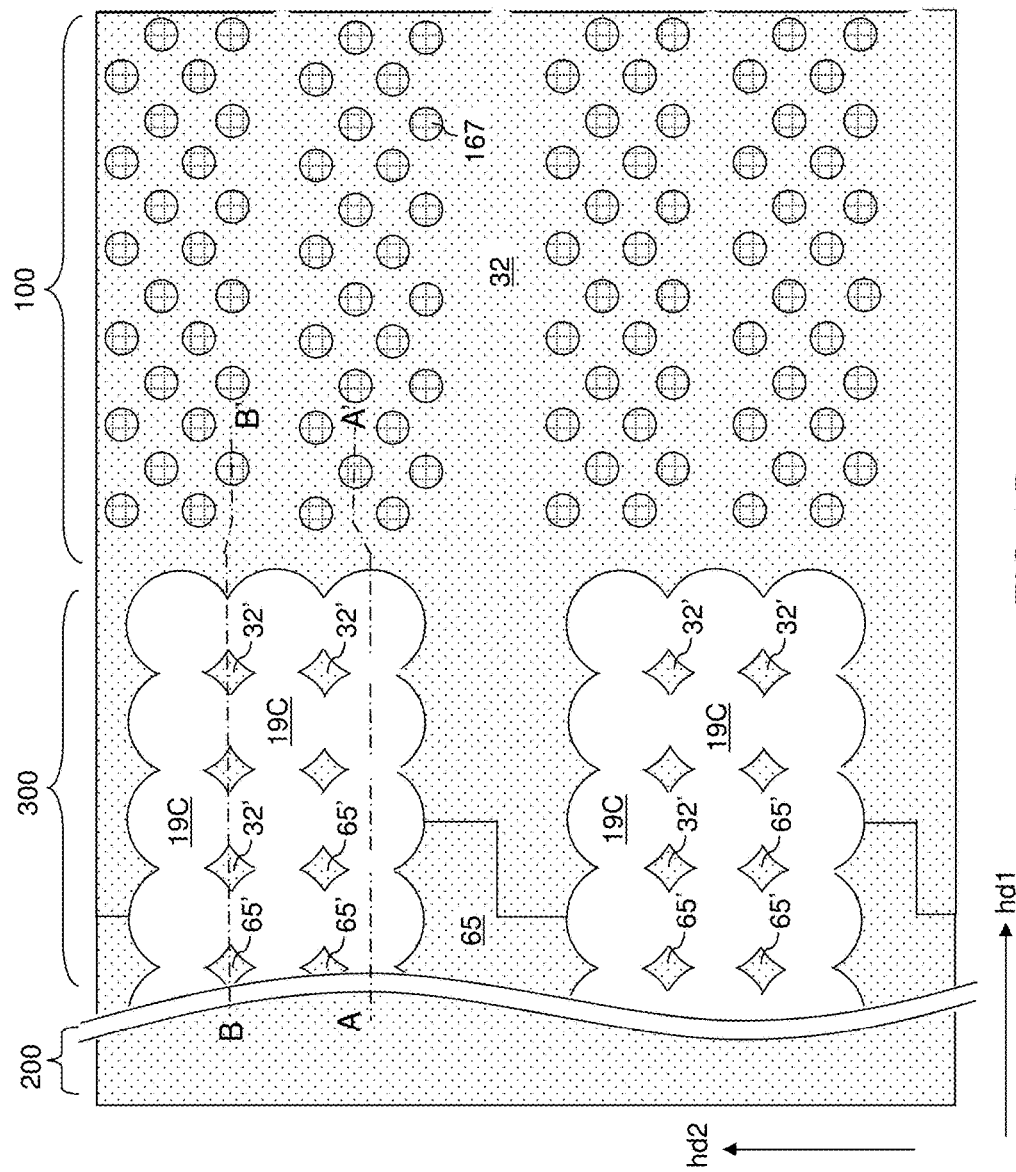

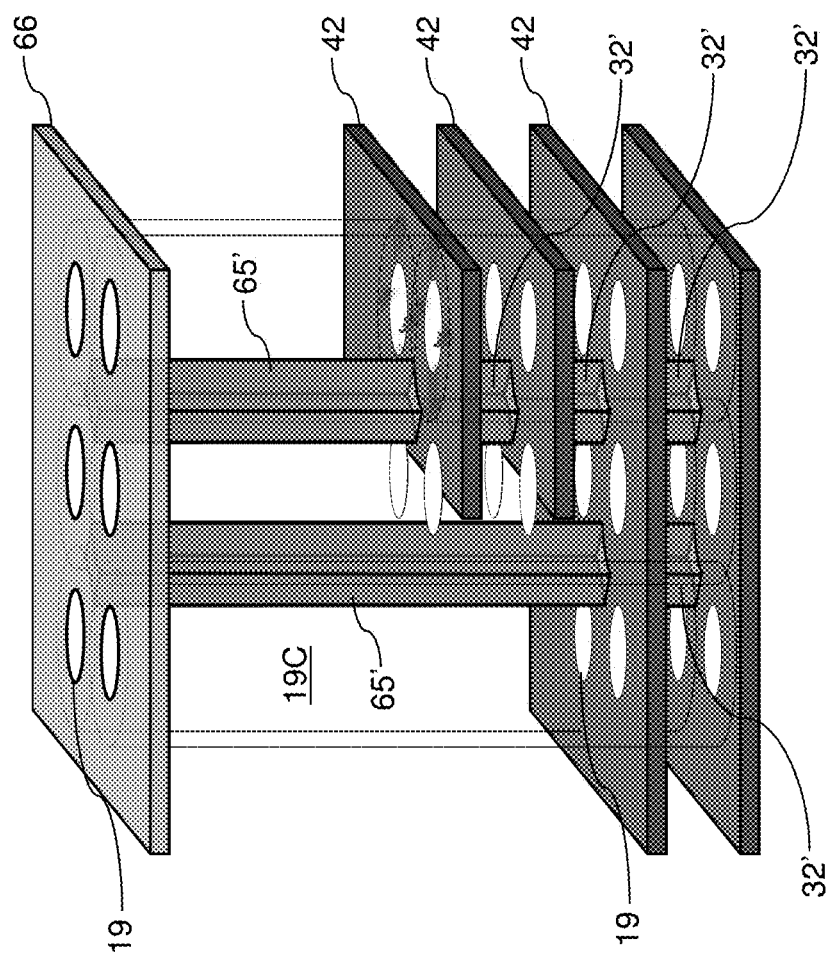

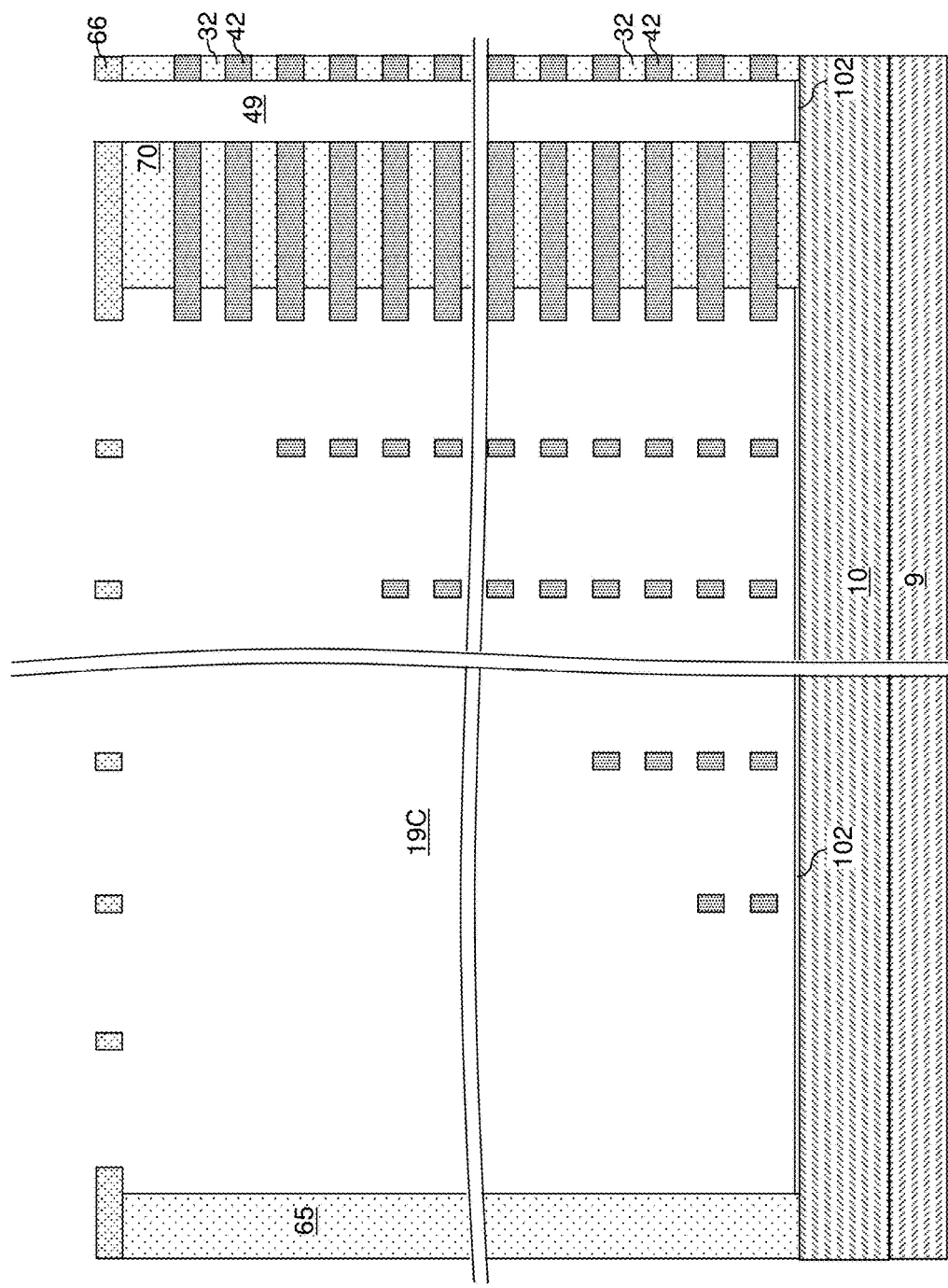

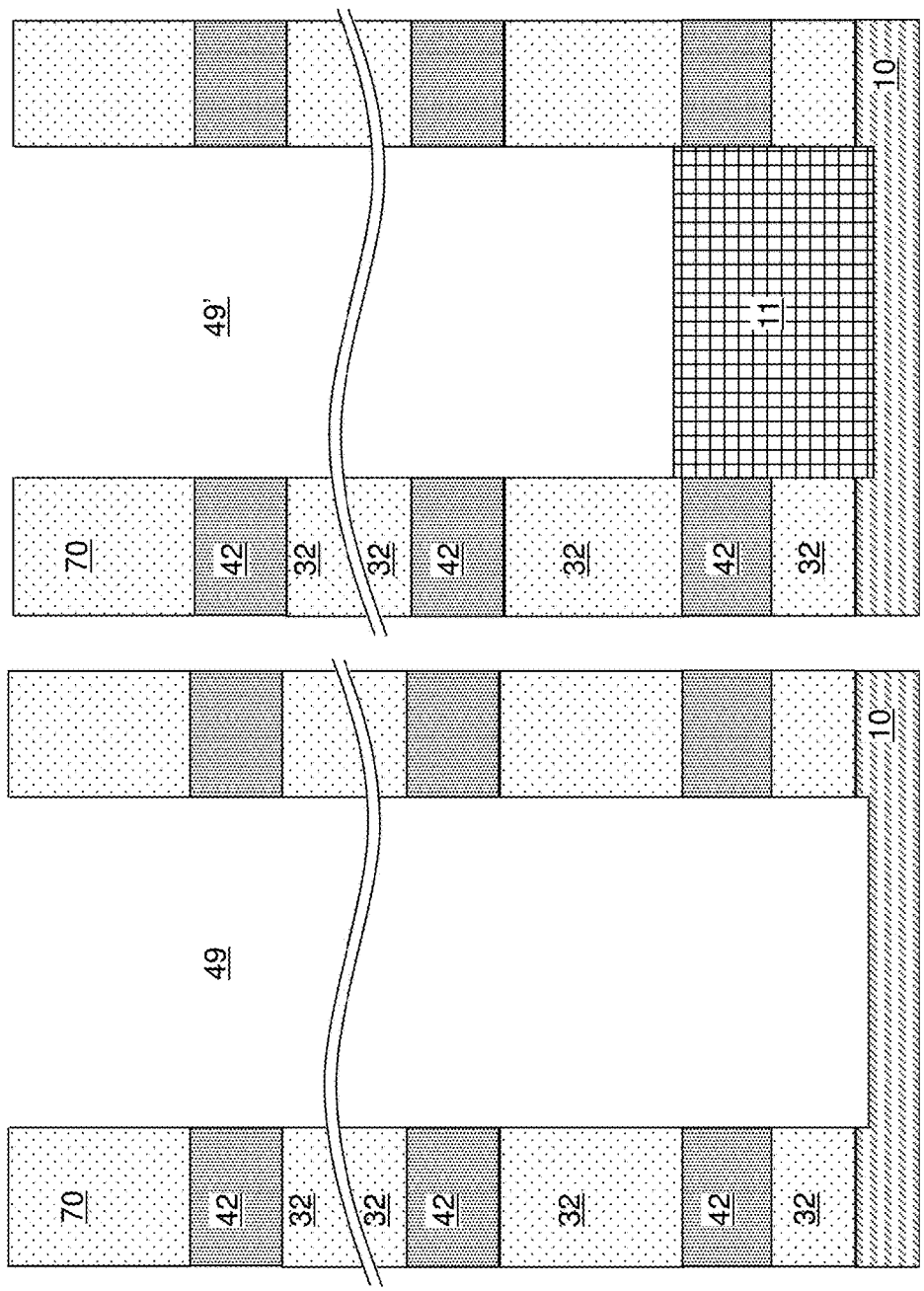

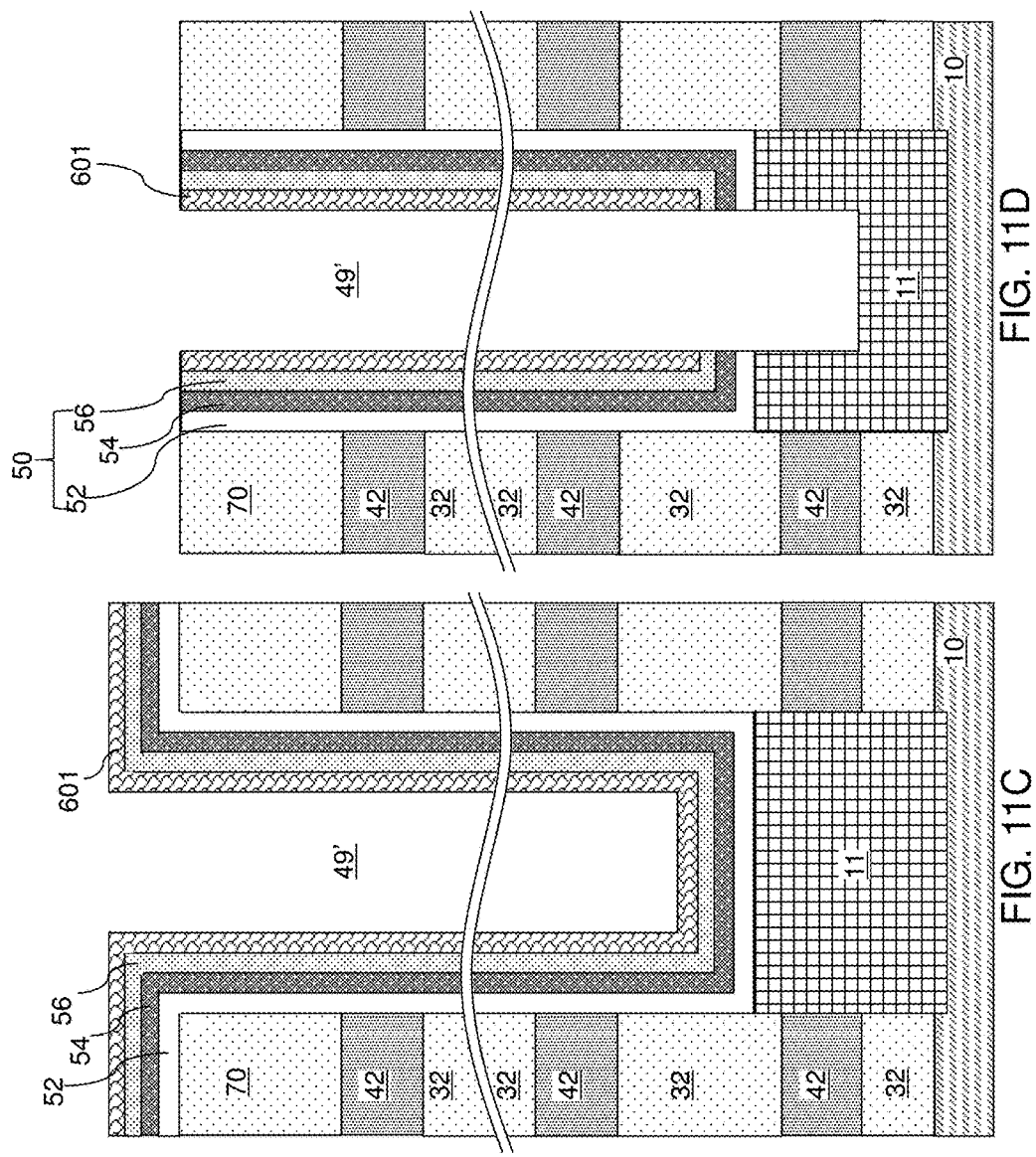

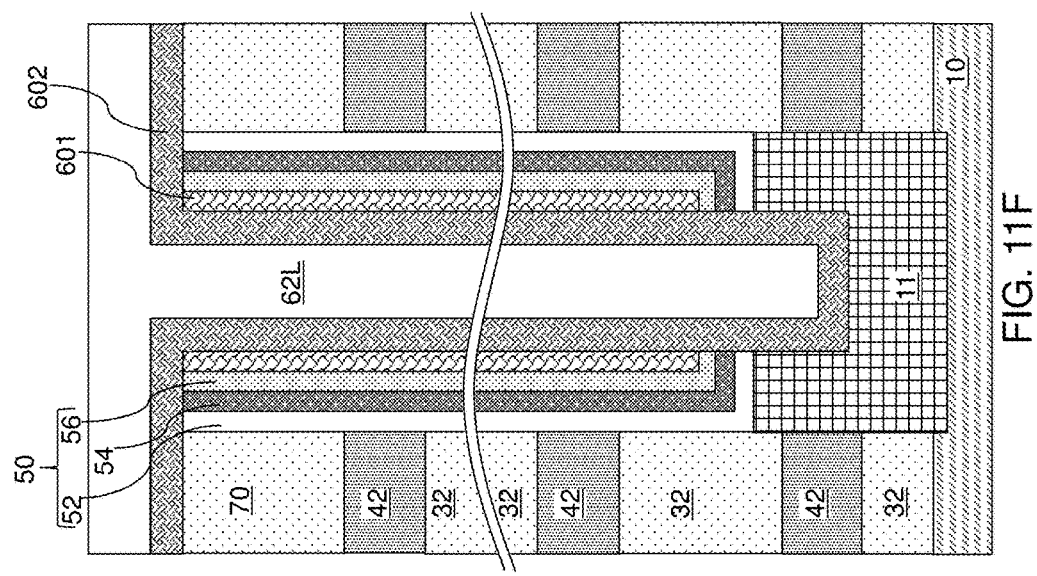
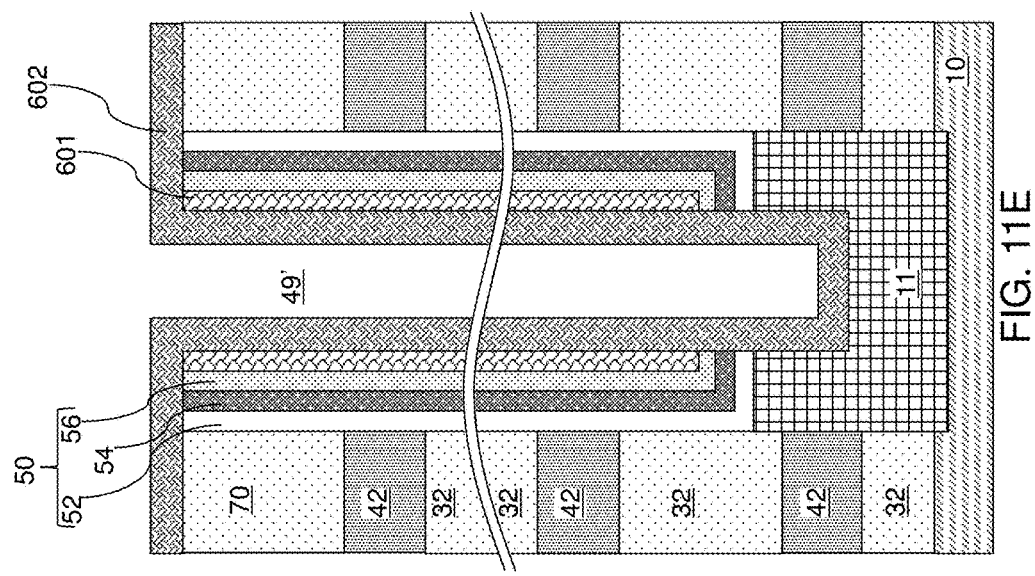

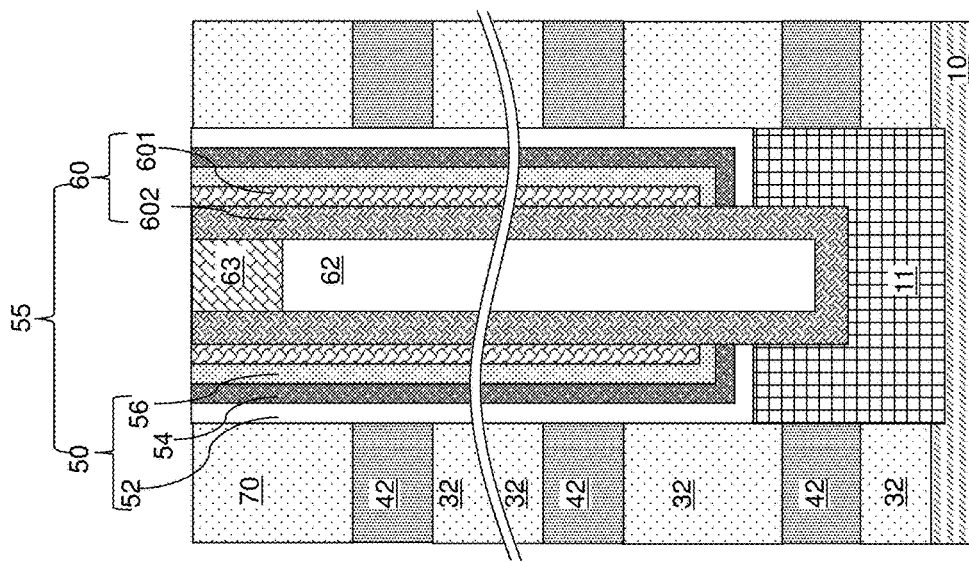
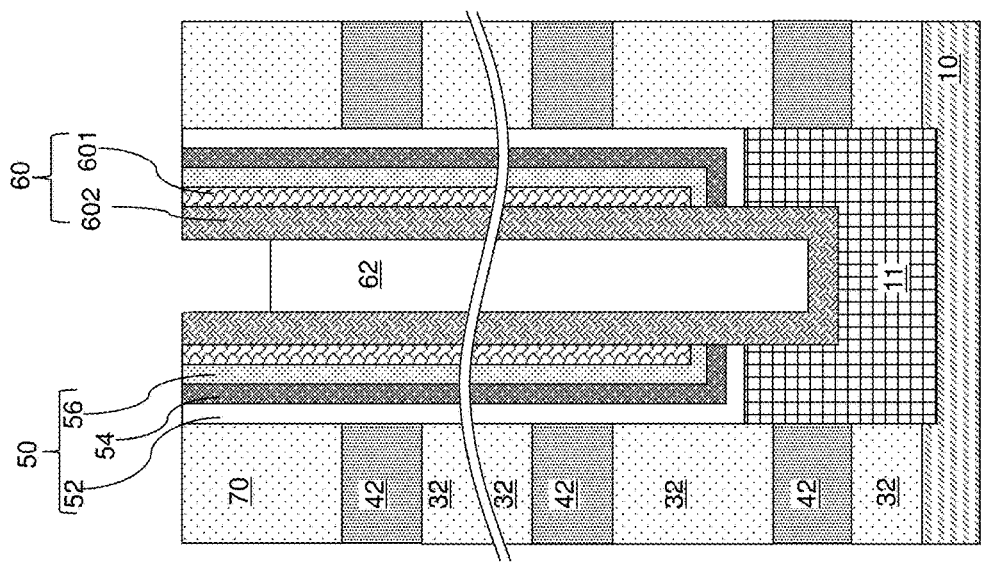

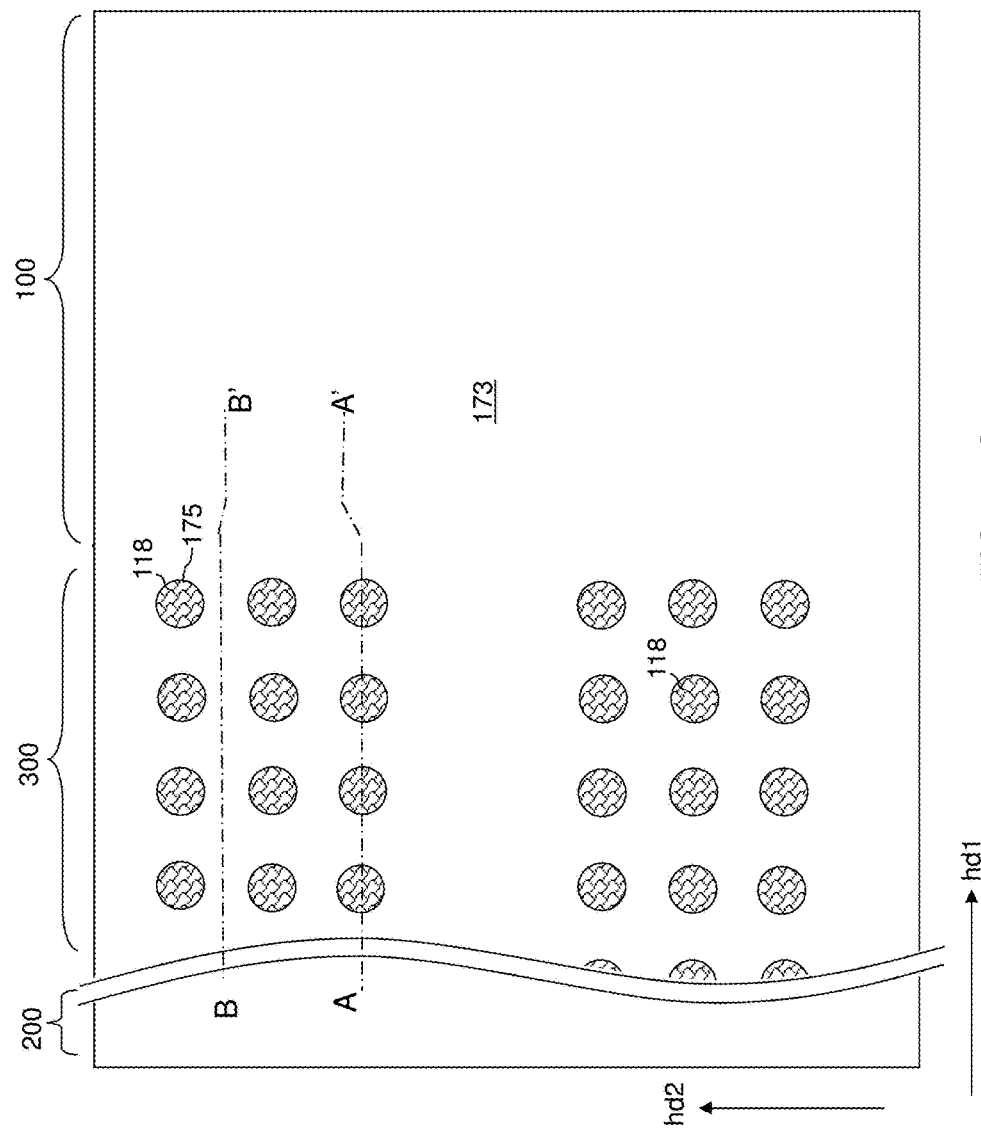

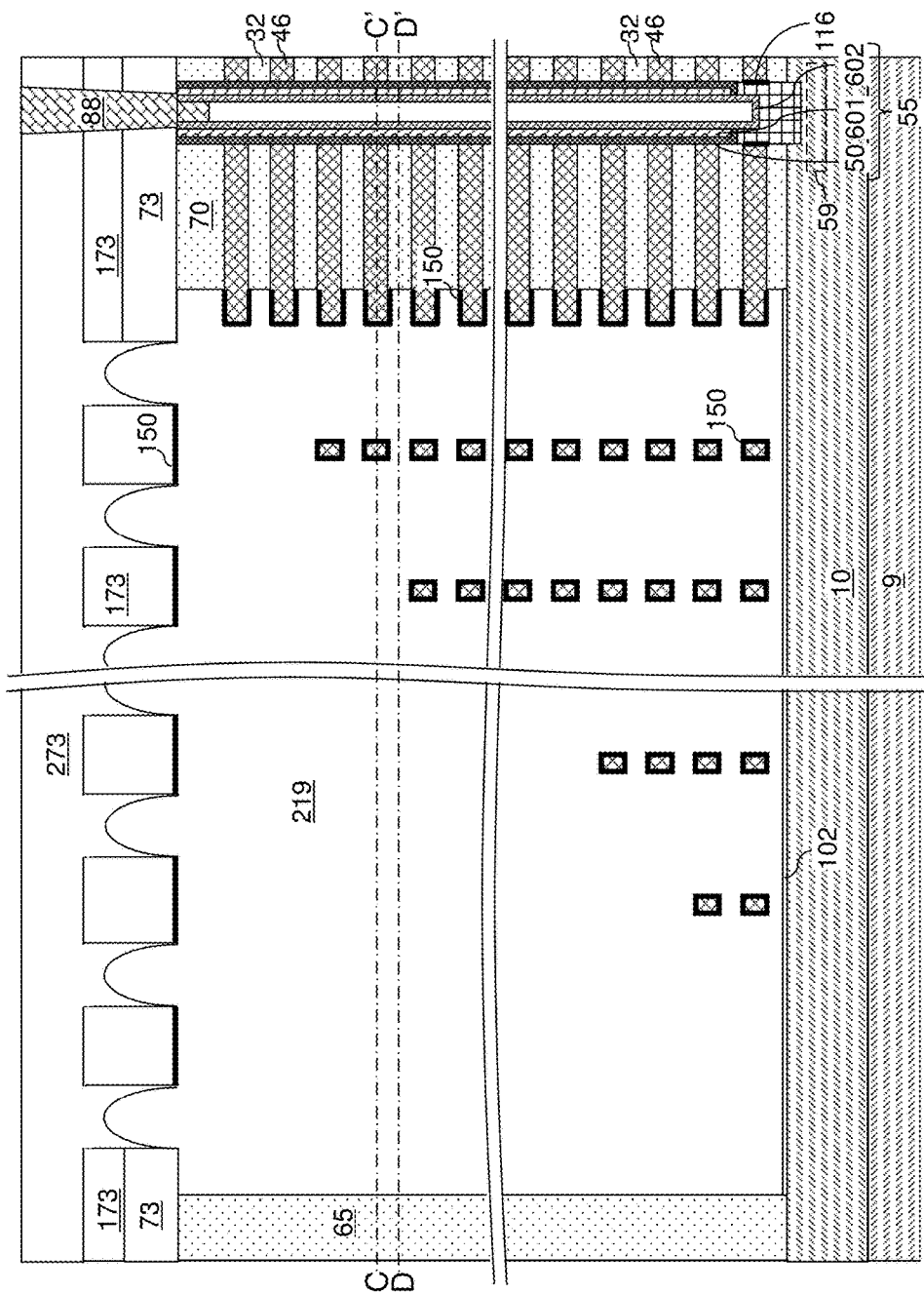

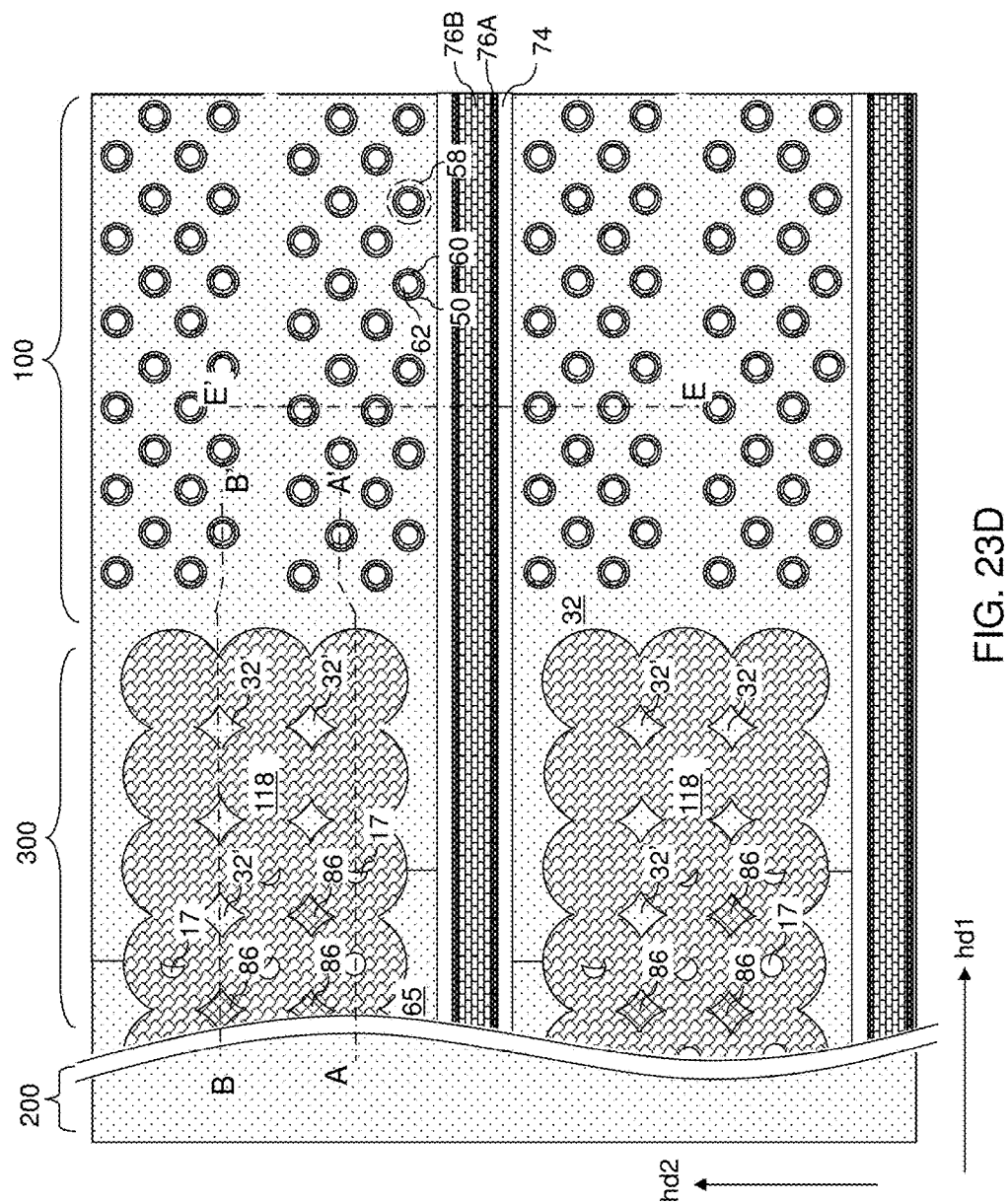

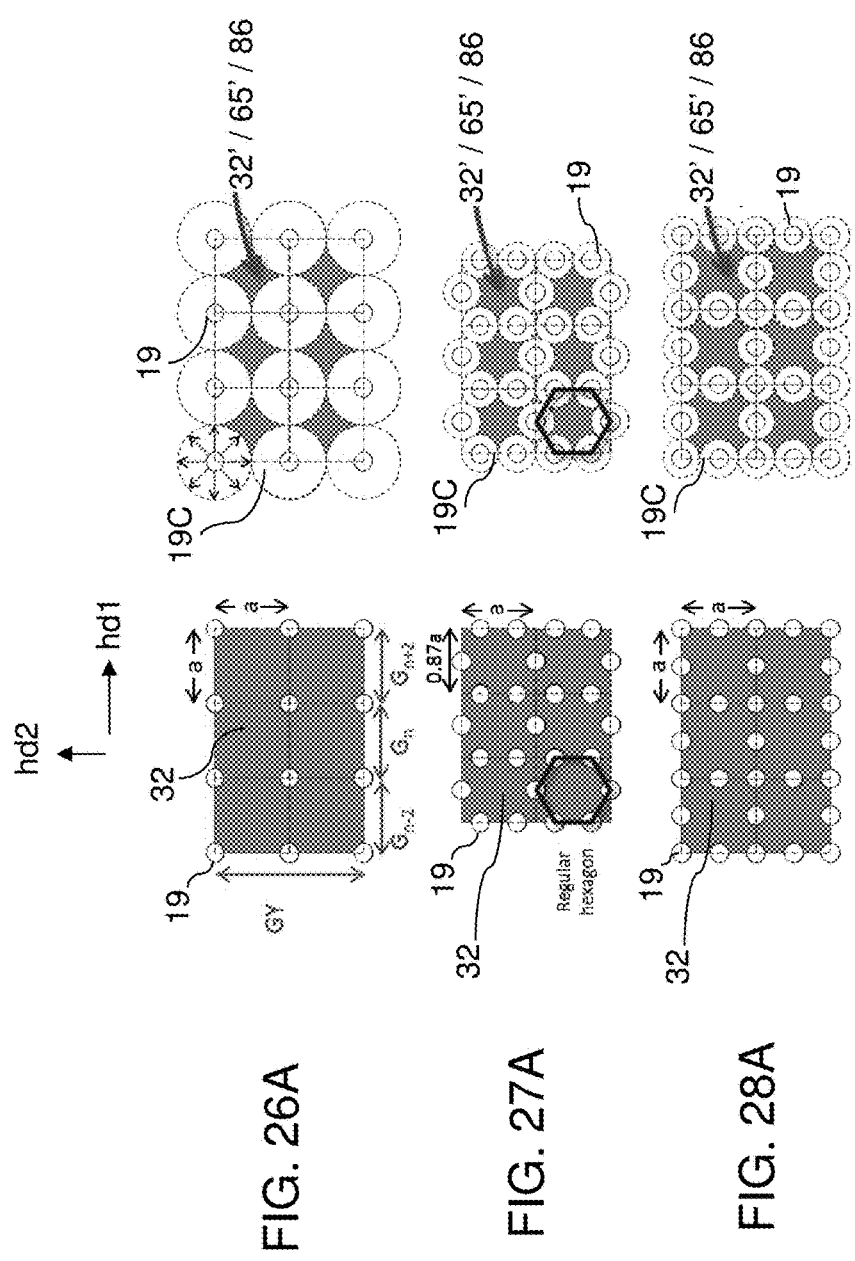

THREE-DIMENSIONAL MEMORY DEVICE CONTAINING SELF-ALIGNED CONTACT VIA STRUCTURES AND METHODS OF MANUFACTURING THE SAME

FIELD

The present disclosure relates generally to the field of semiconductor devices, and particular to a three-dimensional memory device employing self-aligned contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film and a vertical semiconductor channel contacting an inner sidewall of the memory film; and contact via structures adjoined to a top surface of a respective one of the electrically conductive layers, wherein each of the contact via structures includes a respective set of at least four vertically-extending concave sidewalls.

According to another aspect of the present disclosure, a method of forming a three-dimensional memory device is provided, which comprises the steps of: forming an alternating stack of insulating layers and sacrificial material layers over a substrate; forming stepped surfaces in the alternating stack; forming a retro-stepped dielectric material portion over the stepped surfaces of the alternating stack; forming an array of cylindrical openings through the retro-stepped dielectric material portion and the alternating stack; forming a continuous cavity by isotropically etching the insulating layers and the retro-stepped dielectric material portion selective to the sacrificial material layers, wherein remaining portions of the retro-stepped dielectric material portion comprise dielectric pillar structures including a respective set of at least four concave vertically-extending dielectric surfaces; forming a continuous fill material portion in the continuous cavity; forming memory stack structures extending through the alternating stack, wherein each of the memory stack structures comprises a memory film and a vertical semiconductor channel contacting an inner sidewall of the memory film; and replacing the sacrificial material layers and the dielectric pillar structures with conductive material portions, wherein the conductive material portions comprise combinations of an electrically conductive layer that replaces a respective sacrificial material layer and a contact via structure that replaces a respective dielectric pillar structure.

BRIEF DESCRIPTION OF THE DRAWINGS

FIG. 3B is a second schematic vertical cross-sectional view of the exemplary structure of FIG. 3A.

FIG. 3C is a third schematic vertical cross-sectional view of the exemplary structure of FIGS. 3A and 3B.

FIG. 5A is a first schematic vertical cross-sectional view of the exemplary structure after filling the memory openings with an etch mask material according to an embodiment of the present disclosure.

FIG. 6A is a first schematic vertical cross-sectional view of the exemplary structure after isotropically etching the insulating layers and the retro-stepped dielectric material portion selective to the sacrificial material layers to form a continuous cavity according to an embodiment of the present disclosure.

FIG. 6D is a first horizontal cross-sectional view of the exemplary structure along the horizontal plane D-D' of FIGS. 6A and 6B. The vertical plane A-A' is the plane of the view of FIG. 6A, and the vertical plane B-B' is the plane of the view of FIG. 6B.

FIG. 6F is a perspective view of a portion of the exemplary structure of FIGS. 6A-6E.

FIG. 7A is a first schematic vertical cross-sectional view of the exemplary structure after removal of the etch mask material from inside the memory openings according to an embodiment of the present disclosure.

FIGS. 11A-11H are sequential schematic vertical cross-sectional views of a memory opening within the exemplary structure during formation of a memory stack structure, an optional dielectric core, and a drain region therein according to an embodiment of the present disclosure.

FIG. 20C is a top-down view of the exemplary structure of FIGS. 20A and 20B. The vertical plane A-A' is the plane of the view of FIG. 20A, and the vertical plane B-B' is the plane of the view of FIG. 20B.

FIG. 22A is a first schematic vertical cross-sectional view of the exemplary structure after formation of a third contact level dielectric layer that plugs the etchant duct openings and formation of contact level interconnect via structures according to an embodiment of the present disclosure.

FIG. 23D is a first horizontal cross-sectional view of the exemplary structure along the horizontal plane D-D' of FIGS. 23A and 23B. The vertical plane A-A' is the plane of the view of FIG. 23A, and the vertical plane B-B' is the plane of the view of FIG. 23B.

FIGS. 26A and 26B are schematic horizontal cross sectional views of the exemplary structure at the process steps shown in FIGS. 5A and 6A, respectively.

FIGS. 27A and 27B are schematic horizontal cross sectional views of the second exemplary structure at the process steps shown in FIGS. 5A and 6A, respectively.

FIGS. 28A and 28B are schematic horizontal cross sectional views of the third exemplary structure at the process steps shown in FIGS. 5A and 6A, respectively.

DETAILED DESCRIPTION

Figure 1:
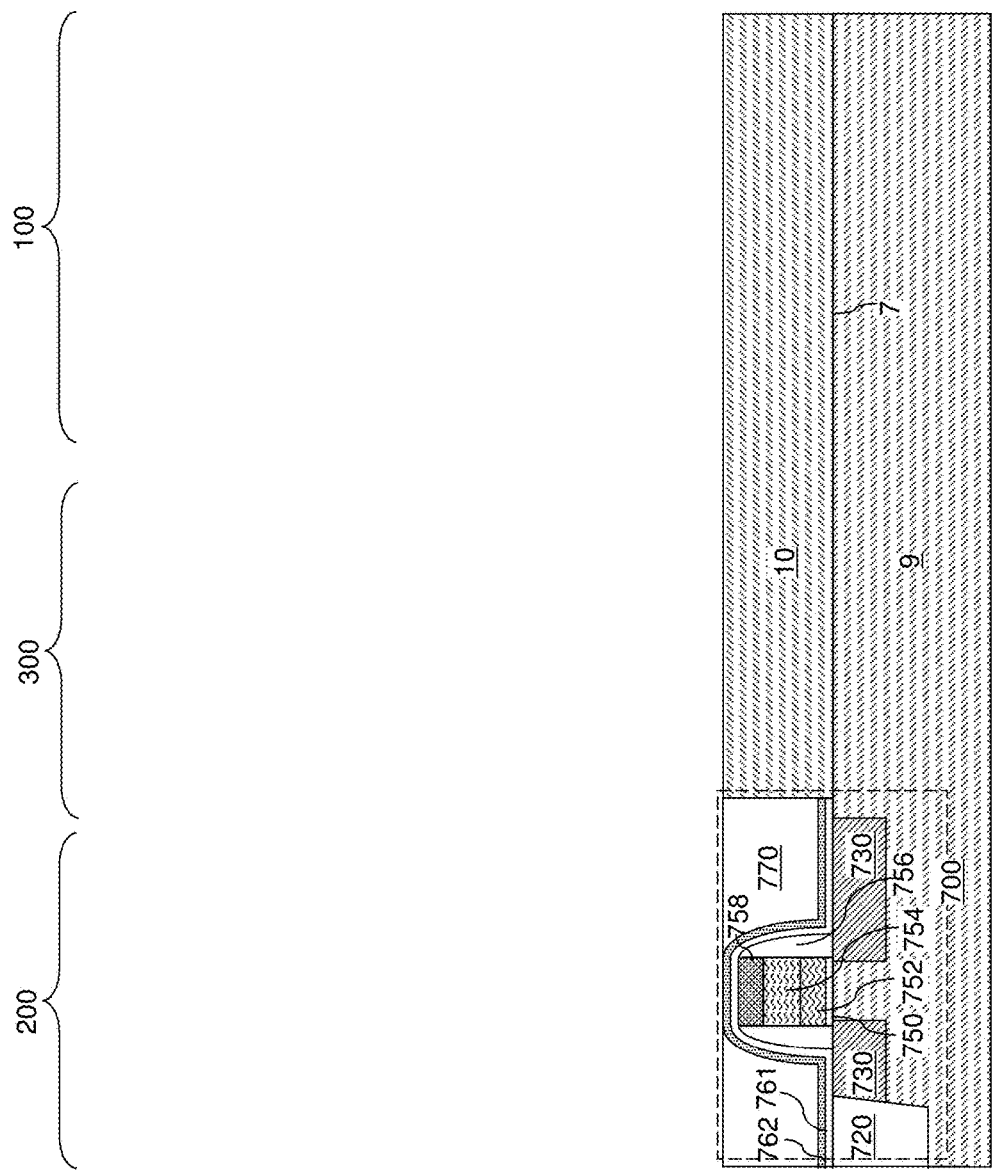
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing self-aligned contact via structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
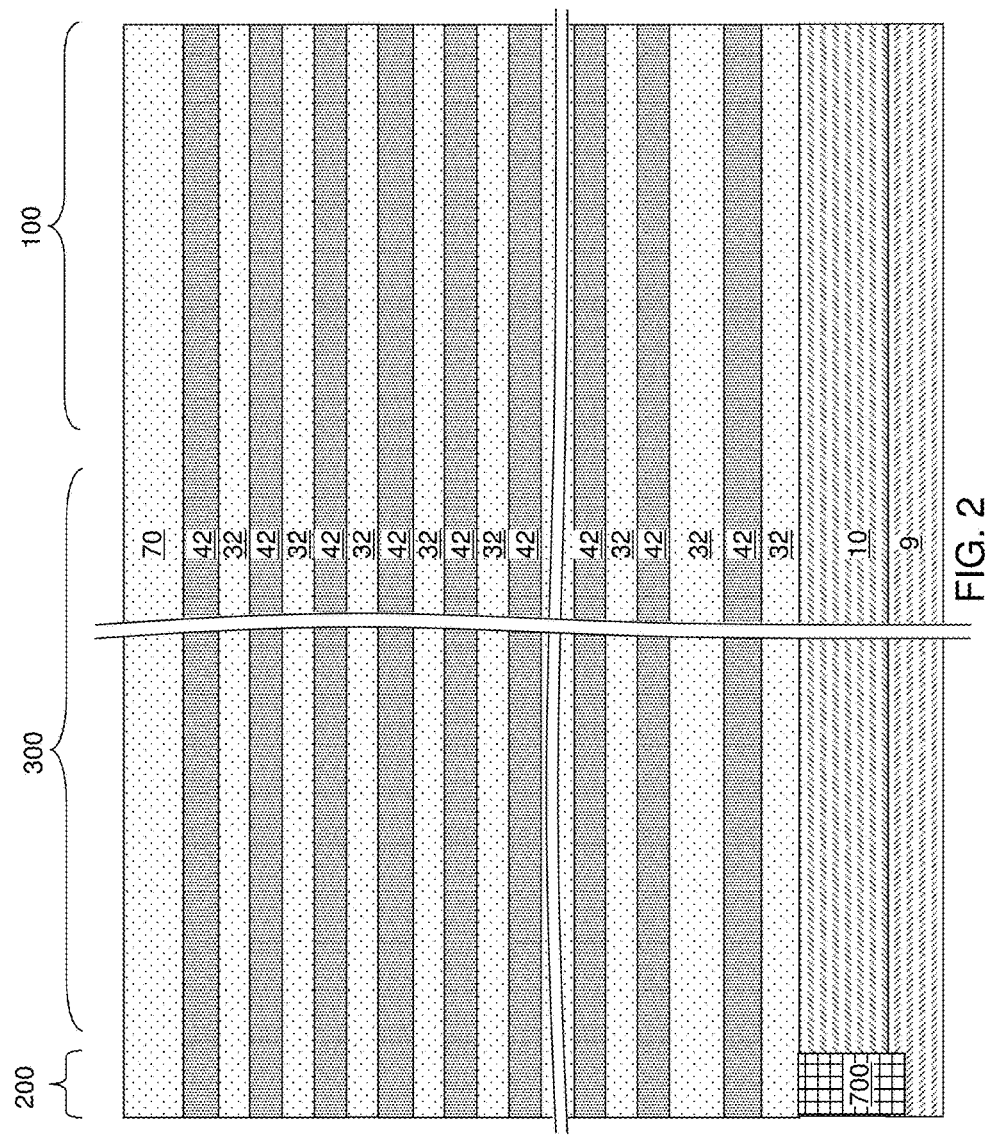
FIG. 2 is a schematic vertical cross-sectional view of the exemplary structure after formation of an alternating stack of insulating layers and sacrificial material layers according to an embodiment of the present disclosure.
Figure 3A:
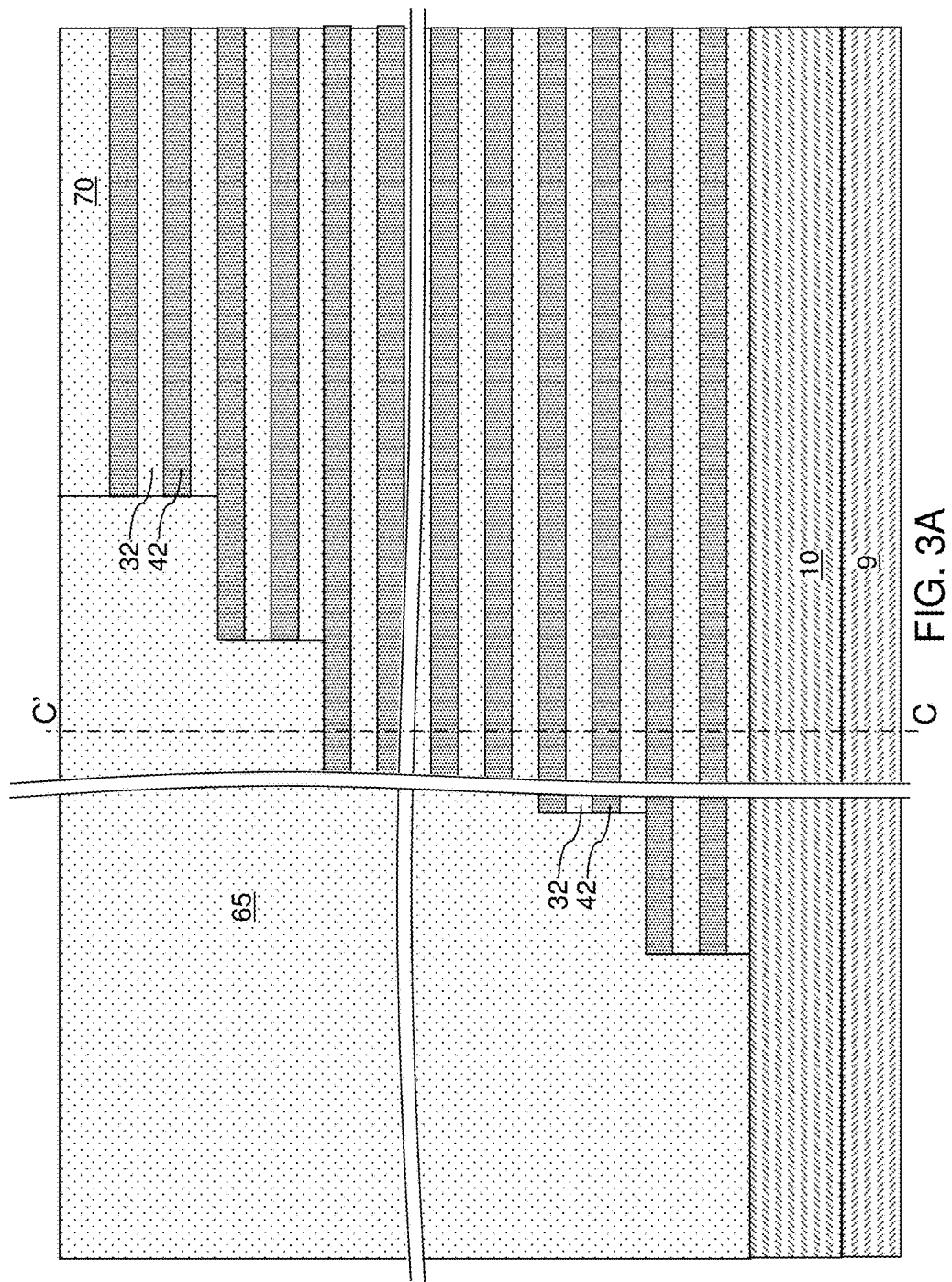
FIG. 3A is a first schematic vertical cross-sectional view of the exemplary structure within a first vertical cross-sectional plane after formation of stepped terraces and a retro-stepped dielectric material portion according to an embodiment of the present disclosure.
Figure 3D:
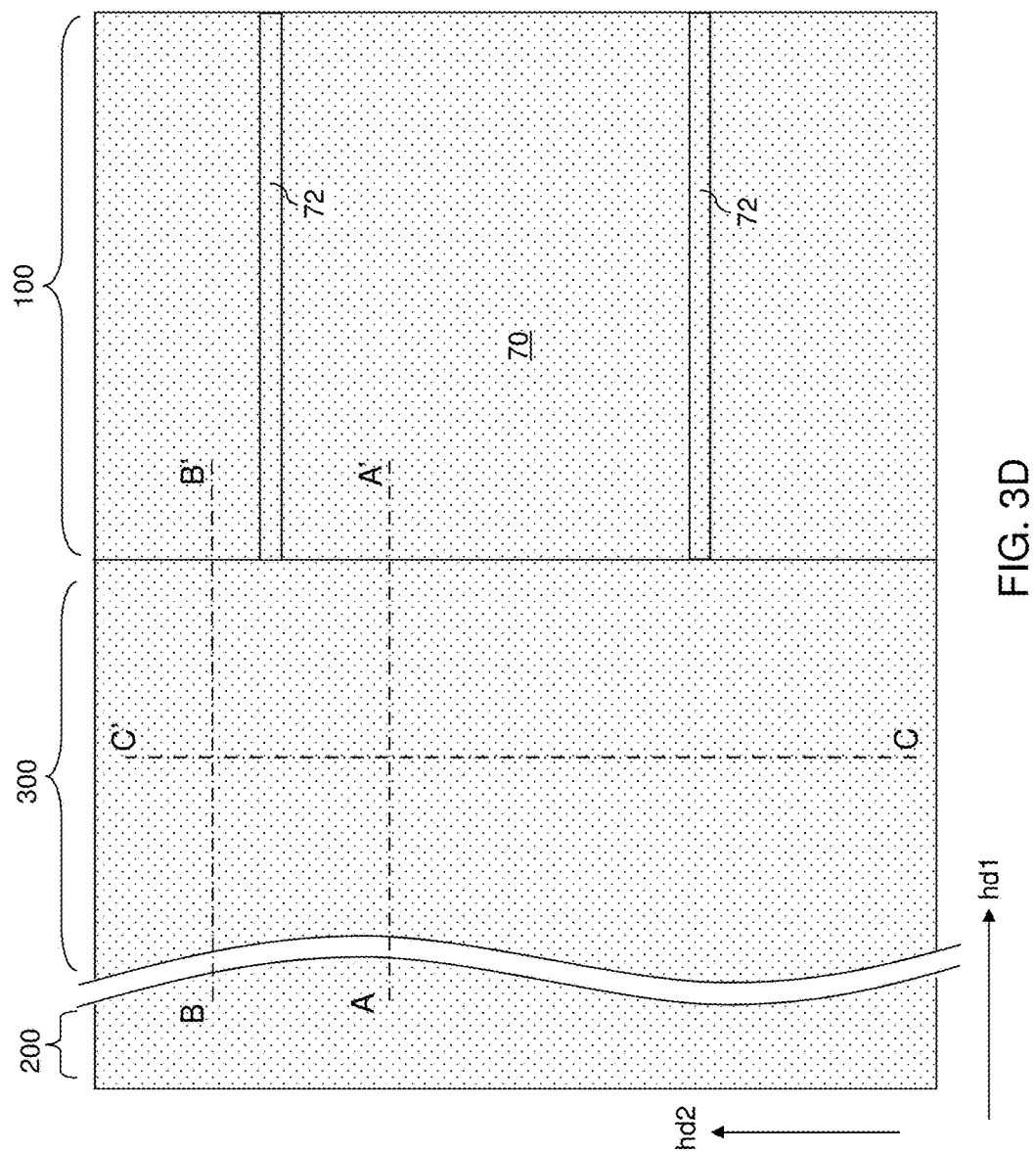
FIG. 3D is a top-down view of the exemplary structure of FIGS. 3A-3C. The vertical plane A-A' is the plane of the view of FIG. 3A, the vertical plane B-B' is the plane of the view of FIG. 3B, and the vertical plane C-C' is the plane of the view of FIG. 3C.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIGS. 3A-3D, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1 (e.g., word line direction), and the columns of staircases may be arranged along a second horizontal direction hd2 (e.g., bit line direction) that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
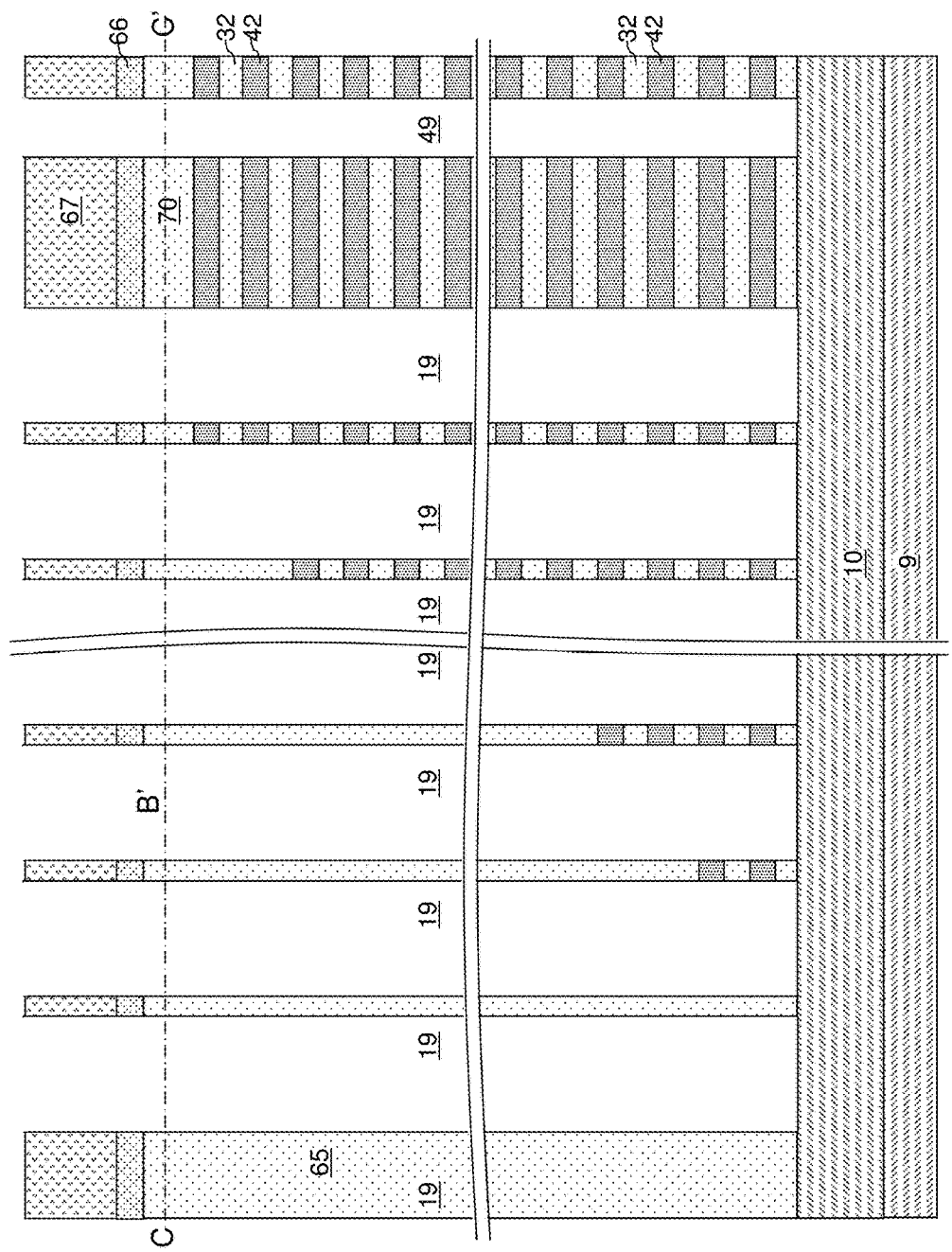
FIG. 4A is a first schematic vertical cross-sectional view of the exemplary structure after formation of an optional patterning film, a rectangular array of cylindrical openings, and memory openings according to an embodiment of the present disclosure.
Figure 4B:
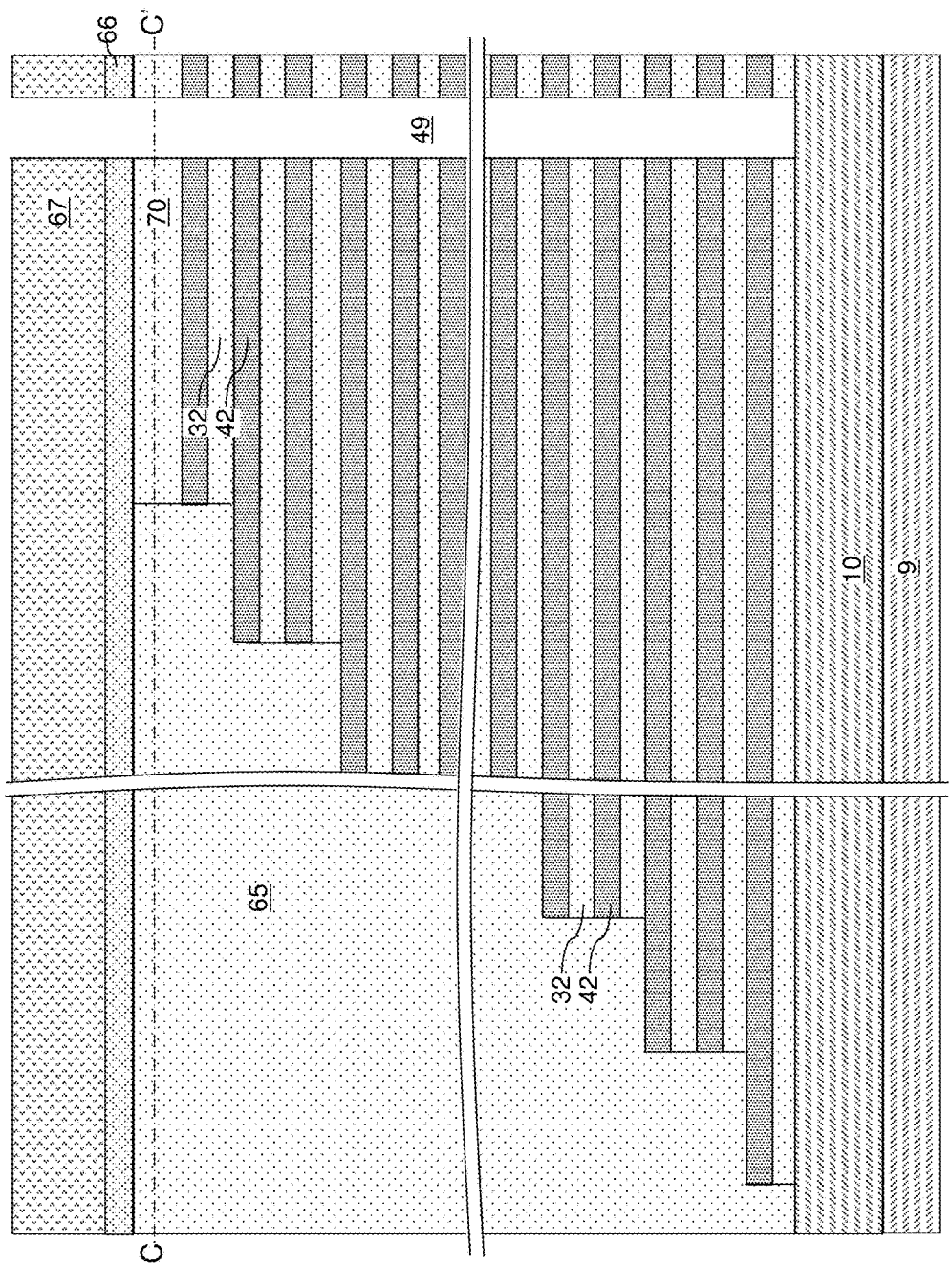
FIG. 4B is a second schematic vertical cross-sectional view of the exemplary structure of FIG. 4A.
Figure 4C:
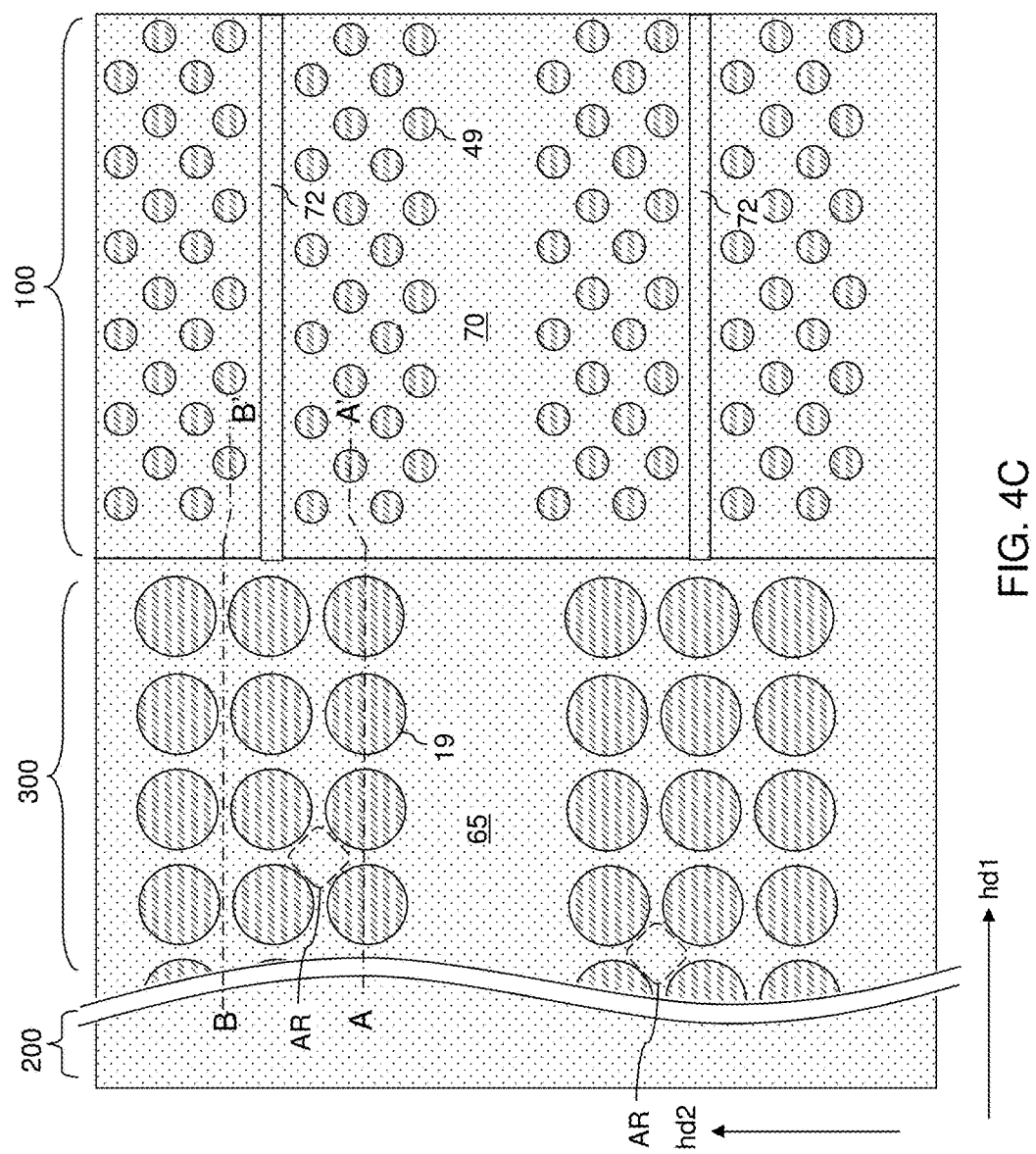
FIG. 4C is a top-down view of the exemplary structure of FIGS. 4A and 4B. The vertical plane A-A' is the plane of the view of FIG. 4A, and the vertical plane B-B' is the plane of the view of FIG. 4B.
Figure 5B:
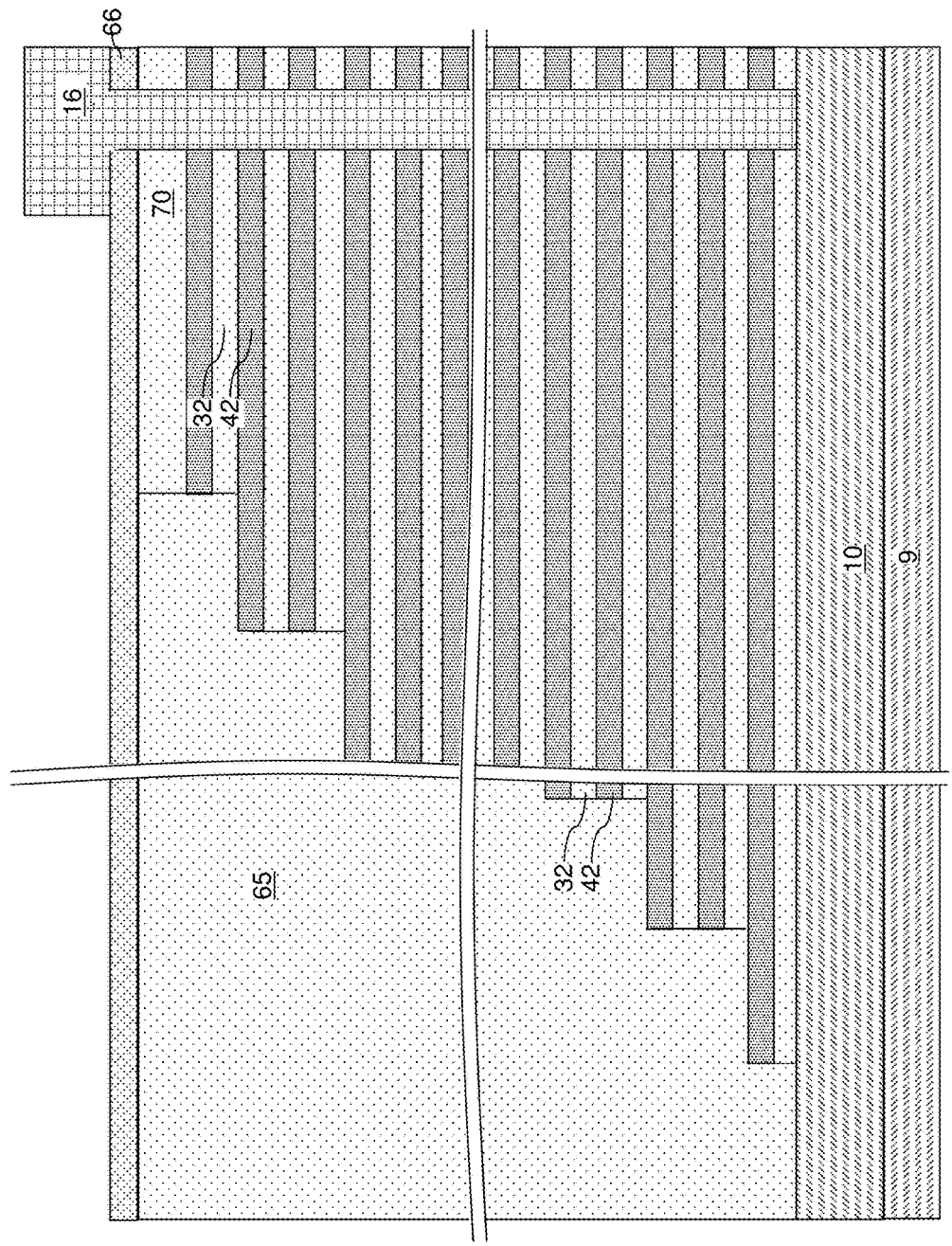
FIG. 5B is a second schematic vertical cross-sectional view of the exemplary structure of FIG. 5A.
Figure 5C:
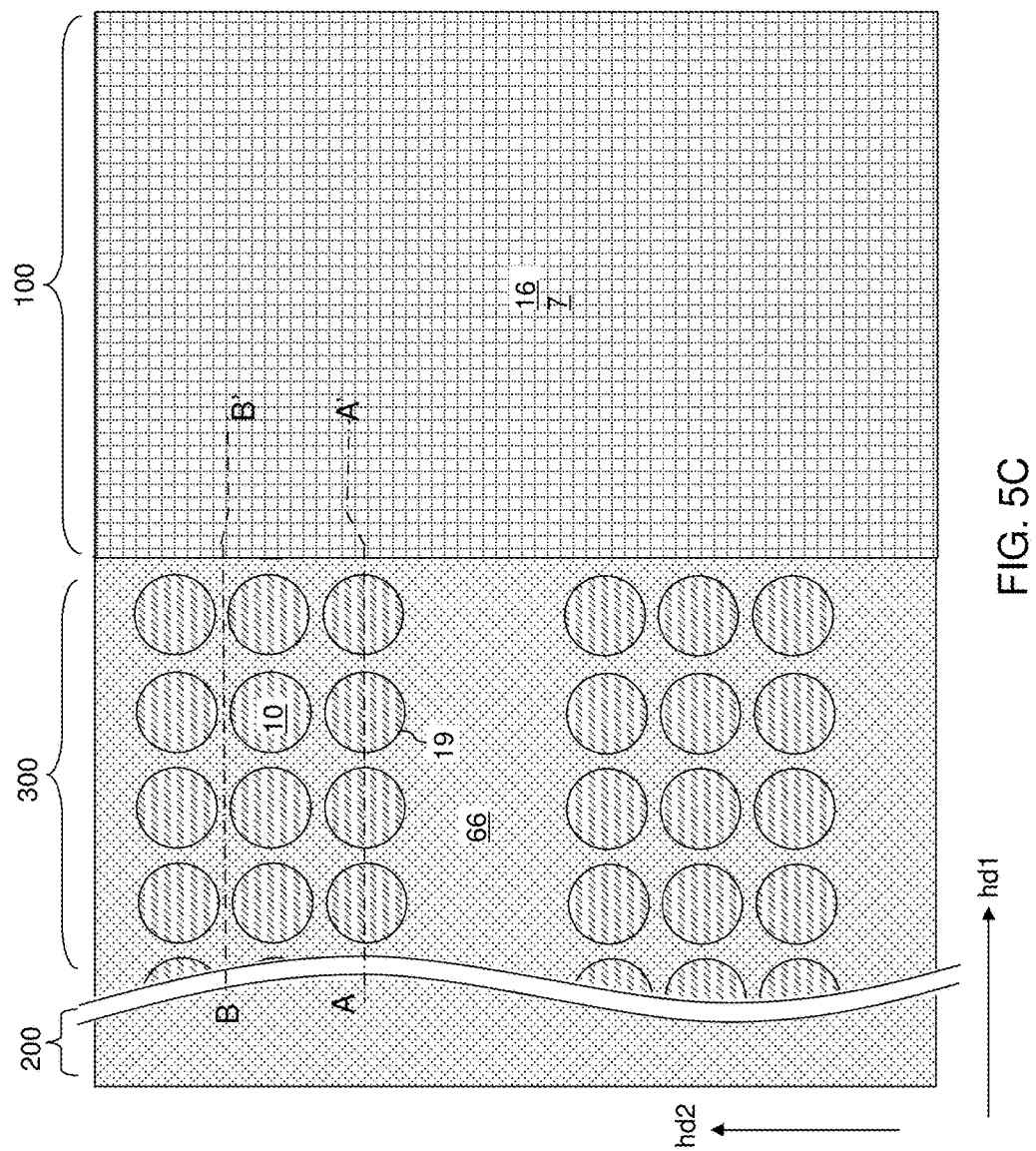
FIG. 5C is a top-down view of the exemplary structure of FIGS. 5A and 5B. The vertical plane A-A' is the plane of the view of FIG. 5A, and the vertical plane B-B' is the plane of the view of FIG. 5B.
Figure 5D:
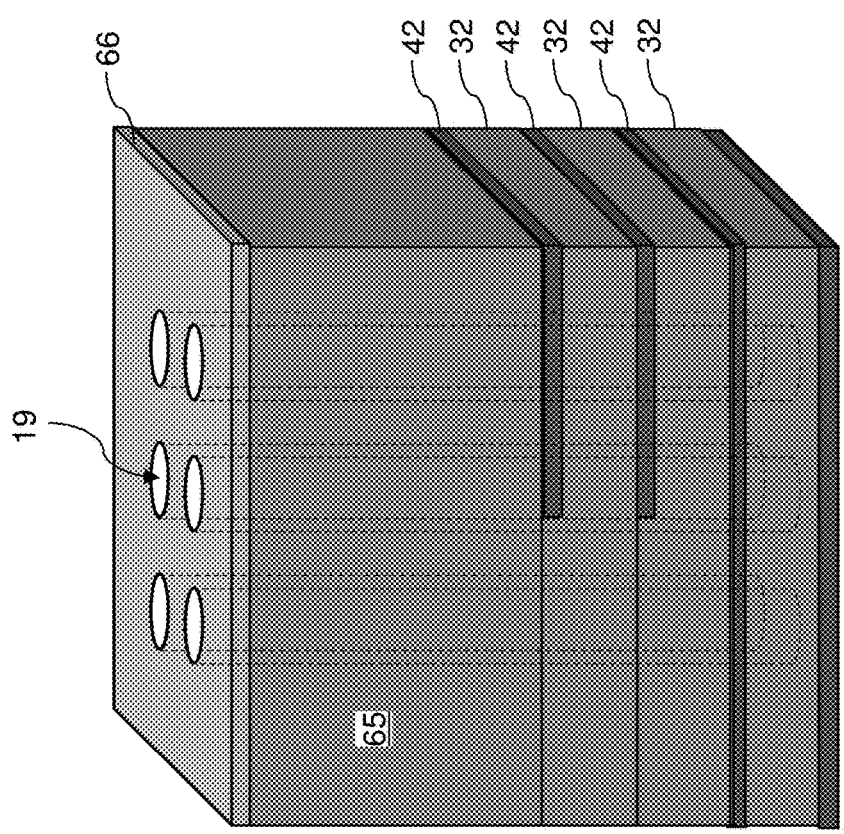
FIG. 5D is a perspective view of a portion of the exemplary structure of FIGS. 5A-5C.
Figure 6B:
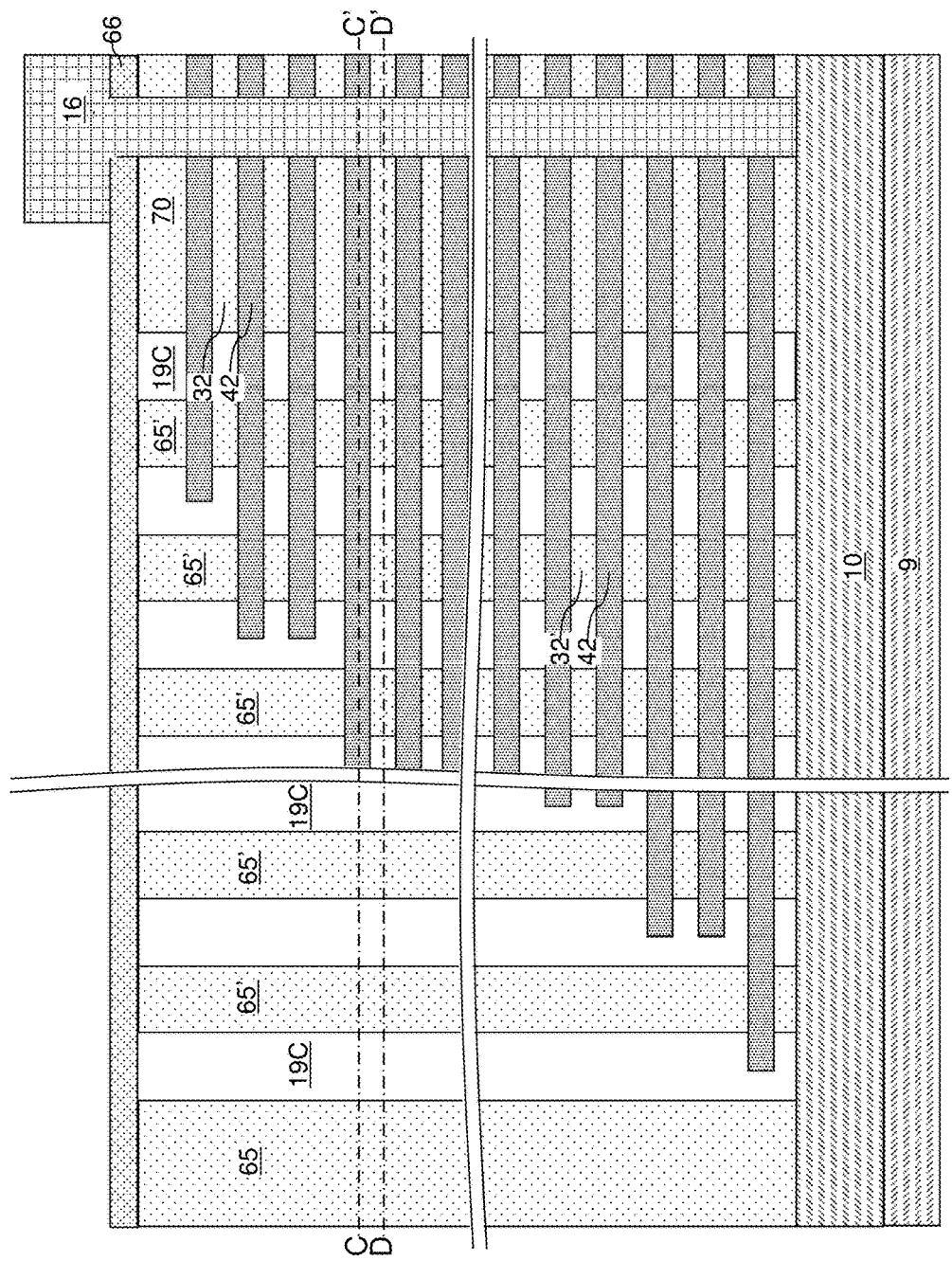
FIG. 6B is a second schematic vertical cross-sectional view of the exemplary structure of FIG. 6A.
Figure 6C:
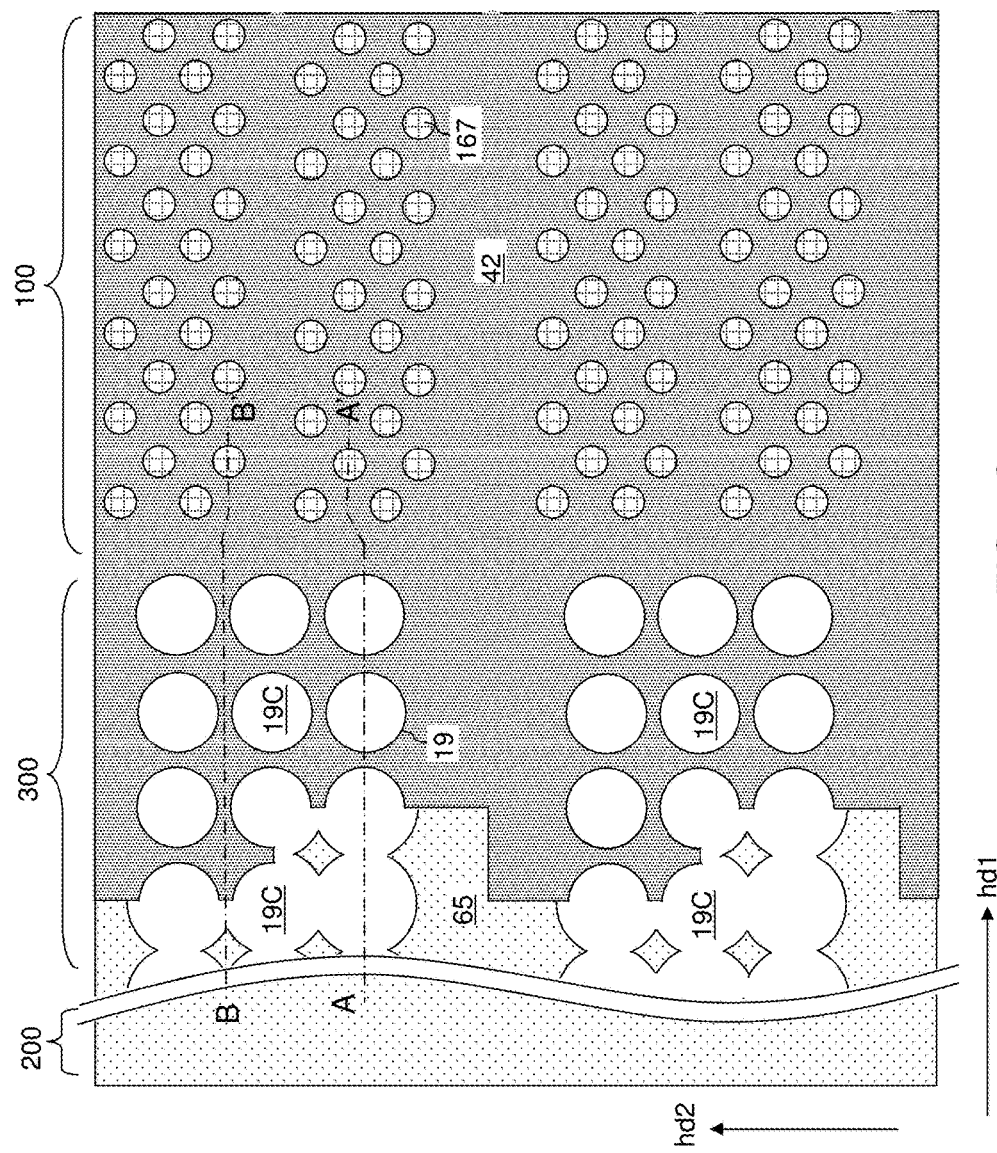
FIG. 6C is a first horizontal cross-sectional view of the exemplary structure along the horizontal plane C-C' of FIGS. 6A and 6B. The vertical plane A-A' is the plane of the view of FIG. 6A, and the vertical plane B-B' is the plane of the view of FIG. 6B.
Figure 6E:
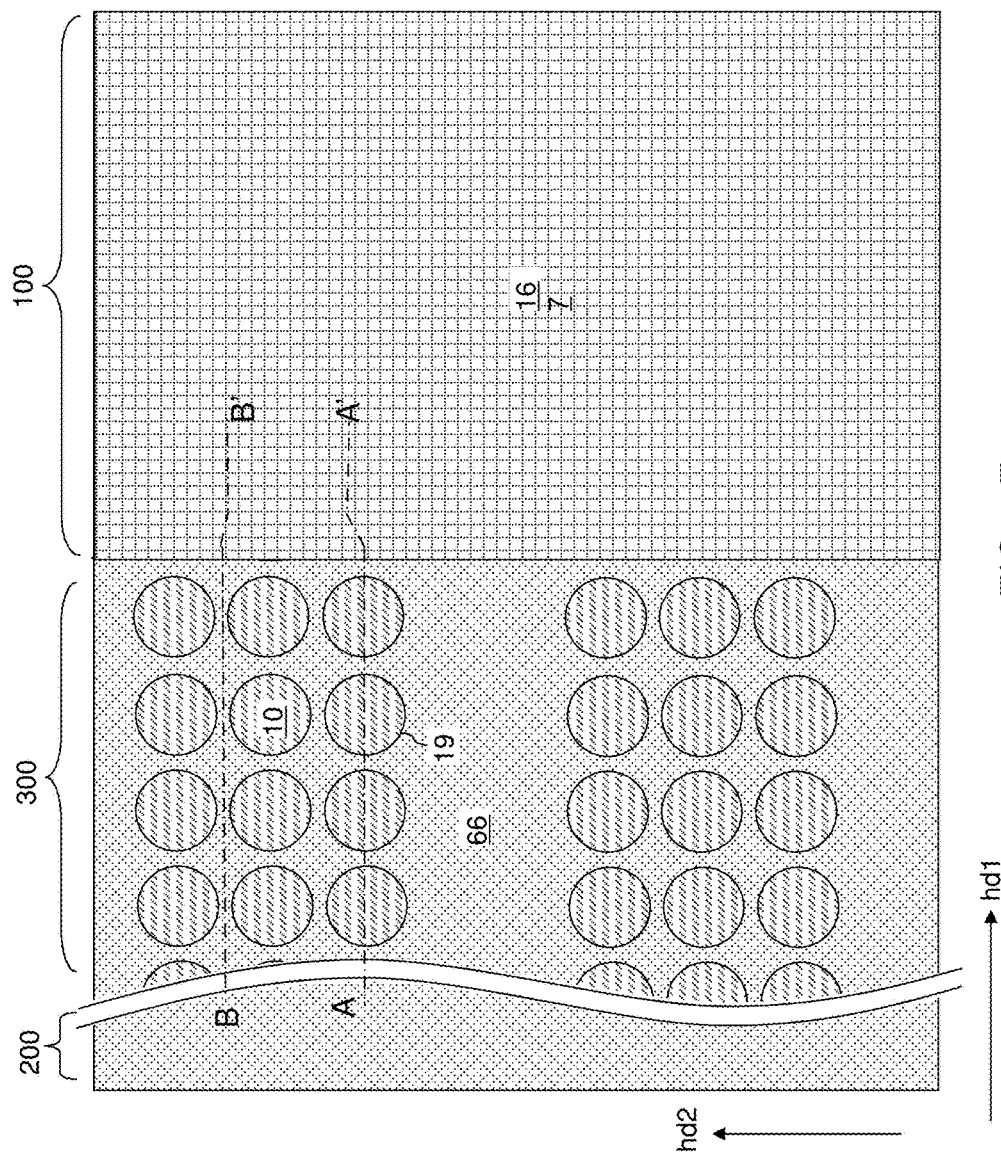
FIG. 6E is a top-down view of the exemplary structure of FIGS. 6A-6D. The vertical plane A-A' is the plane of the view of FIG. 6A, and the vertical plane B-B' is the plane of the view of FIG. 6B.

Referring to FIGS. 4A-4C, a lithographic material stack (not shown) including at least a photoresist layer 67 can be formed over the insulating cap layer 70 and the retro-stepped dielectric material portion 65. The lithographic material stack may optionally include a patterning film 66, which may include a carbon-based material such as amorphous carbon and/or diamond-like carbon. The photoresist layer 67 can be lithographically patterned to form openings therein. The openings include a first set of openings formed over the memory array region 100 and a second set of openings formed over the contact region 300.

The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and dummy openings 19. As used herein, a "memory opening" refers to a structure in which memory elements, such as a memory stack structure, is subsequently formed. As used herein, a "dummy opening" is an opening that will subsequently be filled with a sacrificial material. In one embodiment, the dummy openings 19 have a cylindrical shape, and are referred to as "cylindrical openings" 19 hereafter to correspond the exemplary shape shown in the figures. However, any other suitable shape may be used instead for the dummy openings. The memory openings 49 are formed through the insulating cap layer 70 and the entirety of the alternating stack (32, 42) in the memory array region 100. The cylindrical openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The cylindrical openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the cylindrical openings 19 can be substantially vertical, or can be tapered. The patterned lithographic material stack can be subsequently removed, for example, by ashing.

The memory openings 49 and the cylindrical openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each cylindrical opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the cylindrical openings 19 can be coplanar with the topmost surface of the semiconductor material layer 10.

Each of the memory openings 49 and the cylindrical openings 19 may include a sidewall (or a plurality of sidewalls) that extends substantially perpendicular to the topmost surface of the substrate. A two-dimensional array of memory openings 49 can be formed in the memory array region 100. A two-dimensional array of cylindrical openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the cylindrical openings 19 can be extend to a top surface of the substrate semiconductor layer 9.

In one embodiment, each cylindrical opening 19 can have an elliptical horizontal cross-sectional shape or a circular horizontal cross-sectional shape. In one embodiment, each cylindrical opening 19 can have a circular horizontal cross-sectional shape of a same diameter at a same height from the substrate (9, 10). The sidewalls of the cylindrical openings 19 may be vertical or substantially vertical, i.e., have a taper angle less than 10 degrees.

The cylindrical openings 19 can be formed as rectangular arrays of cylindrical openings 19 such that the cylindrical openings 19 are repeated along the first horizontal direction hd1 and along the second horizontal direction hd2. Each geometrical center of the cylindrical openings 19 can be formed at lattice points of a respective rectangular array (e.g., at corners of each step in the staircase in the terrace of the contact region 300). The pitch of each rectangular array of cylindrical openings 19 can be the same along the first horizontal direction hd1 and along the second horizontal direction hd2. Thus, the spacing among the cylindrical openings 19 can be the same for the first horizontal direction hd1 and the second horizontal direction hd2. Each rectangular array of cylindrical openings 19 can be formed through the retro-stepped dielectric material portion 65 and the alternating stack (32, 42). The memory openings 49 and the rectangular arrays of cylindrical openings 19 can be formed simultaneously employing a same anisotropic etch process.

Each rectangular array of cylindrical openings 19 can include an M×N rectangular array of cylindrical openings 19 such that N is an integer that is the same as the total number of columns of staircases plus 1. M is selected to be such that the total number of areas AR surrounded by a respective set of four neighboring cylindrical openings 19 is at least the total number of the sacrificial material layers 42. In other words (M−1)×(N−1) is the same as, or greater than, the total number of sacrificial material layers 42 within the alternating stack (32, 42). Each area AR surrounded by areas of four neighboring cylindrical openings 19 can overlap with an area of a respective sacrificial material layer 42 that contacts a respective horizontal bottom surface of the retro-stepped dielectric material portion 65 (e.g., at the top of each step in the staircase of the terrace in the contact region 300). The photoresist layer 67 can be removed, for example, by ashing.

Referring to FIGS. 5A-5D, the memory openings 49 can be filled or covered with an etch mask material without filling the cylindrical openings with the etch mask material. The etch mask material can form a continuous material layer that covers the memory array region, which is herein referred to as an etch mask material layer 167. In one embodiment, the etch mask material layer 167 can be a patterned photoresist layer, and may be lithographically patterned, i.e., by photolithographic exposure and development. The etch mask material layer 167 can be formed on the patterning film 66.

Referring to FIGS. 6A-6F, an etchant that etches the materials of the insulating layers 32, the insulating cap layer 70, and the retro-stepped dielectric material portion 65 selective to the materials of the sacrificial material layers 42 and the semiconductor material layer 10 (or the substrate semiconductor layer 9 if the semiconductor material layer 10 is omitted) can be introduced into the cylindrical openings 19 by performing an isotropic etch process. The isotropic etch process can be a wet etch process or a chemical dry etch process. In an illustrative example, if the insulating layers 32, the insulating cap layer 70, and the retro-stepped dielectric material portion 65 include silicon oxide, and if the sacrificial material layers 42 include silicon nitride, a wet etch process employing hydrofluoric acid may be employed to etch physically exposed surface portions of the insulating layers 32, the insulating cap layer 70, and the retro-stepped dielectric material portion 65.

The isotropic etch process laterally expands the cavities of the cylindrical openings 19 at each level of the insulating layers 32 and at the level of the insulating cap layer 70 laterally at a same expansion rate until a continuous cavity 19C is formed from each rectangular array of cylindrical openings 19. The boundaries of each continuous cavity 19C are shown by the dashed lines in FIG. 6F. The direction of the expansion of the cylindrical openings 19 is shown by the arrows in FIG. 6F. The cylindrical openings 19 remain, and are not converted into the continuous cavities 19C, at the levels of (i.e., inside) the sacrificial material layers 42 and the patterning film 66. The duration of the isotropic etch process, and the etch rate of the etchant of the isotropic etch process, can be selected such that an unetched portion of an insulating layer 32 remains within each area in which a portion of the insulating layer 32 was laterally surrounded by a set of four neighboring cylindrical openings 19 at the processing steps of FIGS. 5A-5D. Each remaining portion of the insulating layers 32 is herein referred to as an insulating pedestal portion 32'. Each insulating pedestal portion 32' includes a respective set of four concave vertically-extending dielectric surfaces. For example, each insulating pedestal portion 32' can have a shape of a four pointed star with concave sidewalls between the points when viewed from the top, as shown in FIG. 6D. In one embodiment, each of the four concave vertically-extending dielectric surfaces can have a same radius of curvature.

As used herein, a "pedestal," a "pillar," or a "pillar structure" refers to a structure having a pair of a top surface, and a bottom surface and at least one sidewall that connects the top surface and the bottom surface such that the at least one sidewall laterally surrounds the structure entirely. In one non-limiting embodiment, the top and bottom surfaces may be planar and parallel to each other, and the at least one sidewall is not curved such that an imaginary straight line may extend continuously along a surface of the at least one sidewall from the top surface to the bottom surface. Each of the at least one sidewall may be vertical, or may be substantially vertical, i.e., has a taper angle less than 10 degrees. As used herein, a "pedestal portion" refers to a material portion having the geometry of a pedestal. Each insulating pedestal portion 32' can be located between a vertically neighboring pair of two sacrificial material layers 42, or below the bottommost sacrificial material layer 42.

The retro-stepped dielectric material portion 65 can be etched concurrently with etching of the insulating layers 32. If the insulating layers 32 and the retro-stepped dielectric material portion 65 include a same dielectric material (such as undoped silicate glass) or dielectric materials having the same, or similar, etch rates in the etchant of the isotropic etch process, physically exposed sidewalls of the retro-stepped dielectric material portion 65 around each cylindrical opening 19 can be laterally recessed at the same, or similar, etch rate as the physically exposed sidewalls of the insulating layers 32. An unetched portion of the retro-stepped dielectric material portion can be present within each area in which a portion of the retro-stepped dielectric material portion 65 was laterally surrounded by a set of four neighboring cylindrical openings 19 at the processing steps of FIGS. 5A-5D. Each remaining portion of the retro-stepped dielectric material portion 65 is herein referred to as a dielectric pillar structure 65'. Each dielectric pillar structure 65' includes a respective set of four concave vertically-extending dielectric surfaces, and overlies at least one dielectric pedestal portion 32'. For example, each dielectric pillar structure 65' can have a shape of a four pointed star with concave sidewalls between the points when viewed from the top, as shown in FIG. 6D. In one embodiment, each of the four concave vertically-extending dielectric surfaces can have a same radius of curvature within any horizontal cross-sectional plane that cuts through a dielectric pillar structure 65'. The area of each dielectric pillar structure 65' can at least partially overlap the area of each underlying dielectric pedestal portion 32' in a plan view. Each insulating pedestal portions 32' can be located underneath a respective one of the dielectric pillar structures 65'. Each dielectric pillar structure 65' can vertically extend from a top surface of a respective one of the sacrificial material layers 42 to a horizontal plane including the top surface of the remaining portions of the retro-stepped dielectric material portion 65, which can include the interface between the patterning film 66 and the insulating cap layer 70.

Figure 7B:
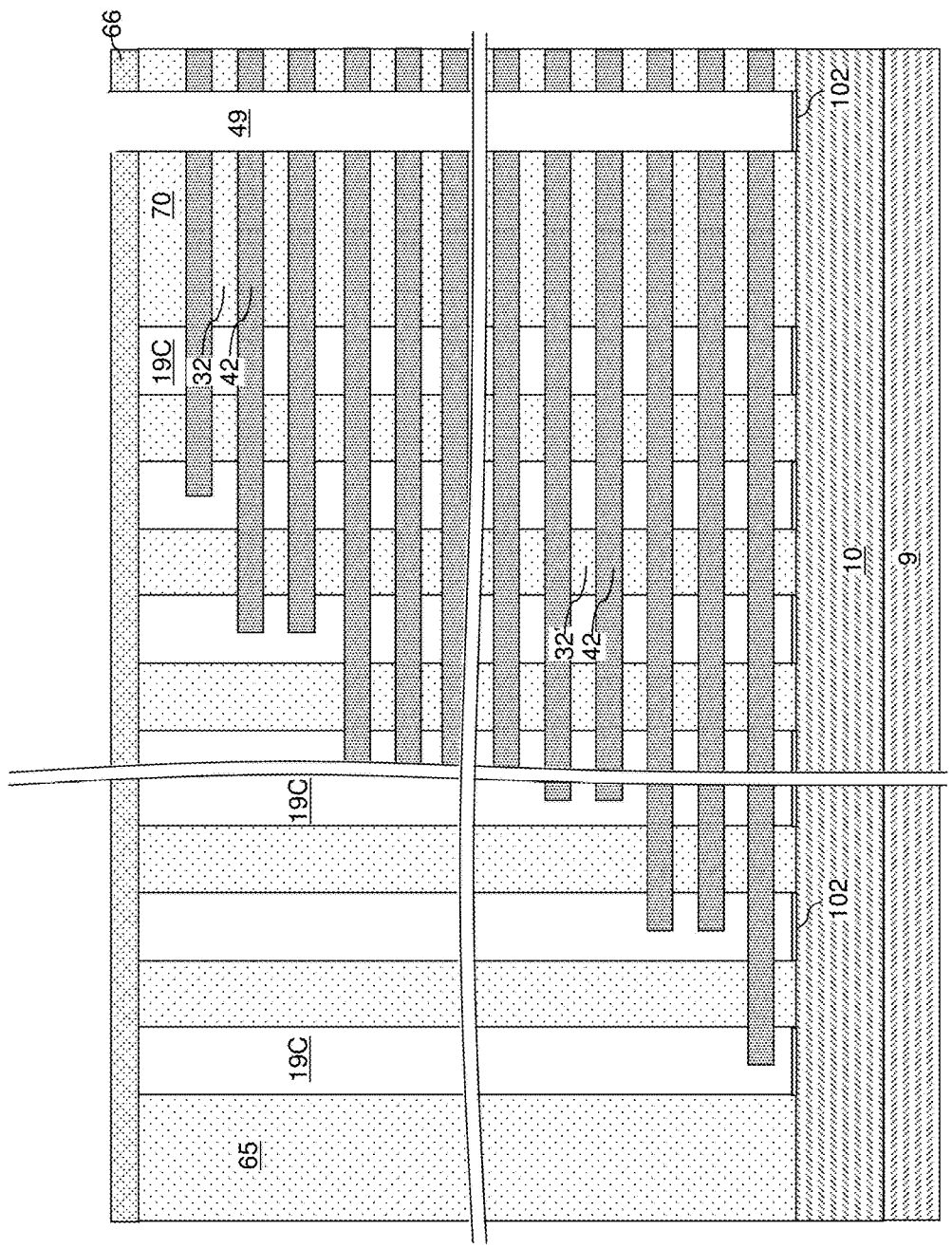
FIG. 7B is a second schematic vertical cross-sectional view of the exemplary structure of FIG. 7A.
Figure 8A:
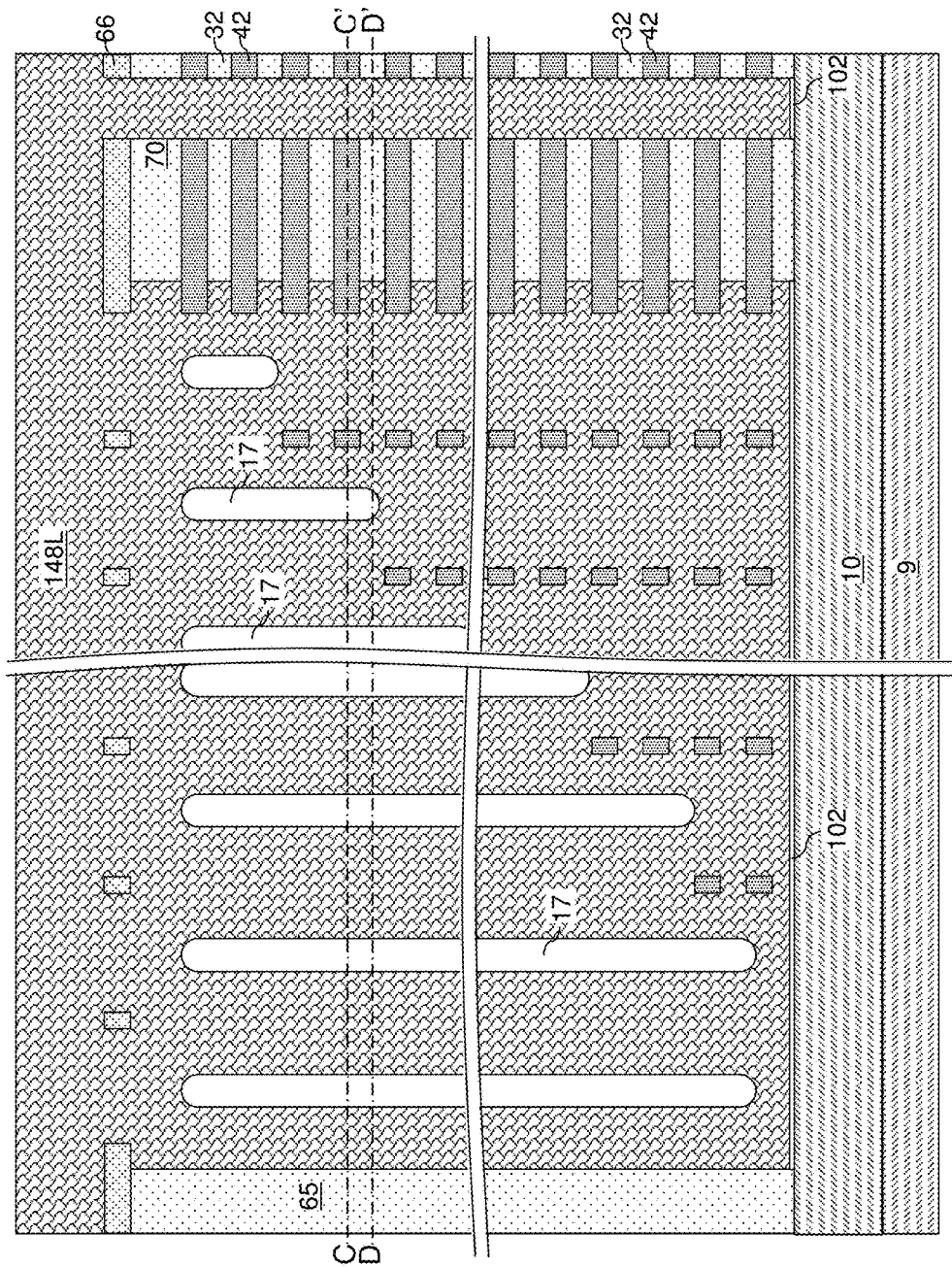
FIG. 8A is a first schematic vertical cross-sectional view of the exemplary structure after deposition of a fill material in the continuous cavity and in the memory openings according to an embodiment of the present disclosure.
Figure 8B:
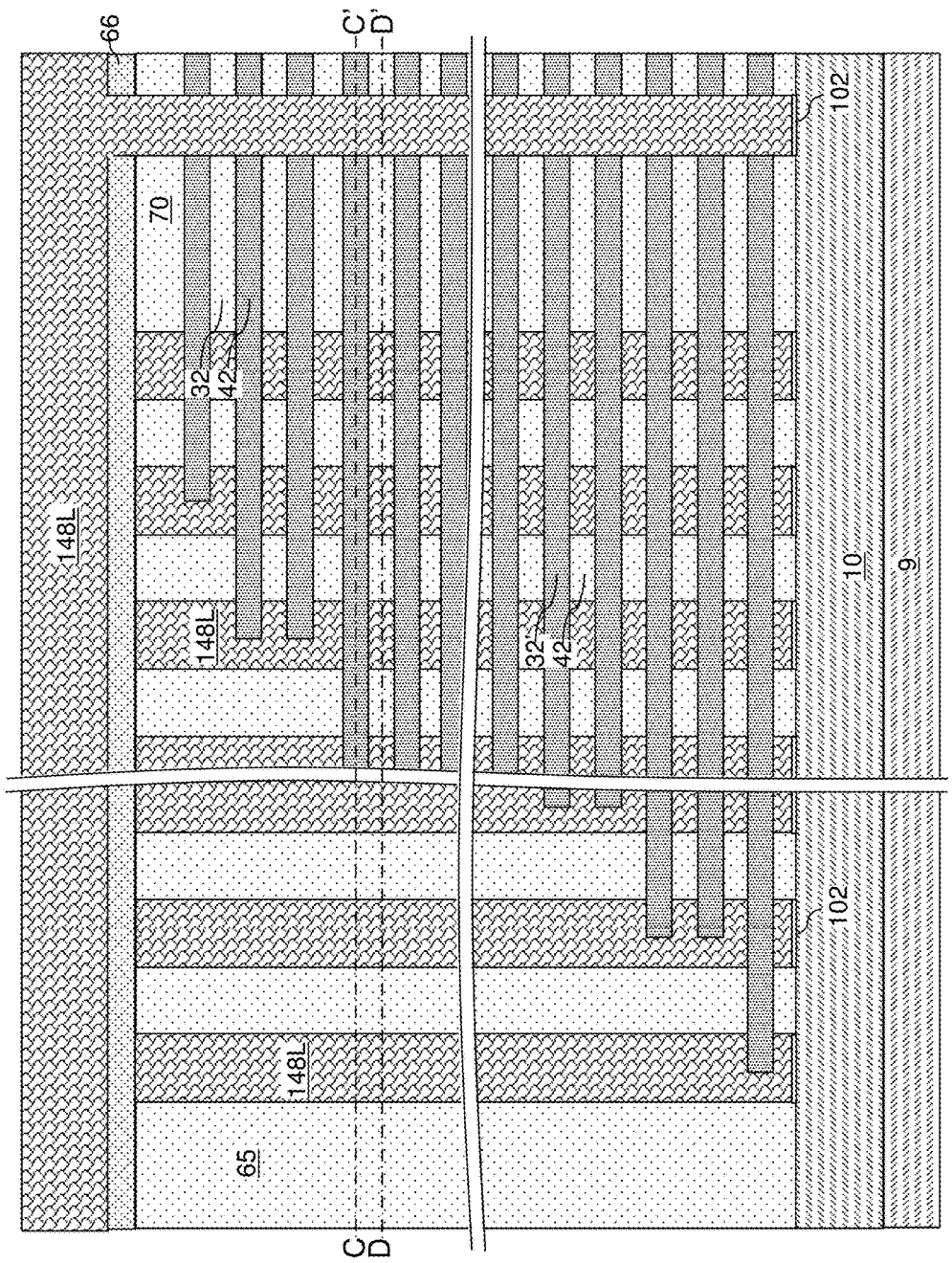
FIG. 8B is a second schematic vertical cross-sectional view of the exemplary structure of FIG. 8A.
Figure 8C:
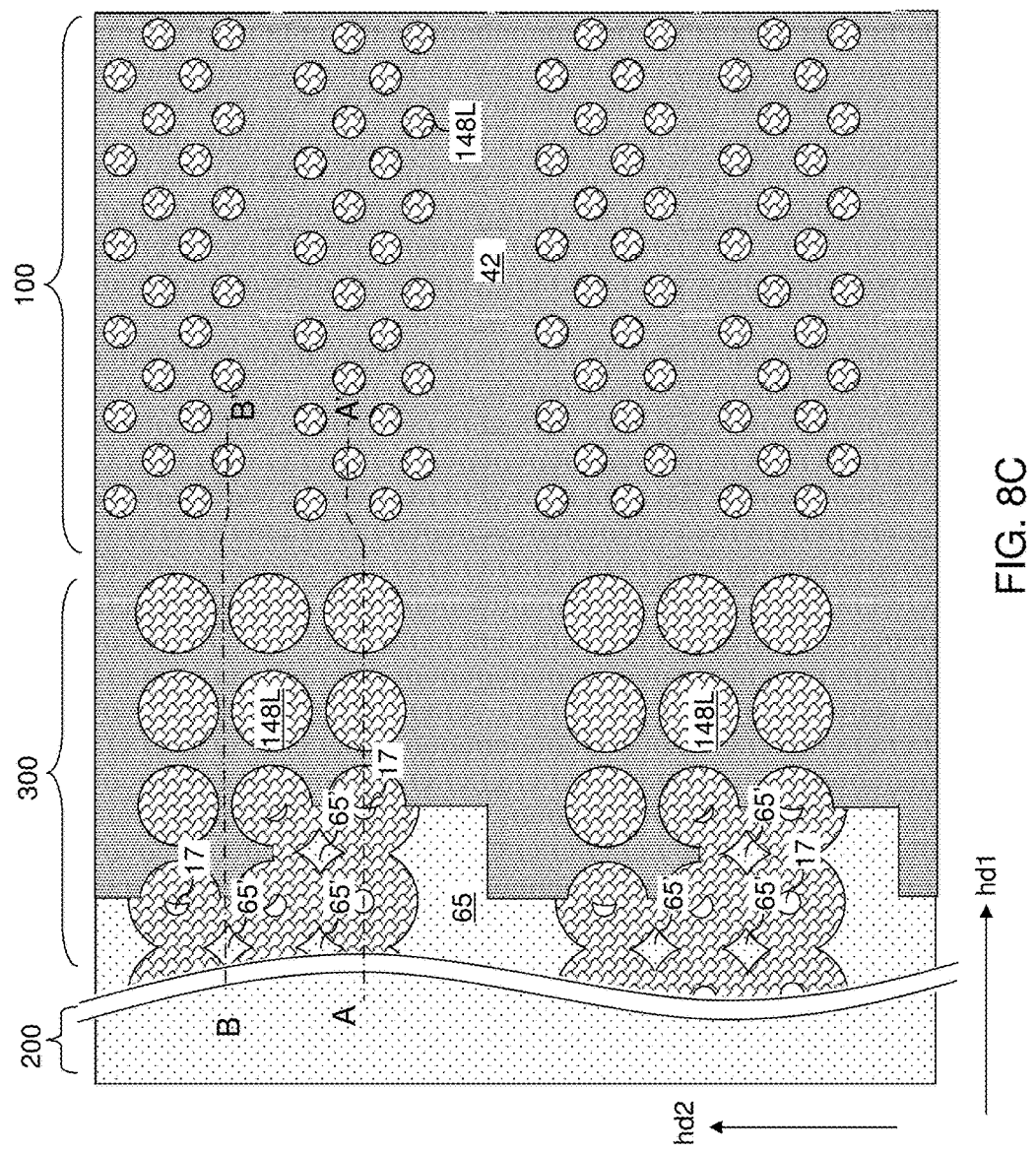
FIG. 8C is a first horizontal cross-sectional view of the exemplary structure along the horizontal plane C-C' of FIGS. 8A and 8B. The vertical plane A-A' is the plane of the view of FIG. 8A, and the vertical plane B-B' is the plane of the view of FIG. 8B.
Figure 8D:
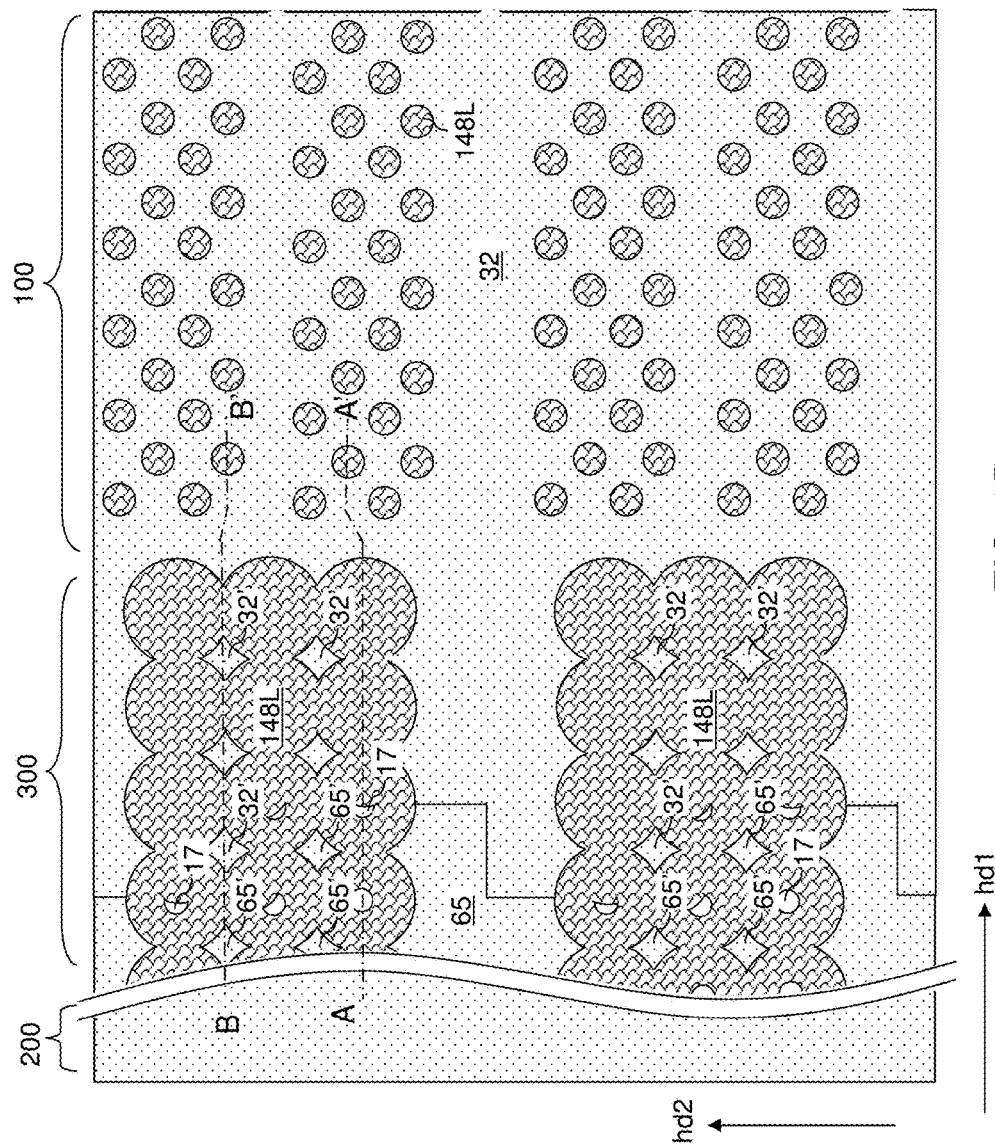
FIG. 8D is a first horizontal cross-sectional view of the exemplary structure along the horizontal plane D-D' of FIGS. 8A and 8B. The vertical plane A-A' is the plane of the view of FIG. 8A, and the vertical plane B-B' is the plane of the view of FIG. 8B.

Referring to FIGS. 7A and 7B, the etch mask material layer 167 can be removed from the memory array region 100, for example, by ashing. Sidewalls of the memory openings 49 are physically exposed. A suitable surface clean process may be optionally performed to clean the physically exposed surfaces of each memory opening 49. A semiconductor oxide liner 102 can be formed by oxidation on the physically exposed surfaces of the semiconductor material layer 10.

Referring to FIGS. 8A-8D, a sacrificial fill material layer 148L can be deposited in the continuous cavities 19C and in the memory openings 49. The sacrificial fill material layer 148L includes a sacrificial material which can be subsequently removed selective to the materials of the insulating layers 32 and the sacrificial material layers 42. In one embodiment, the sacrificial fill material layer 148L can include amorphous silicon, polysilicon, germanium, a silicon-germanium alloy, carbon, borosilicate glass (which provides higher etch rate relative to undoped silicate glass), porous or non-porous organosilicate glass, organic polymer, or inorganic polymer. In one embodiment, the sacrificial fill material layer 148L can be selected from a semiconductor material, diamond-like carbon, inorganic polymer, and an organic polymer. In one embodiment, the sacrificial fill material layer 148L can include a semiconductor material such as amorphous silicon or polysilicon. Optionally, a thin etch stop layer (such as a silicon oxide layer having a thickness in a range from 1 nm to 3 nm) may be employed prior to depositing the sacrificial fill material layer. If an etch stop layer is employed, semiconductor materials such as amorphous silicon may be employed as the sacrificial fill material. The sacrificial fill material layer 148L may be formed by a non-conformal deposition or a conformal deposition method. The sacrificial fill material layer 148L may, or may not, include encapsulated cavities 17 that extend along the axial direction within center portions of volumes of the cylindrical openings 19 as formed at the processing steps of FIGS. 4A-4C.

Figure 9A:
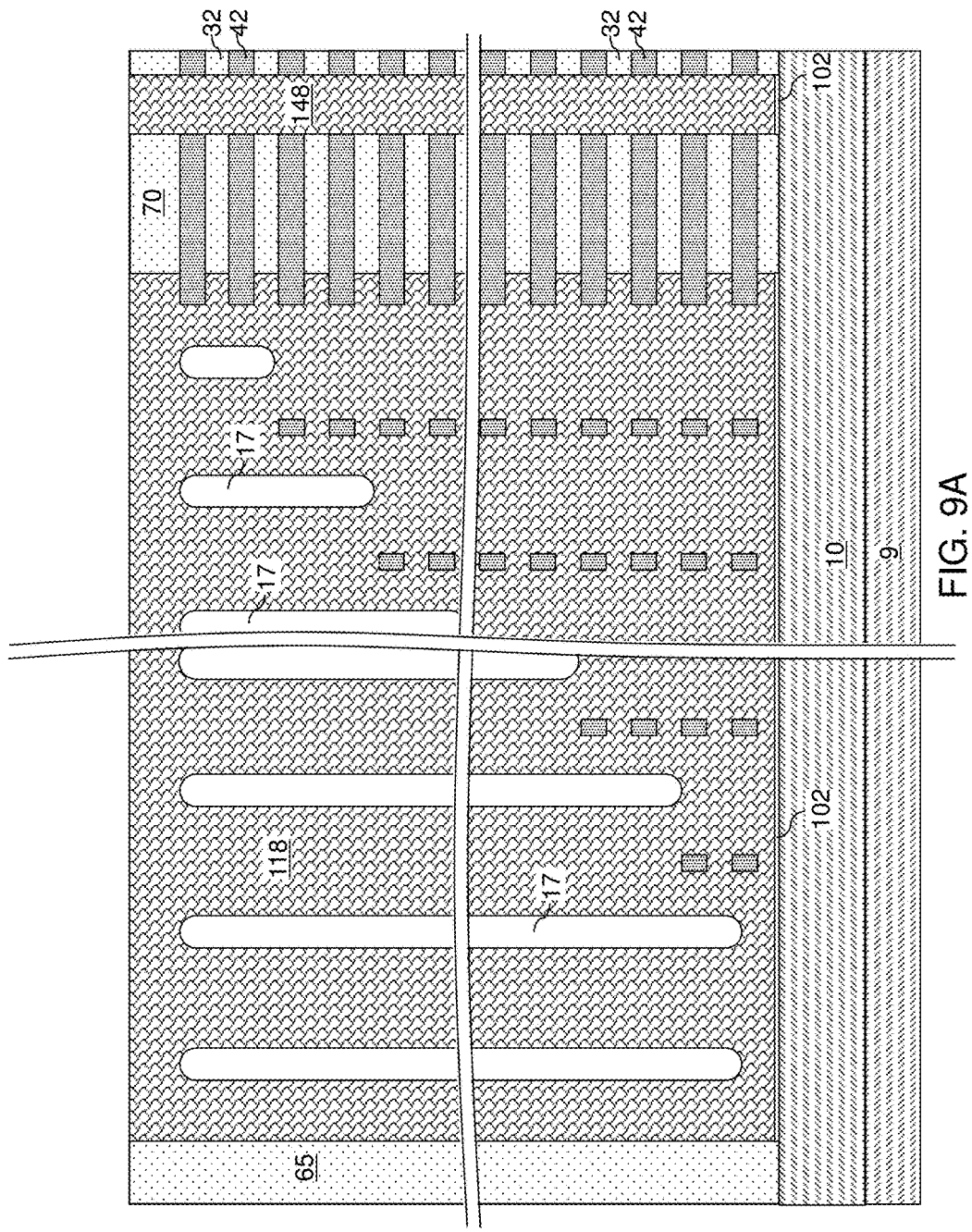
FIG. 9A is a first schematic vertical cross-sectional view of the exemplary structure after formation of a continuous fill material portion and sacrificial memory opening fill structures according to an embodiment of the present disclosure.
Figure 9B:
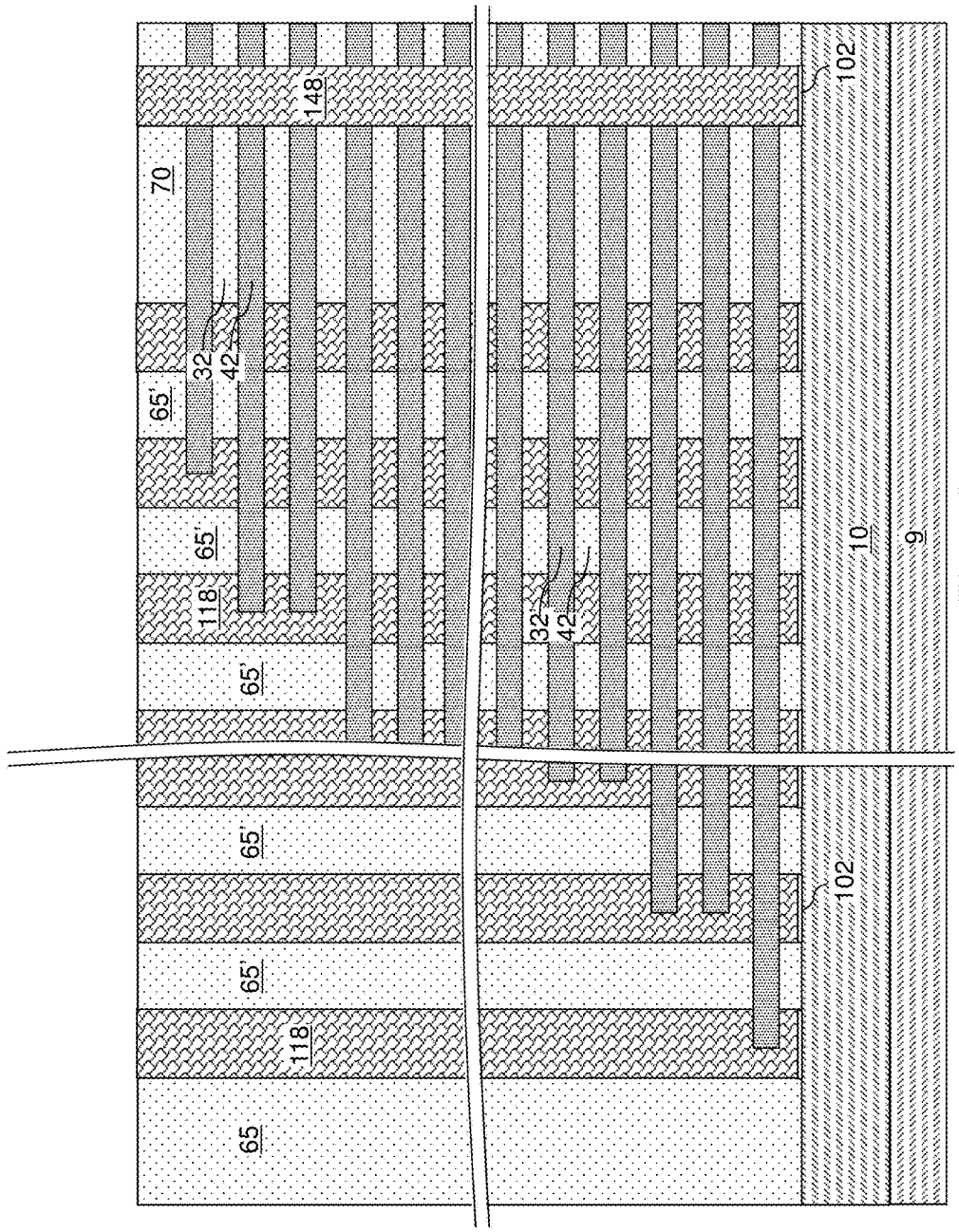
FIG. 9B is a second schematic vertical cross-sectional view of the exemplary structure of FIG. 9A.
Figure 9C:
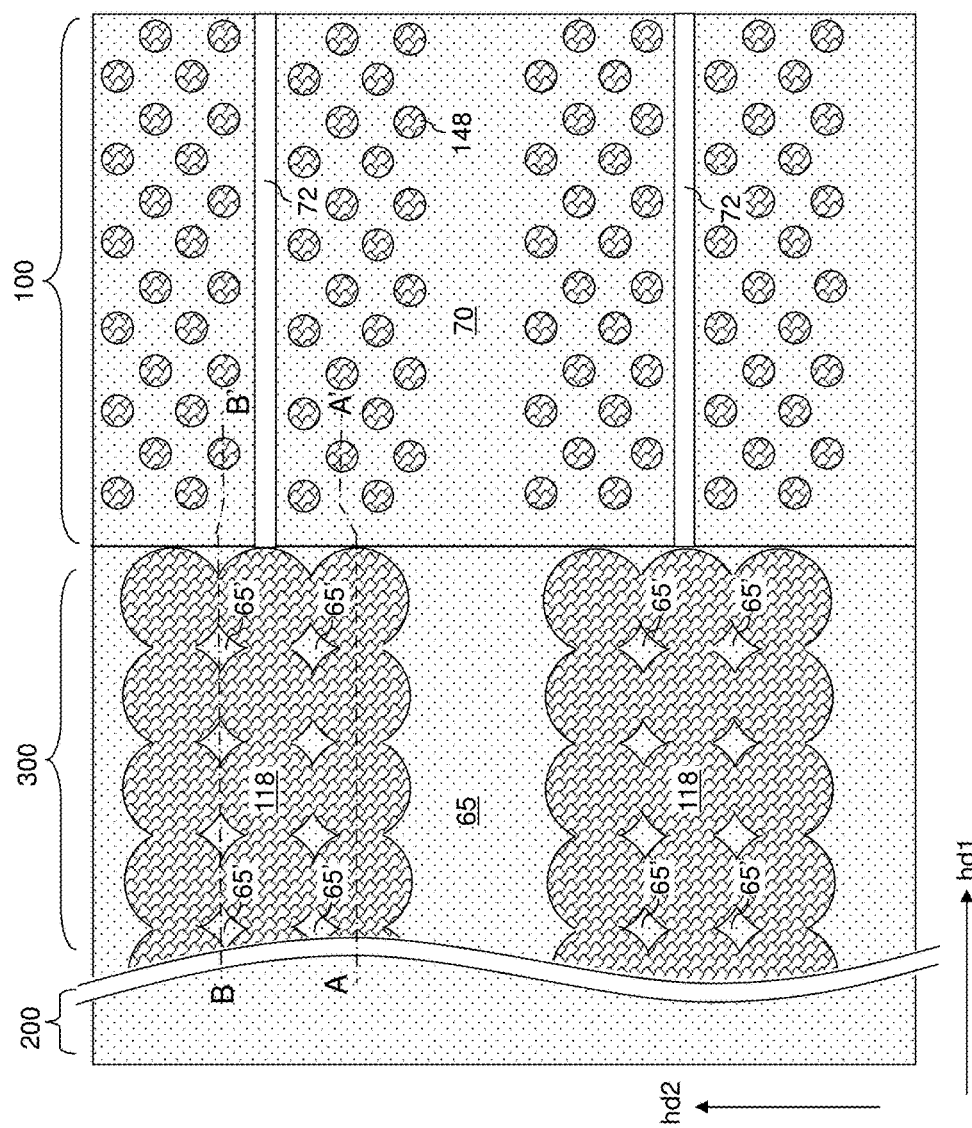
FIG. 9C is a top-down view of the exemplary structure of FIGS. 9A and 9B. The vertical plane A-A' is the plane of the view of FIG. 9A, and the vertical plane B-B' is the plane of the view of FIG. 9B.

Referring to FIGS. 9A-9C, the sacrificial fill material layer 148L can be planarized to form a continuous fill material portion 118 within each volume of a continuous cavity 19C and to form sacrificial memory opening fill structures 148 within the memory openings 49. Specifically, excess portions of the sacrificial fill material layer 148L can be removed from above a horizontal plane overlying the retro-stepped dielectric material portion 65. For example, a planarization process such as a chemical mechanical planarization (CMP) process and/or a recess etch process may be performed employing the patterning film 66 or the combination of the retro-stepped dielectric material portion 65 and the insulating cap layer as a stopping layer. If the patterning film 66 is employed as the stopping layer, the material of the sacrificial fill material layer 148L can be vertically recessed approximately to the horizontal plane including the top surface of the retro-stepped dielectric material portion 65, for example, by a recess etch. Any remaining portion of the patterning film 66 can be subsequently removed. Each remaining portion of the sacrificial fill material layer 148L filling a respective continuous cavity 19C constitutes a continuous fill material portion 118. Each remaining portion of the sacrificial fill material layer 148L filling a respective memory opening 49 constitutes a sacrificial memory opening fill structure 148. In one embodiment, the continuous fill material portions 118 and the sacrificial memory opening fill structures 148 can include a semiconductor material such as amorphous silicon or polysilicon.

Figure 10A:
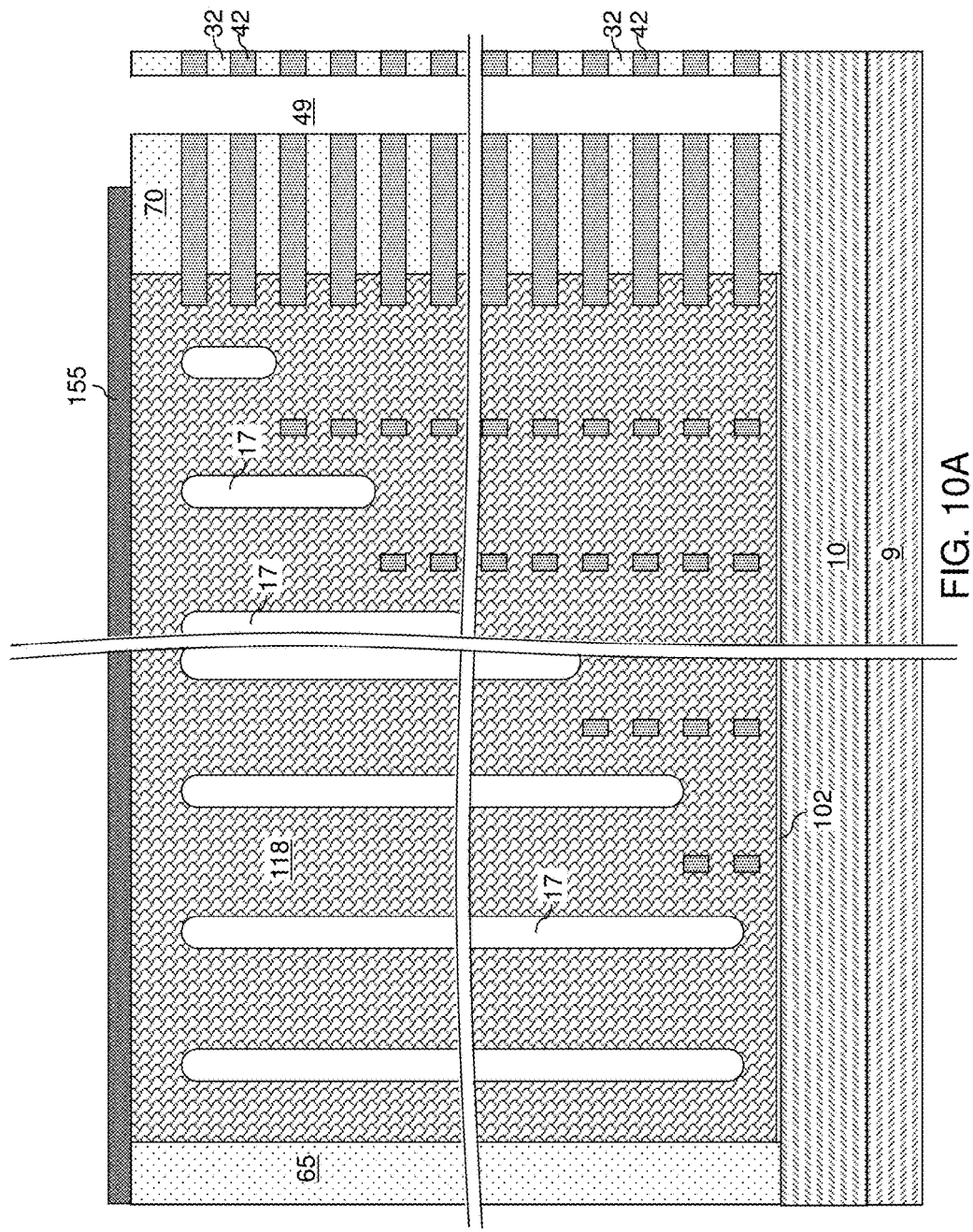
FIG. 10A is a first schematic vertical cross-sectional view of the exemplary structure after removal of the sacrificial memory opening fill structures according to an embodiment of the present disclosure.
Figure 10B:
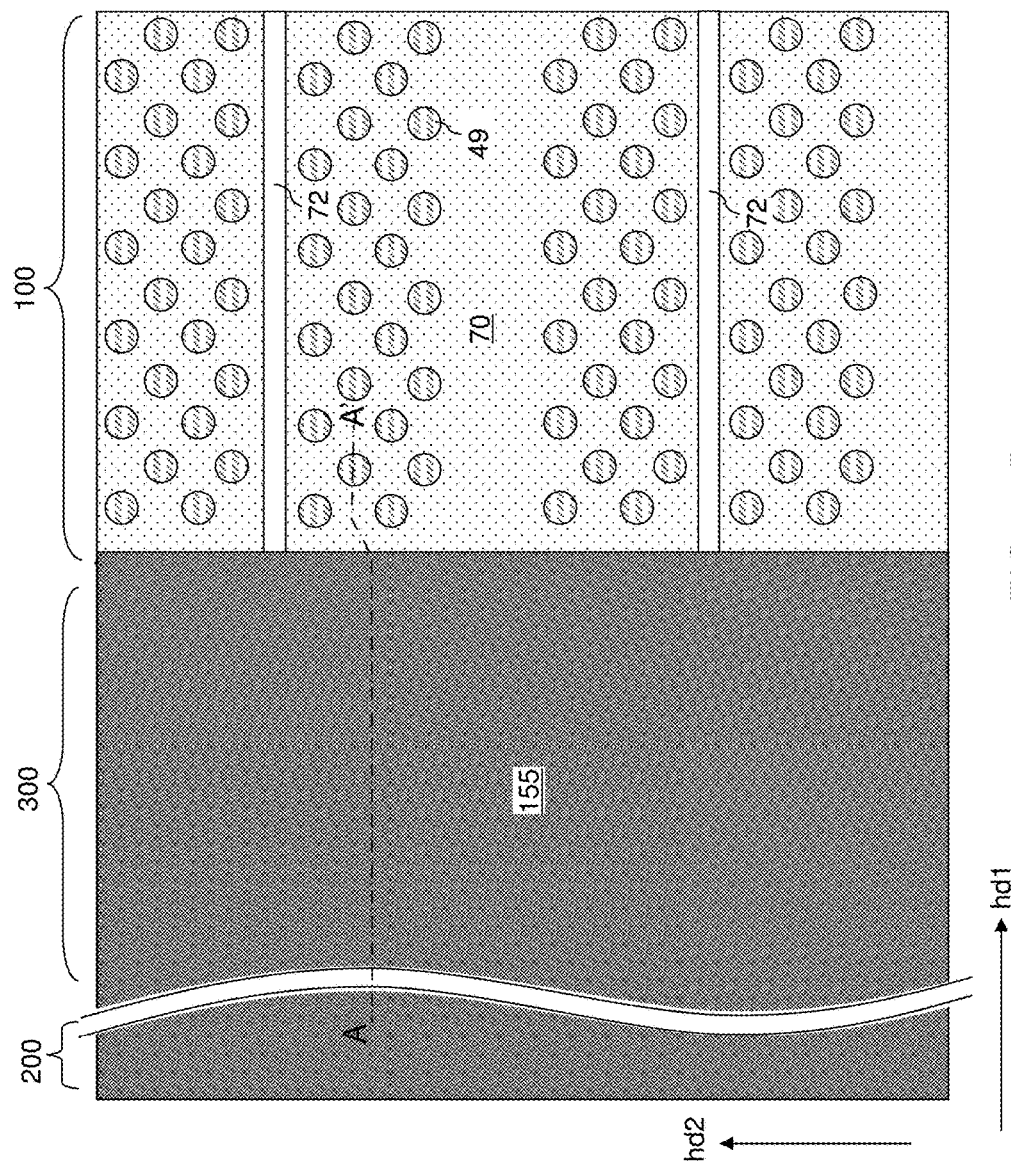
FIG. 10B is a top-down view of the exemplary structure of FIG. 10A. The vertical plane A-A' is the plane of the view of FIG. 10A.

Referring to FIGS. 10A and 10B, a hard mask layer 155 can be formed over the top surfaces of the sacrificial memory opening fill structures 148 and the continuous fill material portions 118. The hard mask layer 155 can include a dielectric material or a metallic material that can be removed selective to the dielectric materials of the retro-stepped dielectric material portion 65 and the insulating cap layer 70. In one embodiment, the hard mask layer 155 includes silicon nitride or a dielectric metal oxide (such as aluminum oxide). The thickness of the hard mask layer 155 may be in a range from 3 nm to 60 nm, such as from 6 nm to 30 nm, although lesser and greater thicknesses can also be employed.

The hard mask layer 155 can be patterned by a combination of lithographic methods and an etch process to cover the contact region 300 and the peripheral device region 200 without covering the memory array region 100. Subsequently, the sacrificial memory opening fill structures 148 can be removed from the memory openings by an etch process that is selective to the materials of the hard mask layer 155, the insulating cap layer 70, and the alternating stack (32, 42). For example, if the sacrificial memory opening fill structures 148 include amorphous silicon or polysilicon and a semiconductor oxide liner 102 is provided within each memory opening, a wet etch employing a KOH solution or a trimethyl(2-hydroxyethyl)ammonium hydroxide (TMY) solution can be employed to remove the sacrificial memory opening fill structures 148. The semiconductor oxide liners 102 can be subsequently removed, for example, by a wet etch process employing dilute hydrofluoric acid.

FIGS. 11A-11H illustrate structural changes in a memory opening 49, which is one of the memory openings 49 in the exemplary structure of FIGS. 9A and 9B.

Referring to FIG. 11A, a memory opening 49 in the exemplary device structure of FIGS. 9A and 9B is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 11B, an optional pedestal channel portion (e.g., an epitaxial pedestal) 11 can be formed at the bottom portion of each memory opening 49, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 11C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of lateral recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 11D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 11E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening. The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 11F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 11G, the horizontal portion of the dielectric core layer 62L can be removed, for example, by a recess etch from above the top surface of the insulating cap layer 70. Further, the material of the dielectric core layer 62L can be further recessed within each memory opening 49, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 11H, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of lateral recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63).

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 12A:
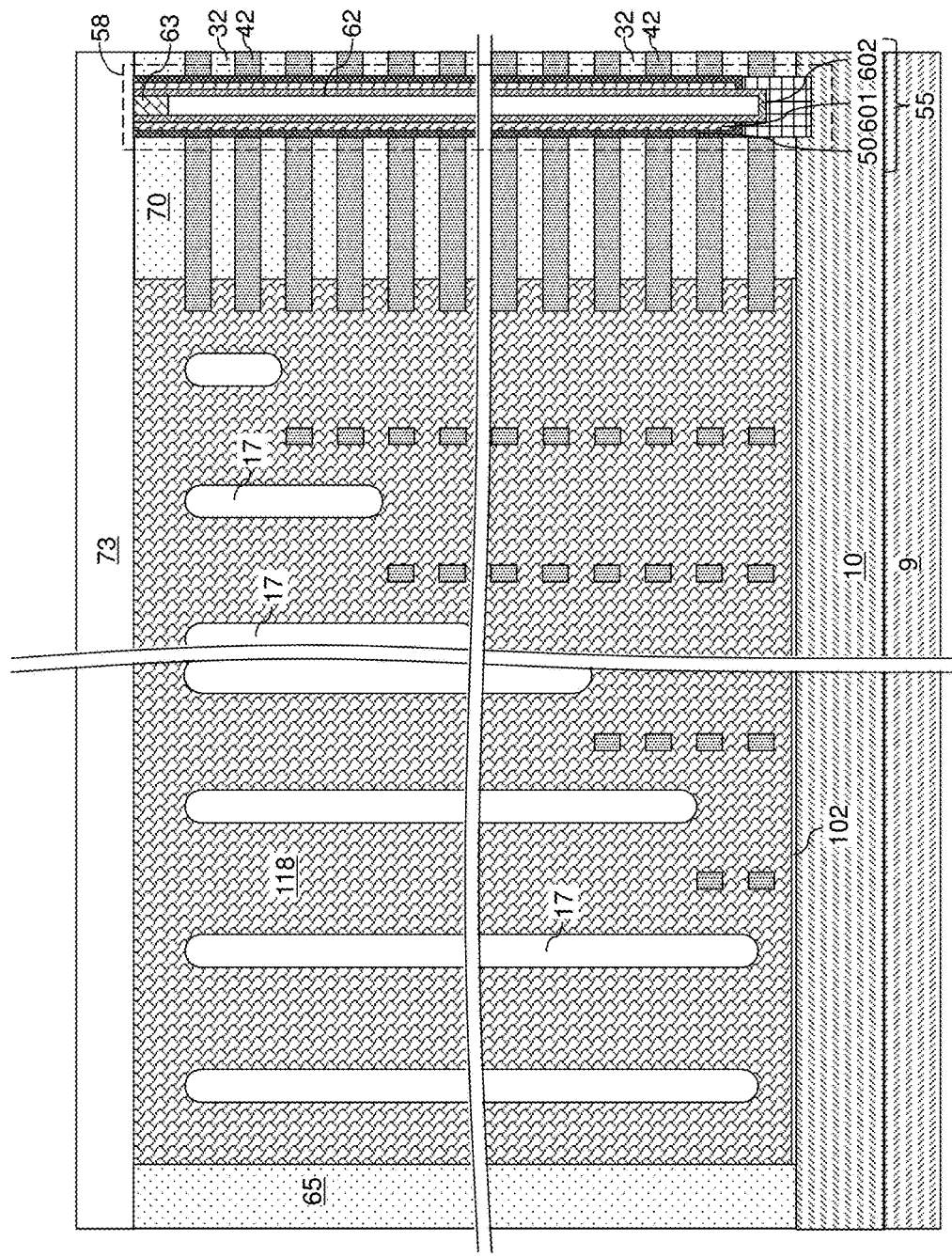
FIG. 12A is a first schematic vertical cross-sectional view of the exemplary structure after removal of a hard mask layer and formation of a first contact level dielectric layer as an etch mask layer according to an embodiment of the present disclosure.
Figure 12B:
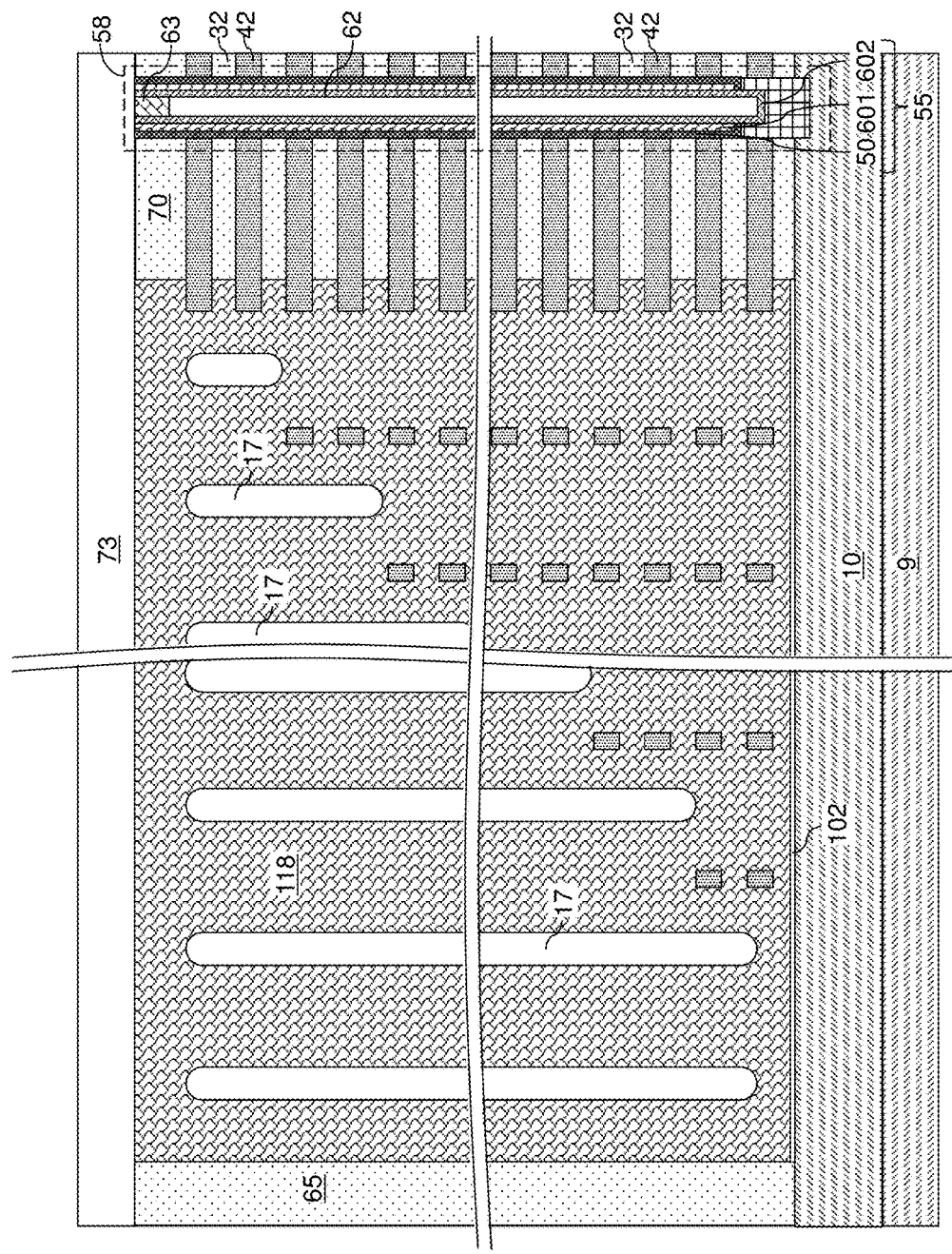
FIG. 12B is a second schematic vertical cross-sectional view of the exemplary structure of FIG. 12A.

Referring to FIGS. 12A and 12B, the hard mask layer 155 can be removed, for example, by a wet etch process. A first contact level dielectric layer 73 can be formed over the alternating stack (32, 42) of insulating layer 32 and sacrificial material layers 42, and over the memory stack structures 55. The first contact level dielectric layer 73 includes a dielectric material that is different from the dielectric material of the sacrificial material layers 42. For example, the first contact level dielectric layer 73 can include silicon oxide. The first contact level dielectric layer 73 can have a thickness in a range from 50 nm to 500 nm, although lesser and greater thicknesses can also be employed. The first contact level dielectric layer 73 is subsequently employed as an etch mask layer through which an etchant is supplied. Each combination of a pedestal channel portion 11 (if present), a memory stack structure 55 (which contains a memory film 50 and a vertical semiconductor channel 60) a dielectric core 62, and a drain region 63 within each memory opening 49 constitutes a memory opening fill structure 58.

Figure 13A:
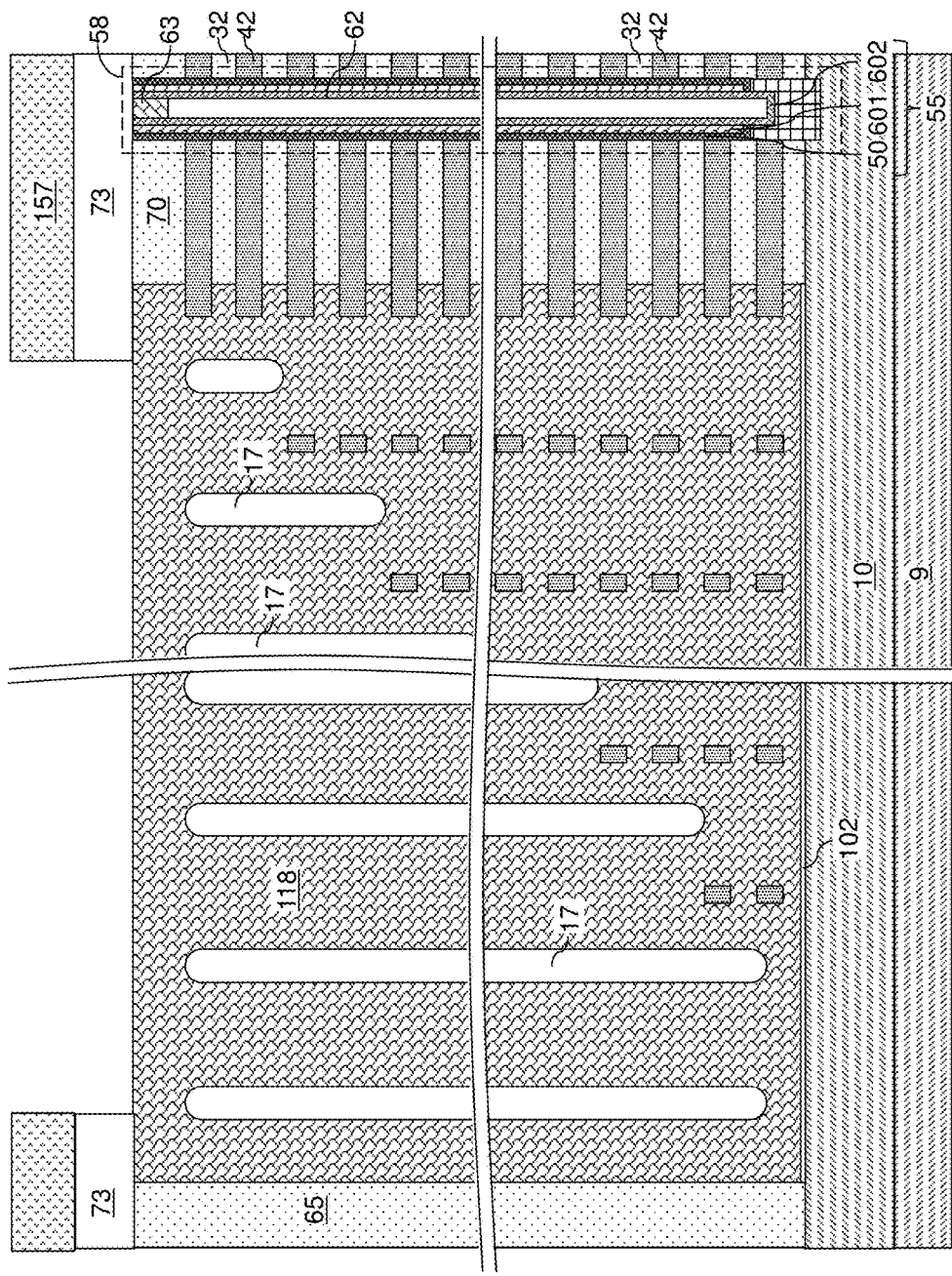
FIG. 13A is a first schematic vertical cross-sectional view of the exemplary structure after formation of openings in the etch mask layer according to an embodiment of the present disclosure.
Figure 13B:
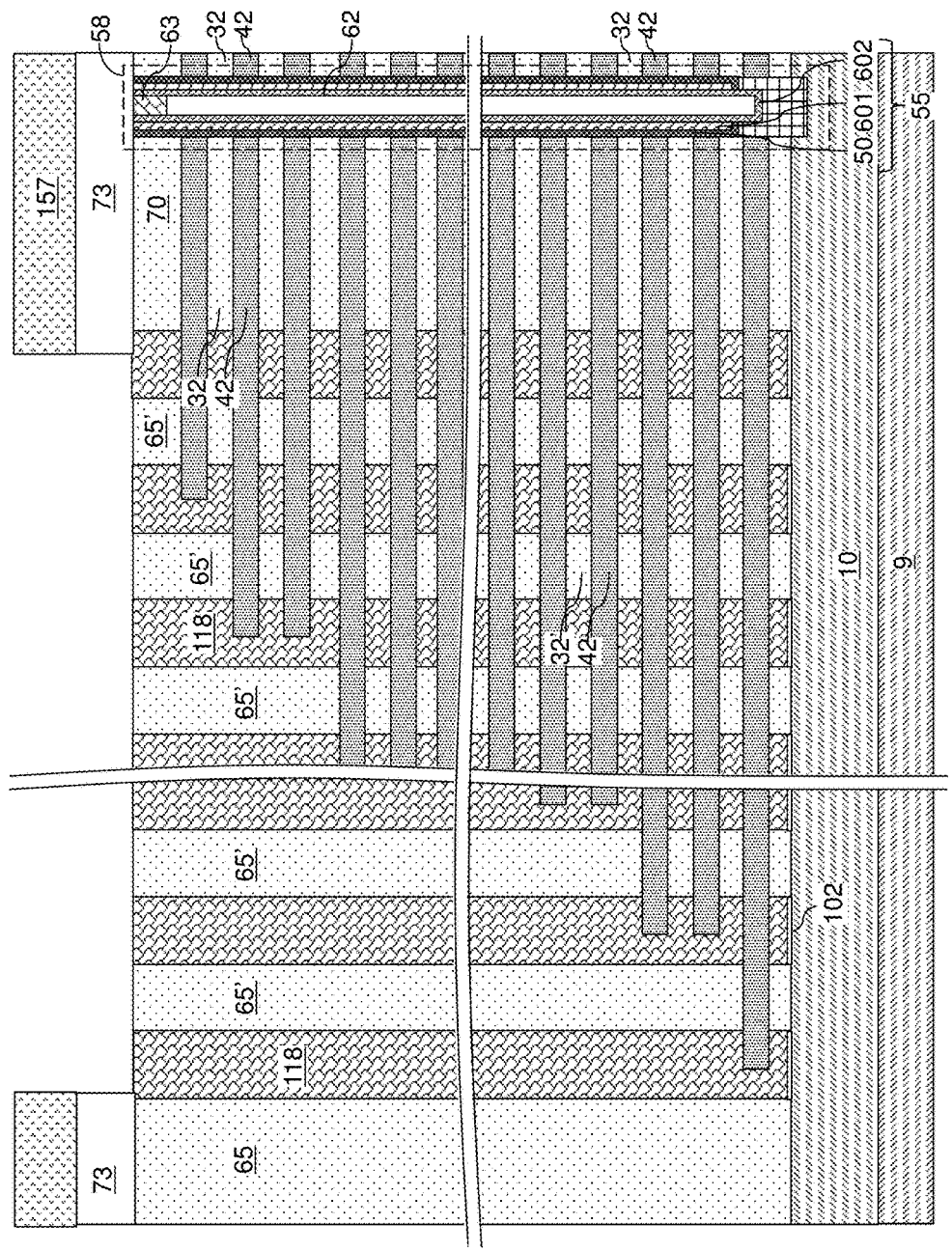
FIG. 13B is a second schematic vertical cross-sectional view of the exemplary structure of FIG. 13A.
Figure 13C:
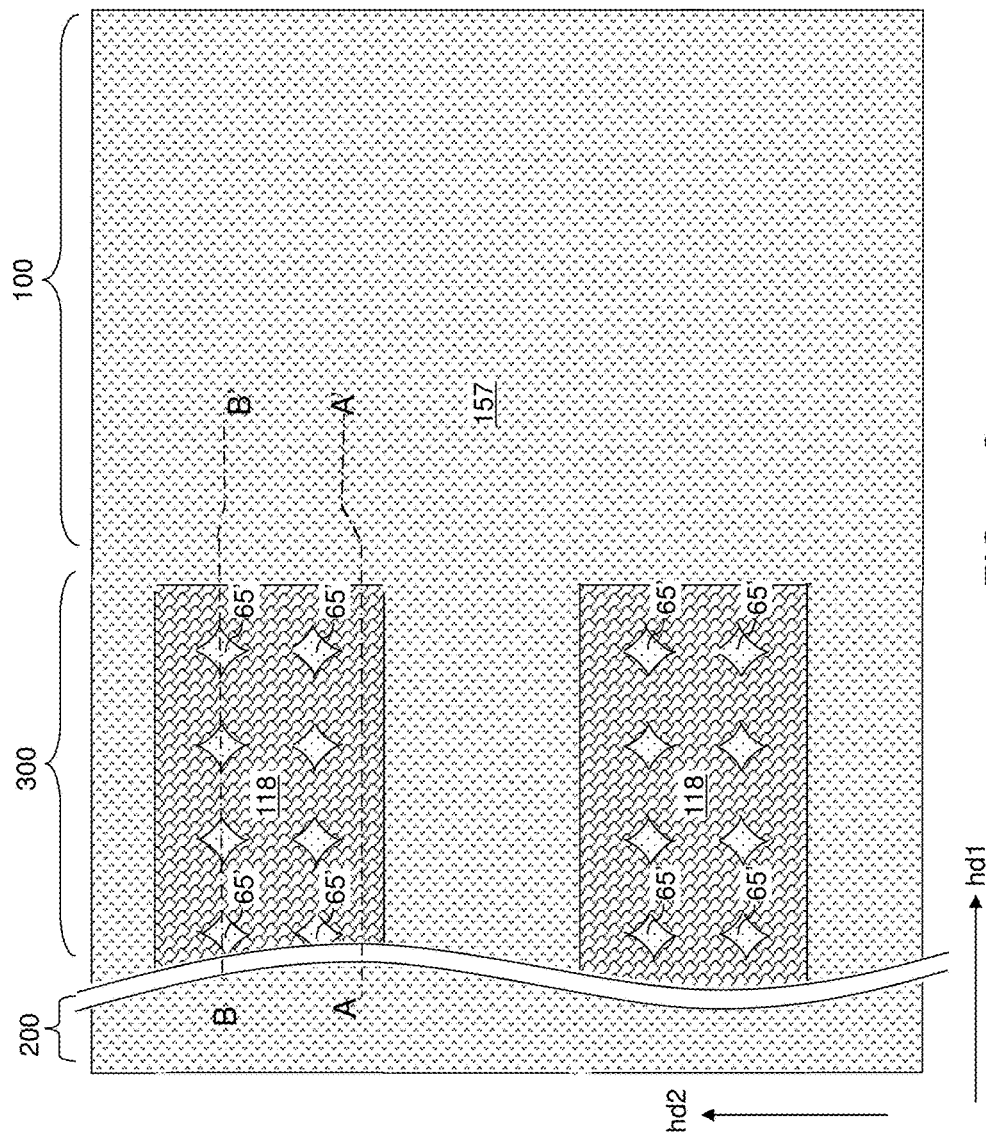
FIG. 13C is a top-down view of the exemplary structure of FIGS. 13A and 13B. The vertical plane A-A' is the plane of the view of FIG. 13A, and the vertical plane B-B' is the plane of the view of FIG. 13B.

Referring to FIGS. 13A-13C, a photoresist layer 157 can be applied over the first contact level dielectric layer 73, and is lithographically patterned to form openings therein. The areas of the opening in the photoresist layer overlaps with areas enclosed by an outer periphery of a respective one of the continuous fill material portions 118. As such, the openings in the photoresist layer 157 are formed within the contact region 300.

An etch process is performed to etch through portions of the first contact level dielectric layer 73 that are not covered by the patterned photoresist layer 157. An anisotropic etch process or an isotropic etch process can be employed to etch through the unmasked portions of the first contact level dielectric layer 73. Top surfaces of the continuous fill material portions 118 and the dielectric pillar structures 65' can be physically exposed within each opening through the first contact level dielectric layer 73. Each opening in the first contact level dielectric layer 73 overlies a set of dielectric pillar structures 65'. In one embodiment, all top surfaces of the dielectric pillar structures 65' can be physically exposed inside the openings through the first contact level dielectric layer 73.

Figure 14A:
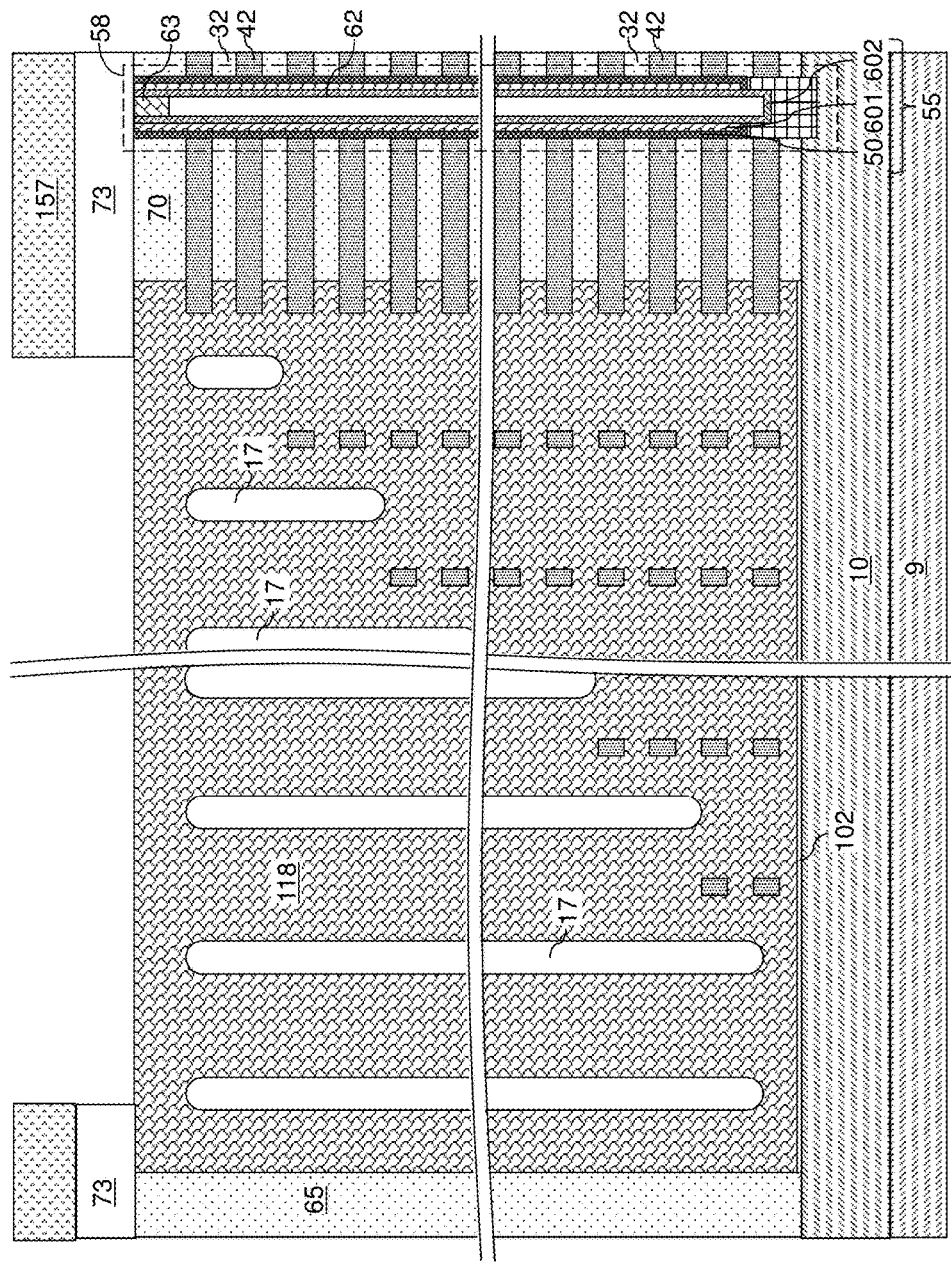
FIG. 14A is a first schematic vertical cross-sectional view of the exemplary structure after anisotropically etching the dielectric pillar structures selective to the continuous fill material portion to form vertical via cavities according to an embodiment of the present disclosure.
Figure 14B:
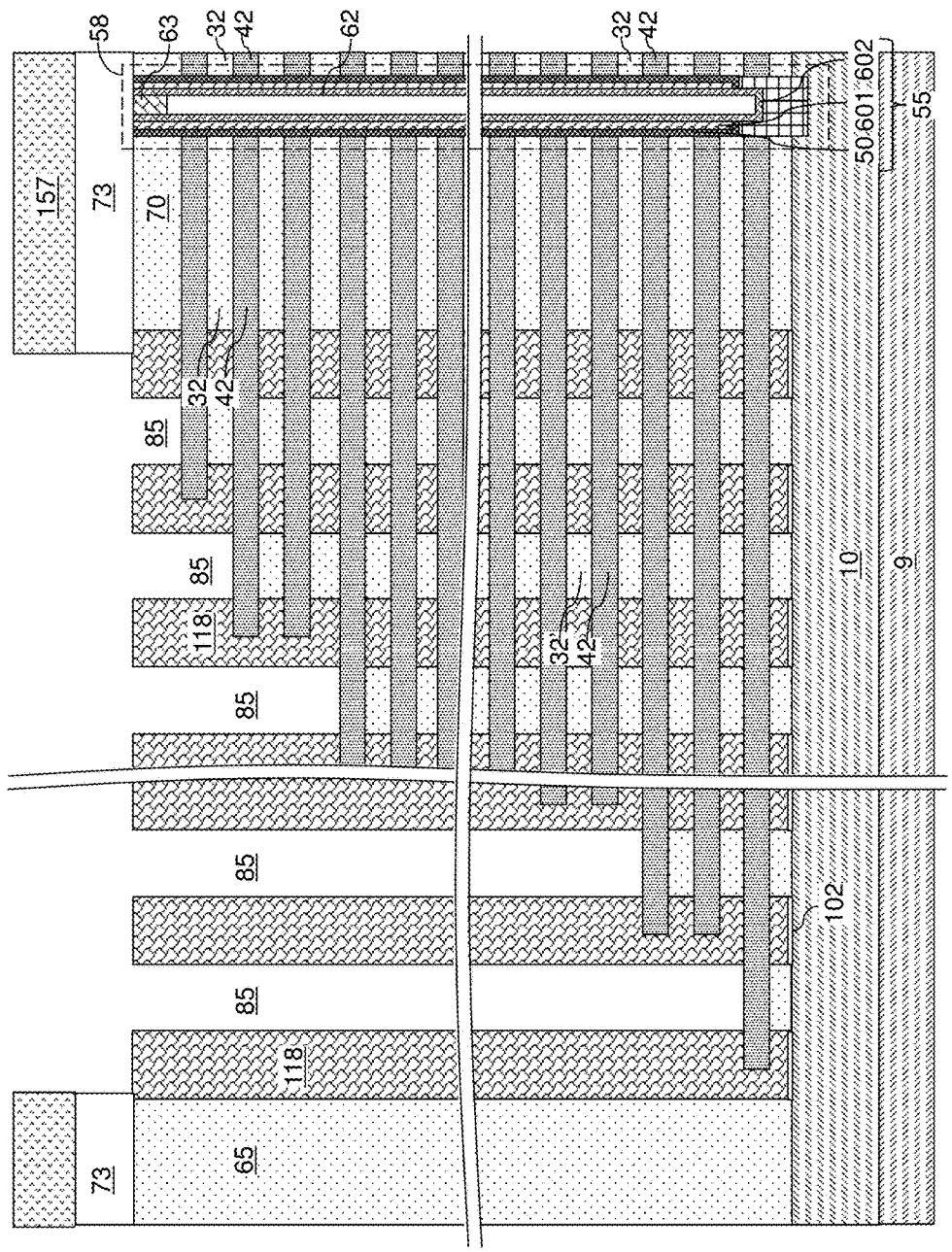
FIG. 14B is a second schematic vertical cross-sectional view of the exemplary structure of FIG. 14A.
Figure 14C:
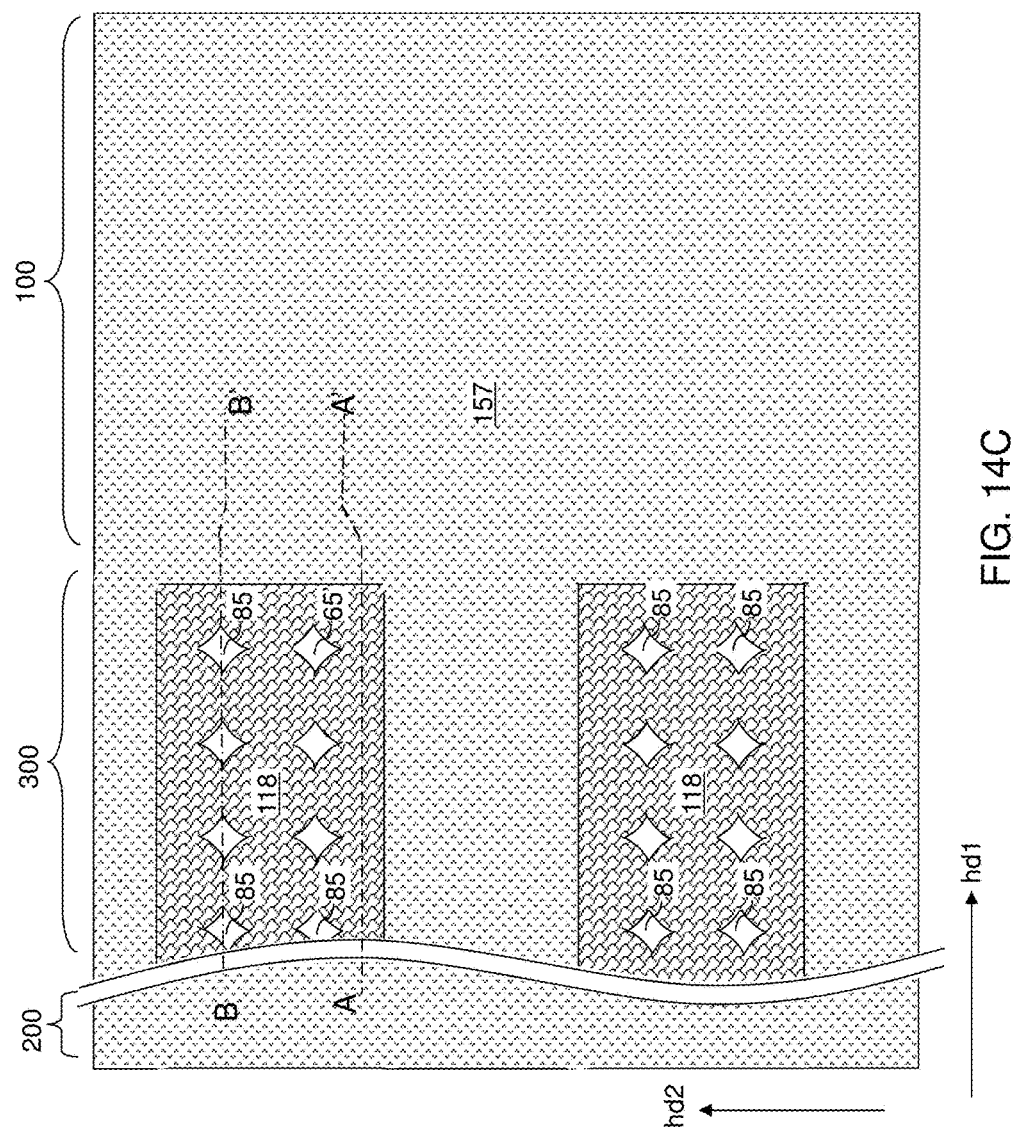
FIG. 14C is a top-down view of the exemplary structure of FIGS. 14A and 14B. The vertical plane A-A' is the plane of the view of FIG. 14A, and the vertical plane B-B' is the plane of the view of FIG. 14B.

Referring to FIGS. 14A-14C, an anisotropic etch process that etches the dielectric material of the dielectric pillar structures 65' selective to the sacrificial material of the continuous fill material portions 118 and selective to the material of the sacrificial material layers 42 can be performed. The anisotropic etch process can be a reactive ion etch process. In one embodiment, the sacrificial material of the continuous fill material portions 118 can include a semiconductor material (such as amorphous silicon or polysilicon), the material of the sacrificial material layers 42 can include silicon nitride, the dielectric pillar structures 65' can include silicon oxide, and the anisotropic etch process can employ an etch chemistry that etches silicon oxide selective to the semiconductor material and selective to silicon nitride. At least one hydrofluorocarbon etchant and/or hydrofluorocarbon etchant may be employed for the anisotropic etch process. Generally, the dielectric pillar structures 65' can be etched selective to the continuous fill material portions 118 and the sacrificial material layers 42 until complete removal, while an etch mask layer such as the first contact level dielectric layer 73 is present over the continuous fill material portions 118. Vertical via cavities 85 are formed in volumes from which the dielectric pillar structures 65' are etched. The anisotropic etch stops on each exposed sacrificial material layer 42 step (i.e., on each horizontal surface of the respective sacrificial material layer 42 exposed in the respective vertical via cavity 85). The photoresist layer 157 can be subsequently removed, for example, by ashing.

Figure 15:
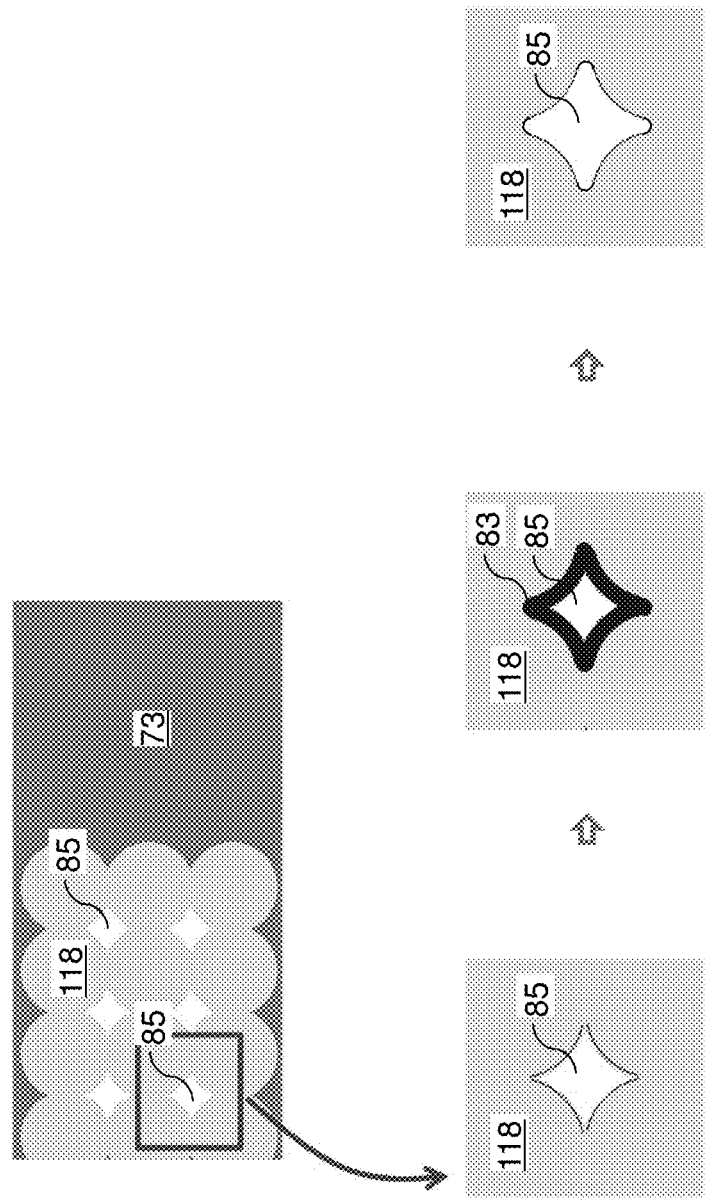
FIG. 15 illustrates an optional processing sequence that may be employed to expand the vertical via cavities.
Figure 16A:
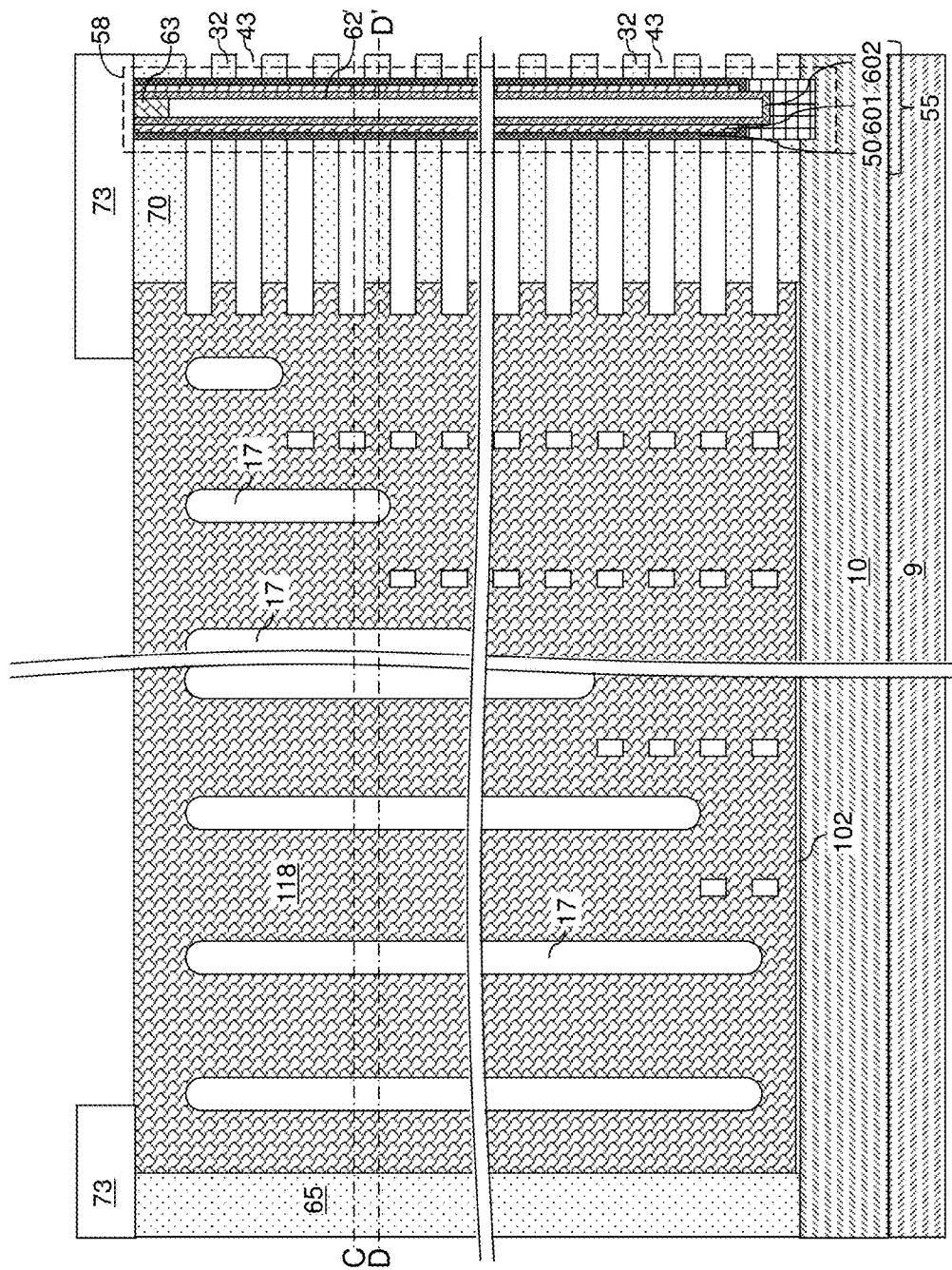
FIG. 16A is a first schematic vertical cross-sectional view of the exemplary structure after isotropically etching the sacrificial material layers selective to the insulating layers and the continuous fill material portion to form lateral recesses according to an embodiment of the present disclosure.
Figure 16B:
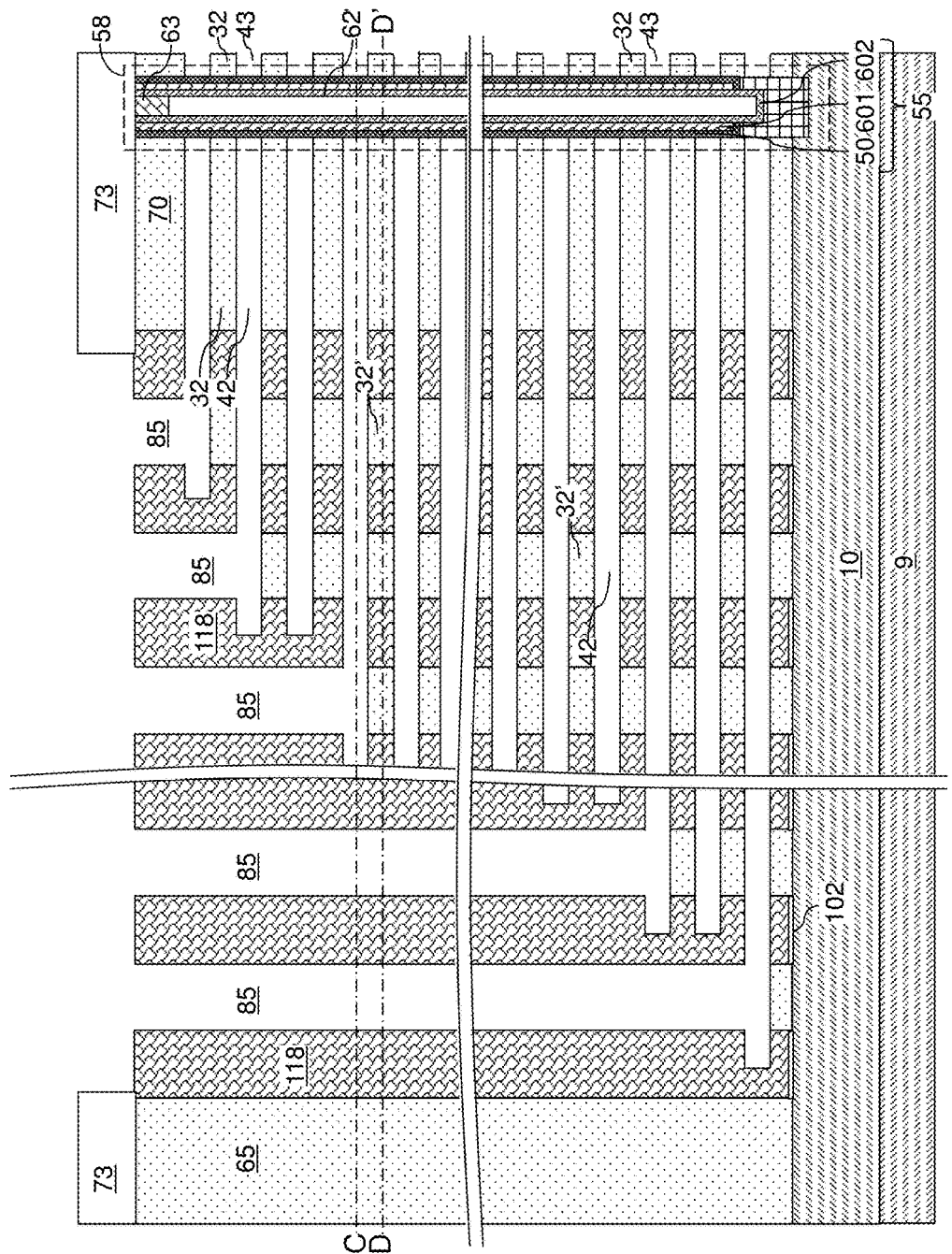
FIG. 16B is a second schematic vertical cross-sectional view of the exemplary structure of FIG. 16A.
Figure 16C:
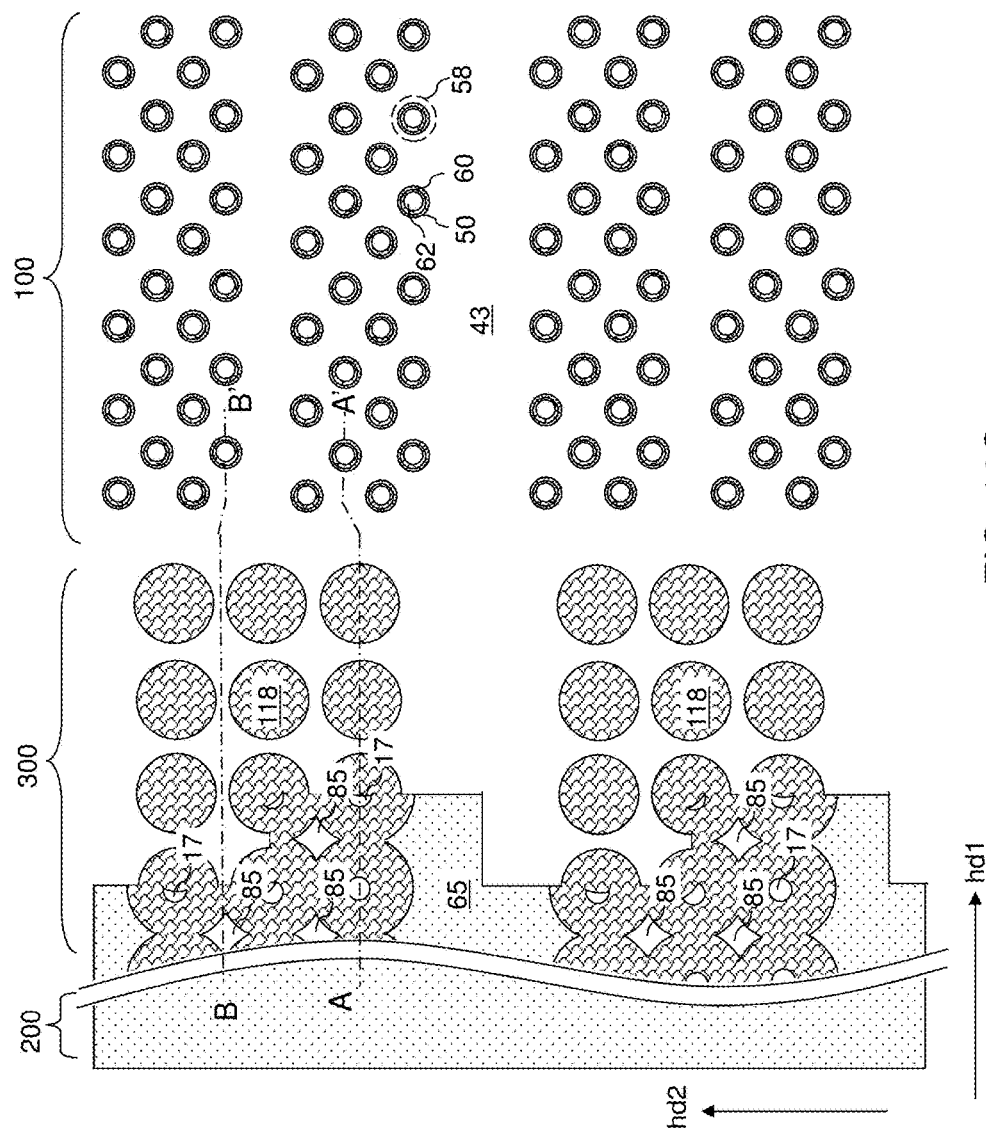
FIG. 16C is a first horizontal cross-sectional view of the exemplary structure along the horizontal plane C-C' of FIGS. 16A and 16B. The vertical plane A-A' is the plane of the view of FIG. 16A, and the vertical plane B-B' is the plane of the view of FIG. 16B.
Figure 16D:
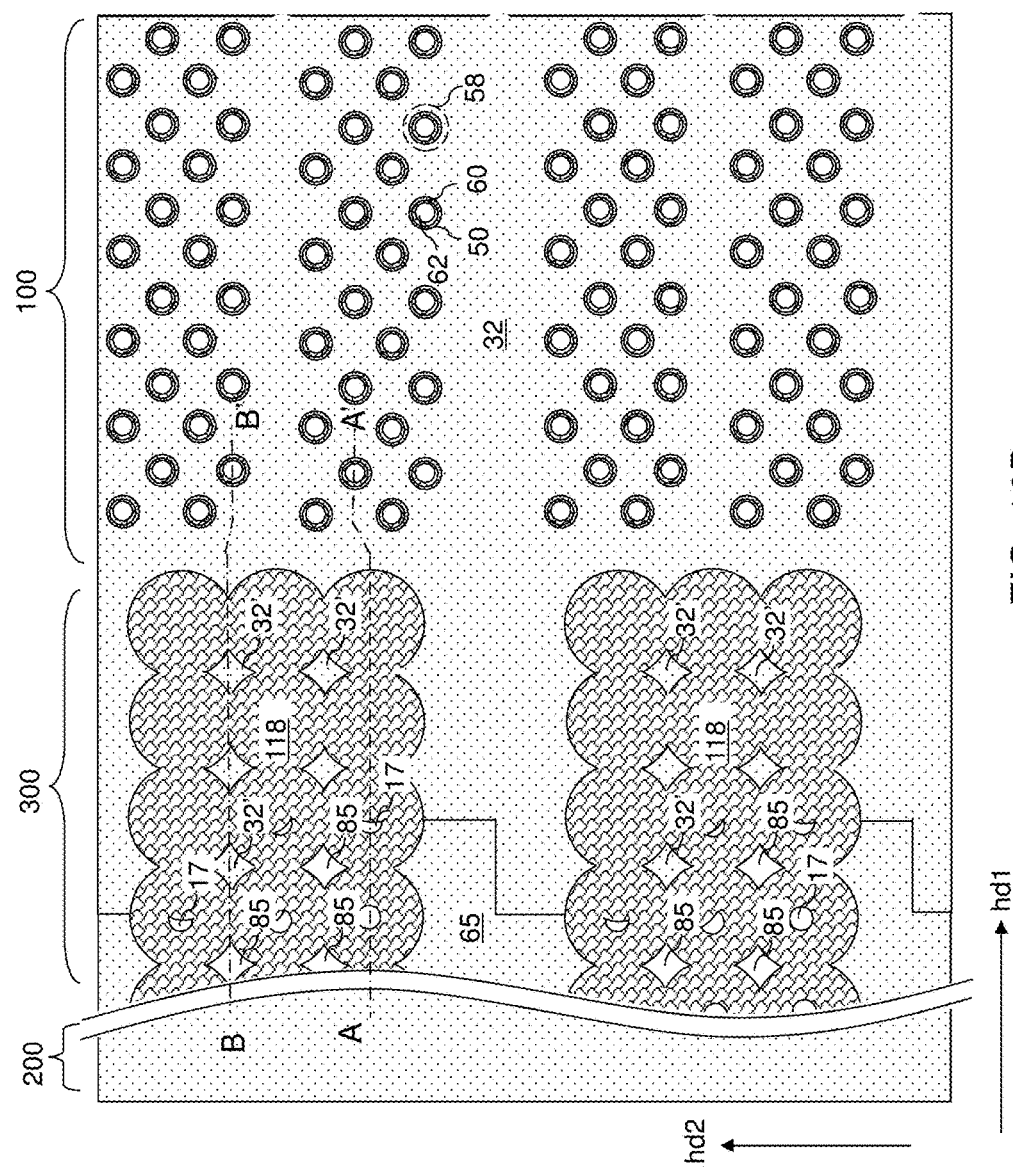
FIG. 16D is a first horizontal cross-sectional view of the exemplary structure along the horizontal plane D-D' of FIGS. 16A and 16B. The vertical plane A-A' is the plane of the view of FIG. 16A, and the vertical plane B-B' is the plane of the view of FIG. 16B.

FIG. 15 illustrates an optional processing sequence that may be employed to expand the vertical via cavities 85. If the continuous fill material portions 118 include a semiconductor material such as silicon or a silicon-containing semiconductor alloy material, an oxidation process can be performed to convert surface regions of the continuous fill material portions 118 around each vertical via cavity 85 into a semiconductor oxide material portion 83 such as a silicon oxide portion. An isotropic etch can be employed to remove the semiconductor oxide material portions 83 selective to the unoxidized portions of the continuous fill material portions 118. For example, if the semiconductor oxide material portions 83 include silicon oxide, a wet etch employing hydrofluoric acid can be employed to remove the semiconductor oxide material portions 83. The volume of each vertical via cavity 85 can be expanded.

Each vertical via cavity 85 includes a set of four vertically-extending concave surfaces. The curvature of the four vertically-extending concave surfaces can be the same at each vertical distance from the top surface of the substrate (9, 10). The radius of curvature of the four vertically-extending concave surfaces can be greater than the radius of curvature of the cylindrical openings 19 as formed at the processing steps of FIGS. 4A-4C. If the optional processing steps of FIG. 15 are employed, the four vertically-extending concave surfaces of a vertical via cavity 85 may be adjoined among another by a set of four vertically-extending convex surfaces having a smaller radius of curvature than the four vertically-extending concave surfaces.

Referring to FIGS. 16A-16D, an isotropic etchant that selectively etches the sacrificial material layers 42 selective to the insulating layers 32 and the continuous fill material portions 118 can be introduced into the vertical via cavities 85, for example, employing an etch process. Lateral recesses 43 are formed in volumes from which the sacrificial material layers 42 are removed. The removal of the material of the sacrificial material layers 42 can be selective to the material of the insulating layers 32, the material of the retro-stepped dielectric material portion 65, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the vertical via cavities 85. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front side openings or front side cavities in contrast with the lateral recesses 43. In one embodiment, the memory array region 100 comprises an array of monolithic three-dimensional NAND strings having a plurality of device levels disposed above the substrate (9, 10). In this case, each lateral recess 43 can define a space for receiving a respective word line of the array of monolithic three-dimensional NAND strings.

Each of the plurality of lateral recesses 43 can extend substantially parallel to the top surface of the substrate (9, 10). A lateral recess 43 can be vertically bounded by a top surface of an underlying insulating layer 32 and a bottom surface of an overlying insulating layer 32. In one embodiment, each lateral recess 43 can have a uniform height throughout.

Figure 17A:
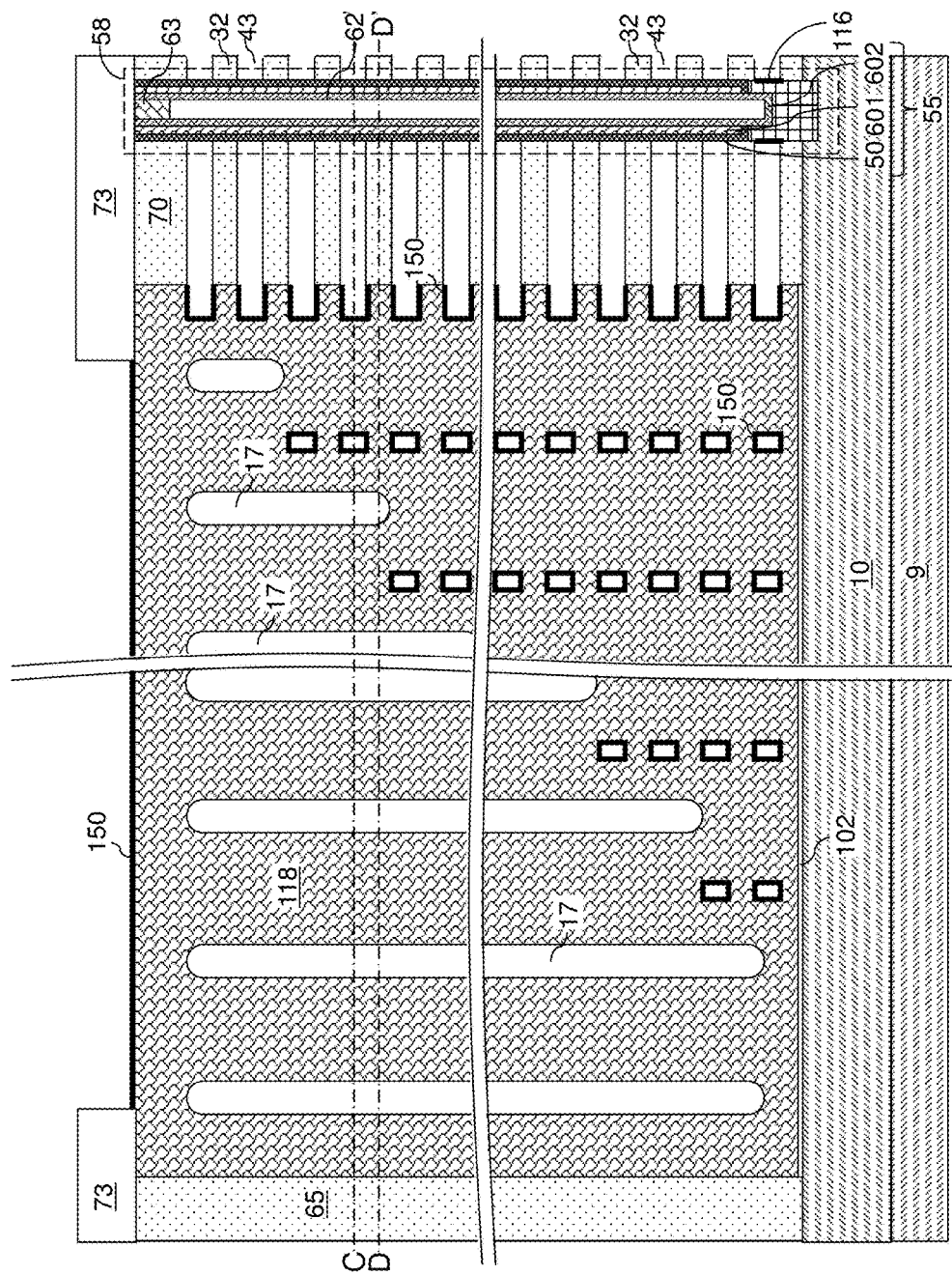
FIG. 17A is a first schematic vertical cross-sectional view of the exemplary structure after formation of a semiconductor oxide layer by oxidation of surface portions of the continuous fill material portion according to an embodiment of the present disclosure.
Figure 17B:
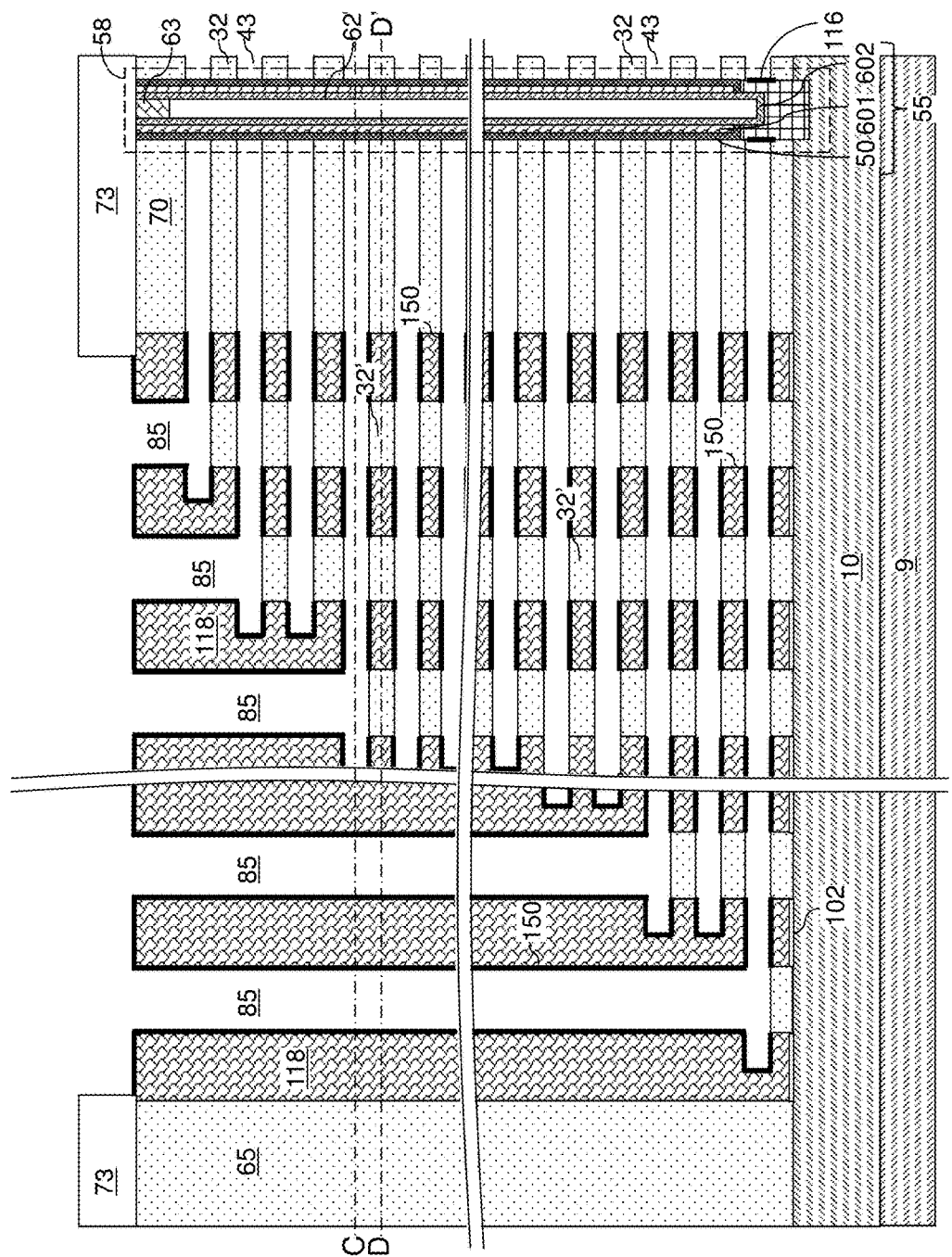
FIG. 17B is a second schematic vertical cross-sectional view of the exemplary structure of FIG. 17A.
Figure 18A:
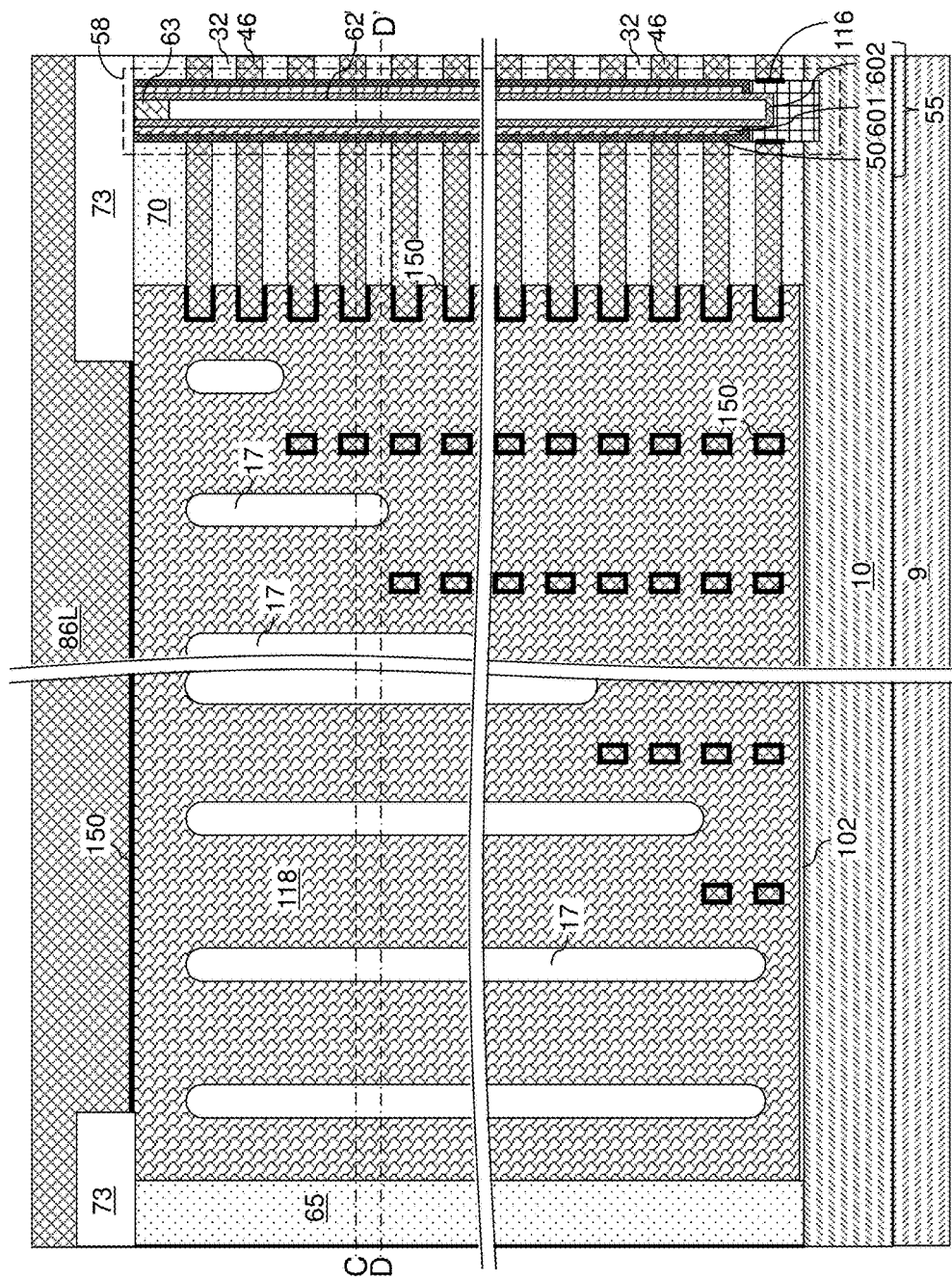
FIG. 18A is a first schematic vertical cross-sectional view of the exemplary structure after depositing at least one conductive material simultaneously in the lateral recesses and in the vertical via cavities according to an embodiment of the present disclosure.
Figure 18B:
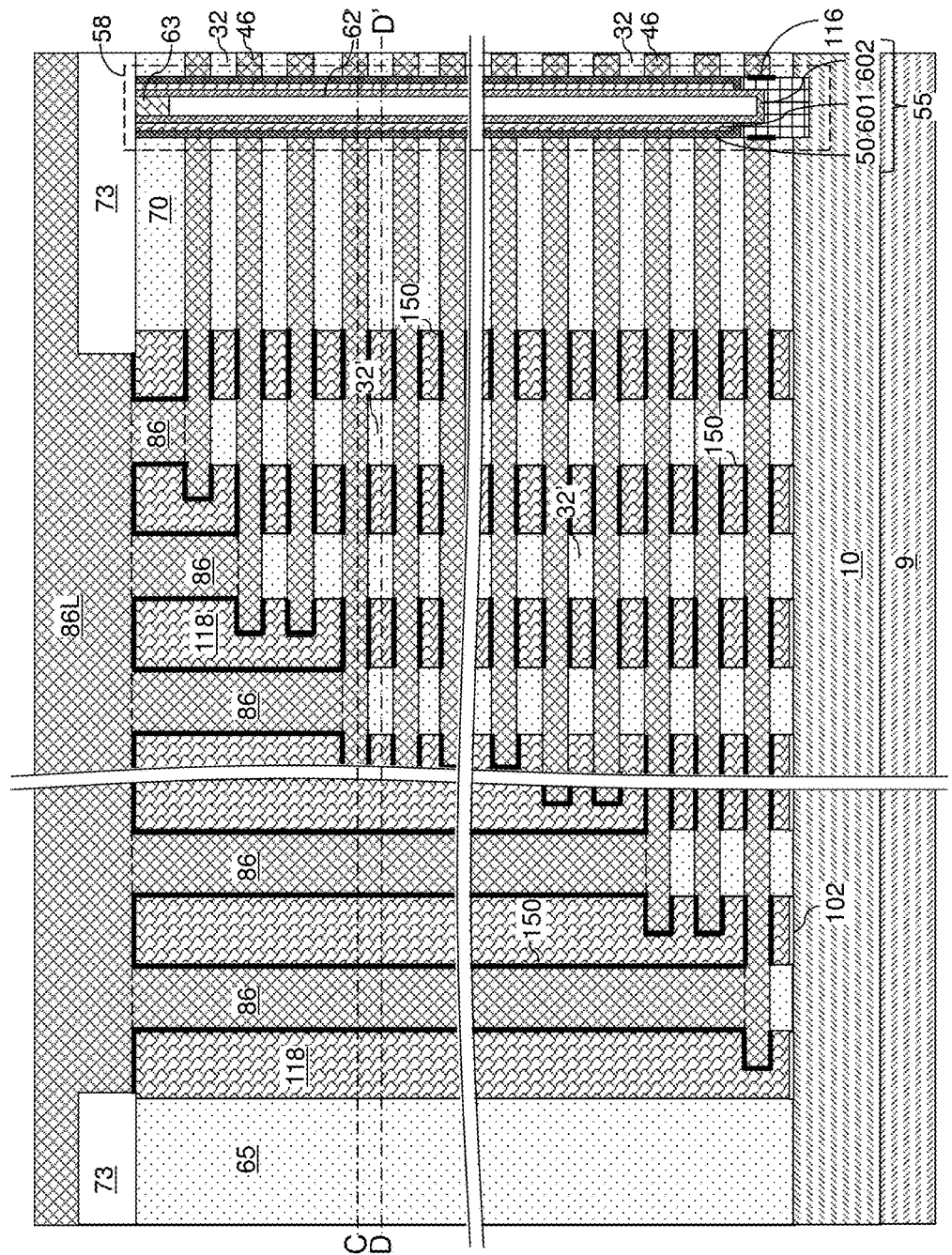
FIG. 18B is a second schematic vertical cross-sectional view of the exemplary structure of FIG. 18A.
Figure 18C:
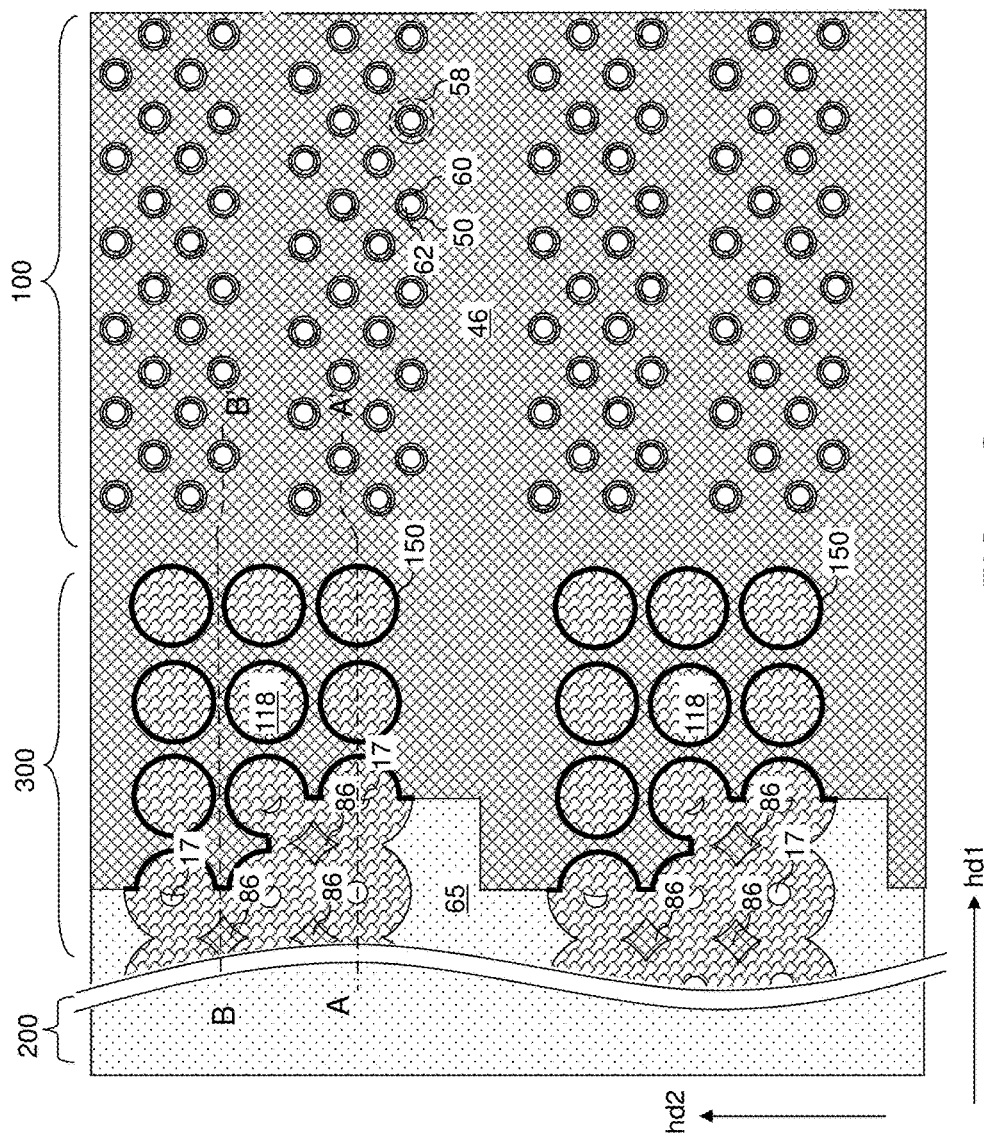
FIG. 18C is a first horizontal cross-sectional view of the exemplary structure along the horizontal plane C-C' of FIGS. 18A and 18B. The vertical plane A-A' is the plane of the view of FIG. 18A, and the vertical plane B-B' is the plane of the view of FIG. 18B.
Figure 18D:
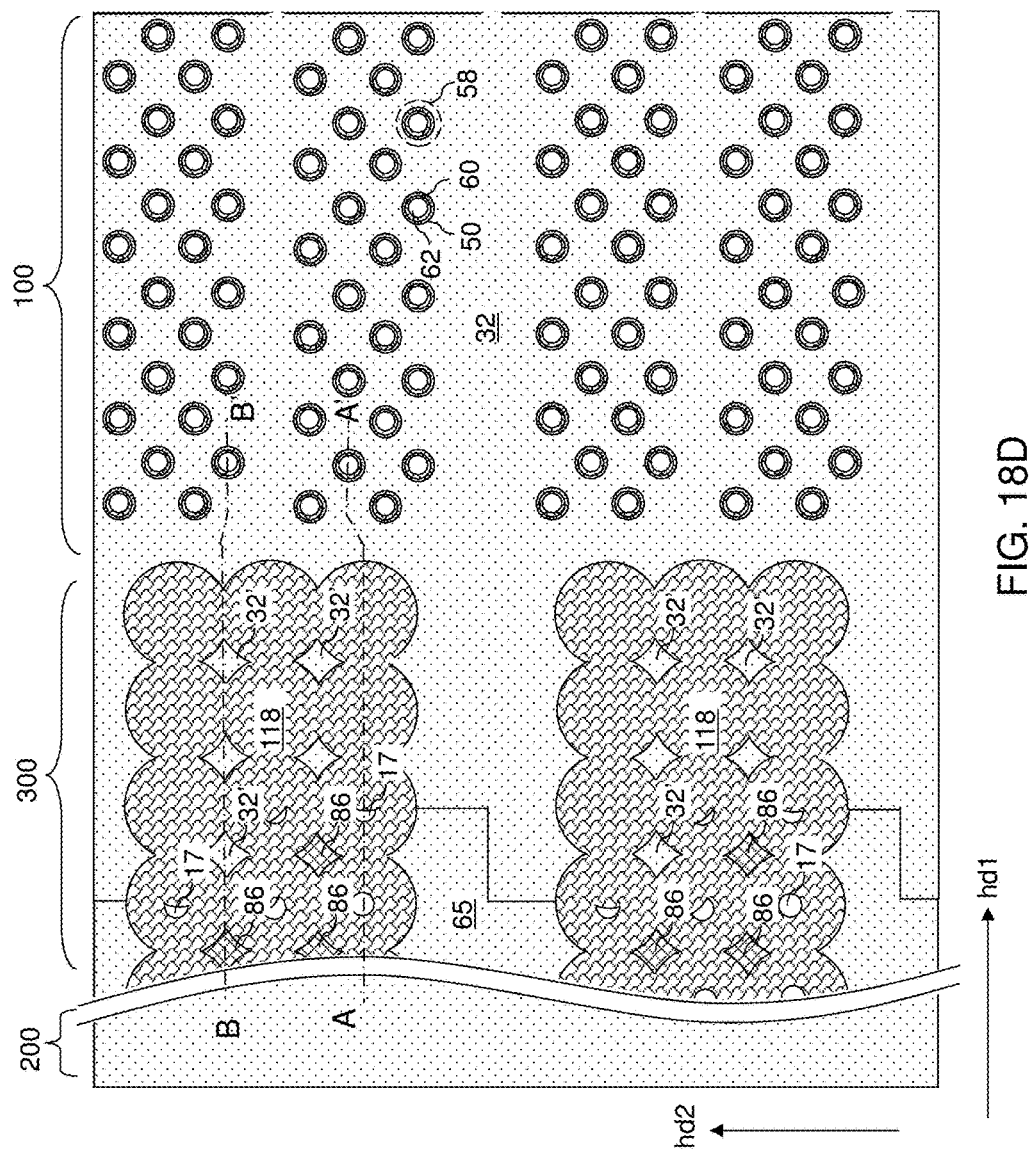
FIG. 18D is a first horizontal cross-sectional view of the exemplary structure along the horizontal plane D-D' of FIGS. 18A and 18B. The vertical plane A-A' is the plane of the view of FIG. 18A, and the vertical plane B-B' is the plane of the view of FIG. 18B.

Referring to FIGS. 17A and 17B, physically exposed surface portions of the optional pedestal channel portions 11 and the continuous fill material portions 118 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert surface portions of the continuous fill material portions 118 into semiconductor oxide layers 150 (e.g., silicon oxide layers). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11.

In one embodiment, the semiconductor oxide layers 150 can include a dielectric oxide of the semiconductor material of the continuous fill material portions 118. In one embodiment, the continuous fill material portions 118 can include amorphous silicon or polysilicon, and the semiconductor oxide layers 150 can include silicon oxide. Top ends of the vertically-extending portions of the semiconductor oxide layers 150 that line vertical surfaces of a continuous fill material portion 118 can be adjoined to an overlying horizontal portion of the semiconductor oxide layer 150. Each bottom end the vertically-extending portions of the semiconductor oxide layers 150 that line vertical surfaces of a continuous fill material portion 118 can be adjoined to a respective underlying horizontal portion of the semiconductor oxide layer 150 that contacts a horizontal bottom surface of the continuous fill material portion. Each portion of a semiconductor oxide layer 150 that encloses an end portion of a lateral recess 43 can be adjoined to a vertically neighboring pair of insulating layers 32. The thickness of each semiconductor oxide layer 150 can be in a range from 2 nm to 20 nm, such as from 3 nm to 15 nm, although lesser and greater thicknesses can also be employed.

Referring to FIGS. 18A-18D, at least one conductive material can be simultaneously deposited in the lateral recesses 43 and in the vertical via cavities 85 by at least one conformal deposition process. Conductive material portions are formed on physically exposed surfaces of the insulating layers 32 and surfaces of the semiconductor oxide layers 150.

In an illustrative example, a combination of a metallic barrier layer and a metal fill material can be deposited by a series of conformal deposition processes in the lateral recesses 43 and in the vertical via cavities 85. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be subsequently deposited on the metallic barrier layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough. Since metallic fill material layer is formed in the lateral recesses 43 and in the vertical via cavities 85 at the same time during the same deposition step, a boundary between the portions of the metallic fill material layer located in the lateral recesses 43 and the vertical via cavities 85 may be absent, such that the metallic fill material layer is continuous between lateral recesses 43 and the vertical via cavities 85.

Electrically conductive layers 46 are formed in the lateral recess 43. Each electrically conductive layer 46 includes a portion of the deposited conductive material(s) that fill(s) a respective lateral recess 43. Contact via structures 86, which are also referred to as word line contact via structures, are formed in the vertical via cavities 85. Each contact via structure 86 includes a portion of the deposited conductive material(s) that fill(s) a respective vertical via cavity 85. A continuous conductive material layer 86L is formed over the first contact level dielectric layer 73 and over the continuous fill material portions 118.

Each contact via structure 86 is formed integrally with a respective conductive material layer 46, i.e., formed as a single continuous structure. As such each component material, such as the material of the metallic barrier layer and the metallic fill material, continuous extends across the contact via structure 86 and the respective conductive material layer 46. In other words, a physical interface (e.g., physical boundary) does not exist between each contact via structure 86 and the respective electrically conductive layer 46 adjoined to the contact via structure 86 because each component metallic material for the contact via structures 86 and the electrically conductive layer 46 is deposited simultaneously. Each continuous set of at least one contact via structure 86 (which can be multiple contact via structures 86 located in different continuous fill material portions 118) and an electrically conductive layer 46 is herein referred to as an integrated word line and contact structure (46, 86). The electrically conductive layers 46 and the contact via structures 86 can include a same set of material compositions, i.e., the composition of the metallic liner layer and the composition of the metallic fill material. The metallic liner layer may have the same thickness in the electrically conductive layers 46 and in the contact via structures 86.

Figure 19A:
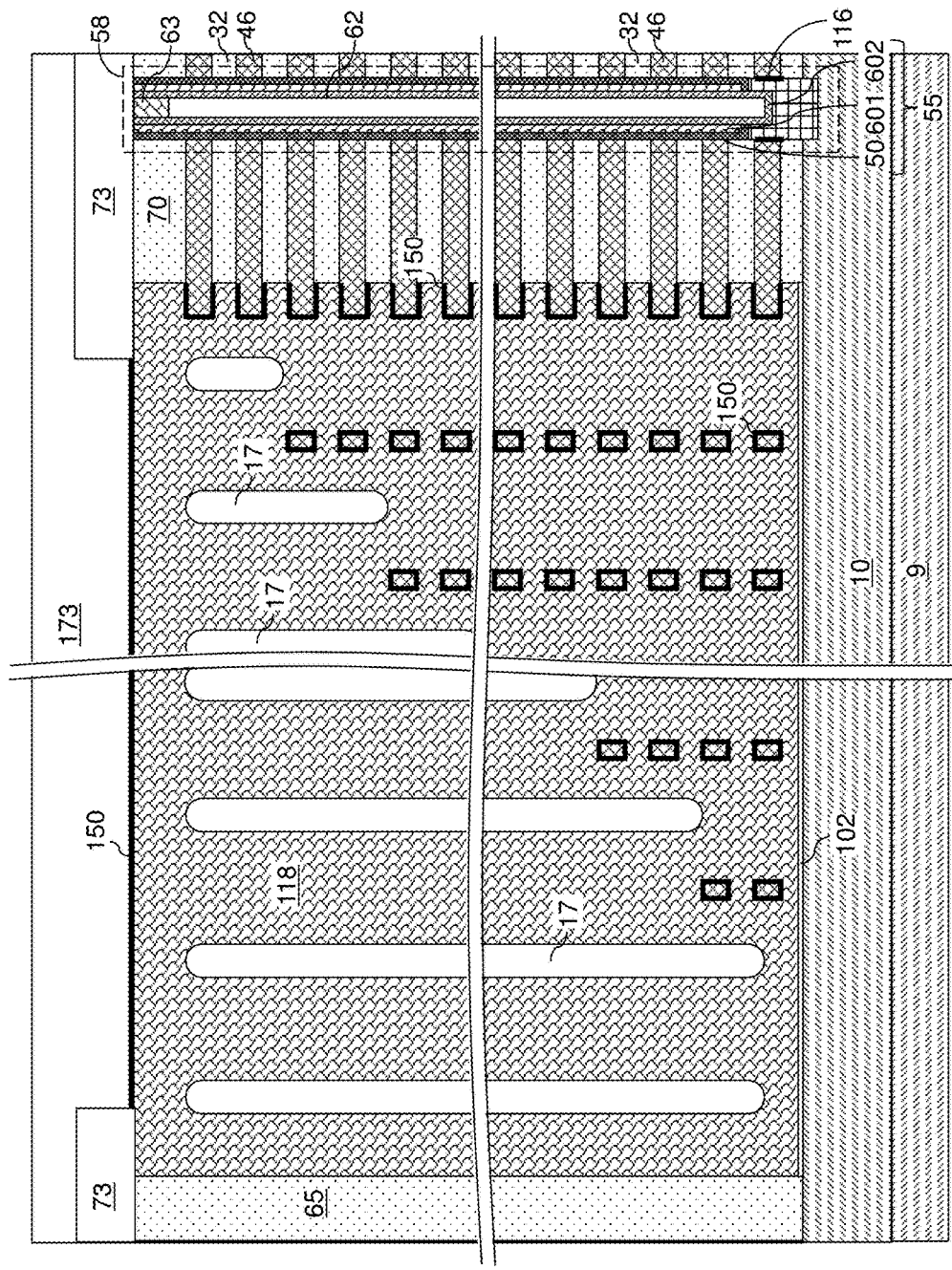
FIG. 19A is a first schematic vertical cross-sectional view of the exemplary structure after removing the at least one conductive material from above a horizontal plane including a top surface of the continuous fill material portion and formation of a second contact level dielectric layer according to an embodiment of the present disclosure.
Figure 19B:
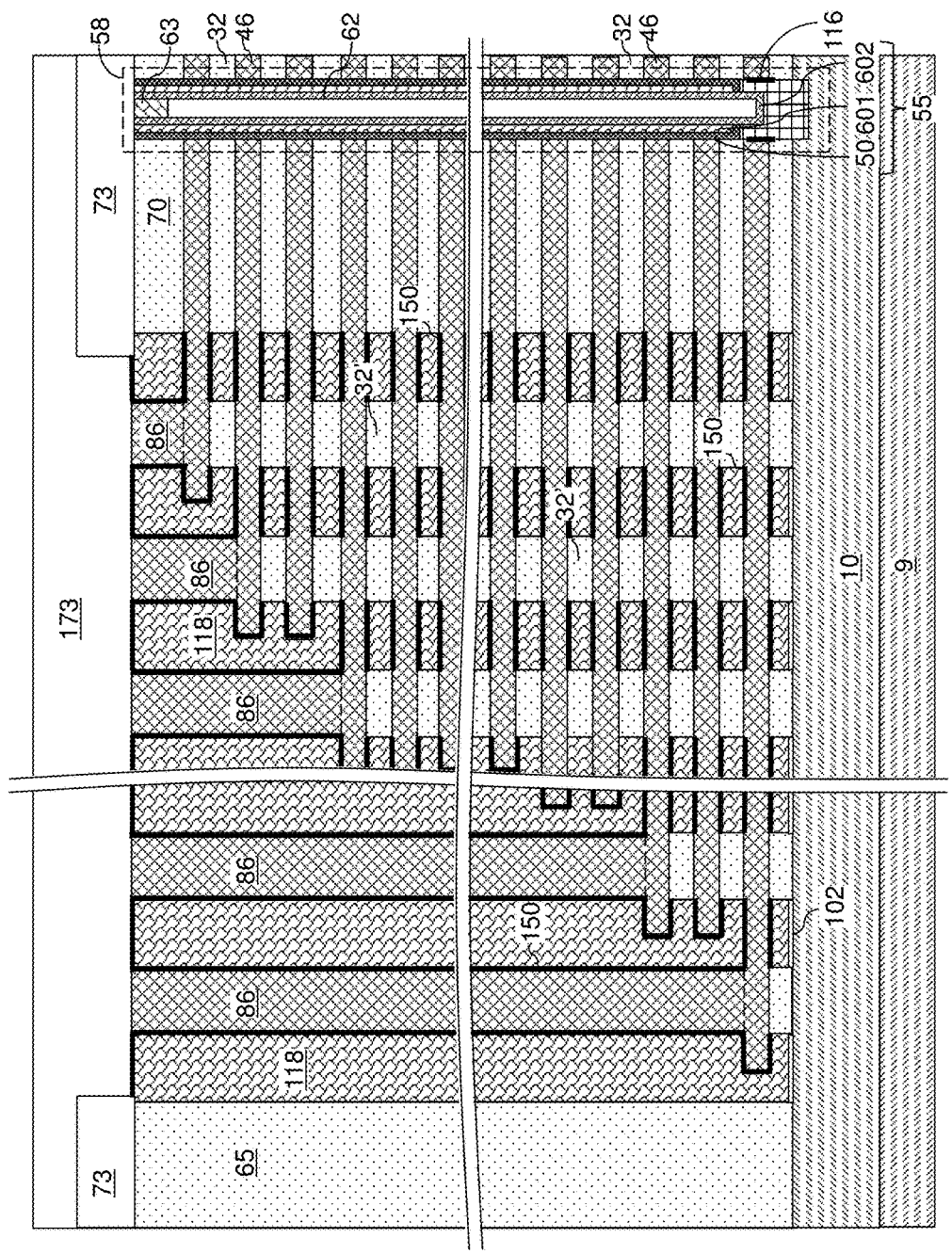
FIG. 19B is a second schematic vertical cross-sectional view of the exemplary structure of FIG. 19A.

Referring to FIGS. 19A and 19B, the continuous conductive material layer 86L is removed from above the first contact level dielectric layer 73 and the continuous fill material portions 118 by a recess etch process, which may be an isotropic etch process or an anisotropic etch process. For example, a timed wet etch process that selectively removes the metallic material(s) of the continuous conductive material layer 86L can be performed to remove the continuous conductive material layer 86L without removing the contact via structures 86.

Thus, the combinations of the sacrificial material layers 42 and the dielectric pillar structures 65' are replaced with conductive material portions (46, 86). The conductive material portions (46, 86) comprise combinations of an electrically conductive layer 46 that replaces a respective sacrificial material layer 42 and a contact via structure 86 that replaces a respective dielectric pillar structure 65'. Consequently, each electrically conductive layer 46 can have the same shape as the sacrificial material layer 42 replaced by the electrically conductive layer 46, and each contact via structure 86 includes the volume of the dielectric pillar structure 65' replaced by the contact via structure 86. In one embodiment, each contact via structure 86 may have the same volume, and the same shape, as the dielectric pillar structure 65' replaced by the contact via structure 86. For example, the contact via structure can have a shape of a four pointed star with concave sidewalls between the points when viewed from the top (e.g., as shown in FIG. 22C). In another embodiment, each contact via structure 86 may have more volume, and a bigger shape, than the dielectric pillar structure 65' replaced by the contact via structure 86 because of expansion of a respective vertical via cavity 85, for example, by processing steps of FIG. 15.

A second contact level dielectric layer 173 can be formed over the first contact level dielectric layer 73 and the continuous fill material portions 118. The second contact level dielectric layer 173 can include any dielectric material that can be employed for the first contact level dielectric layer 73. Optionally, the second contact level dielectric layer 173 may be planarized to provide a planar surface. The thickness of the second contact level dielectric layer 173 in a region that overlies a continuous fill material portion 118 can be in a range from 100 nm to 600 nm, such as from 200 nm to 400 nm, although lesser and greater thicknesses can also be employed.

Figure 20A:
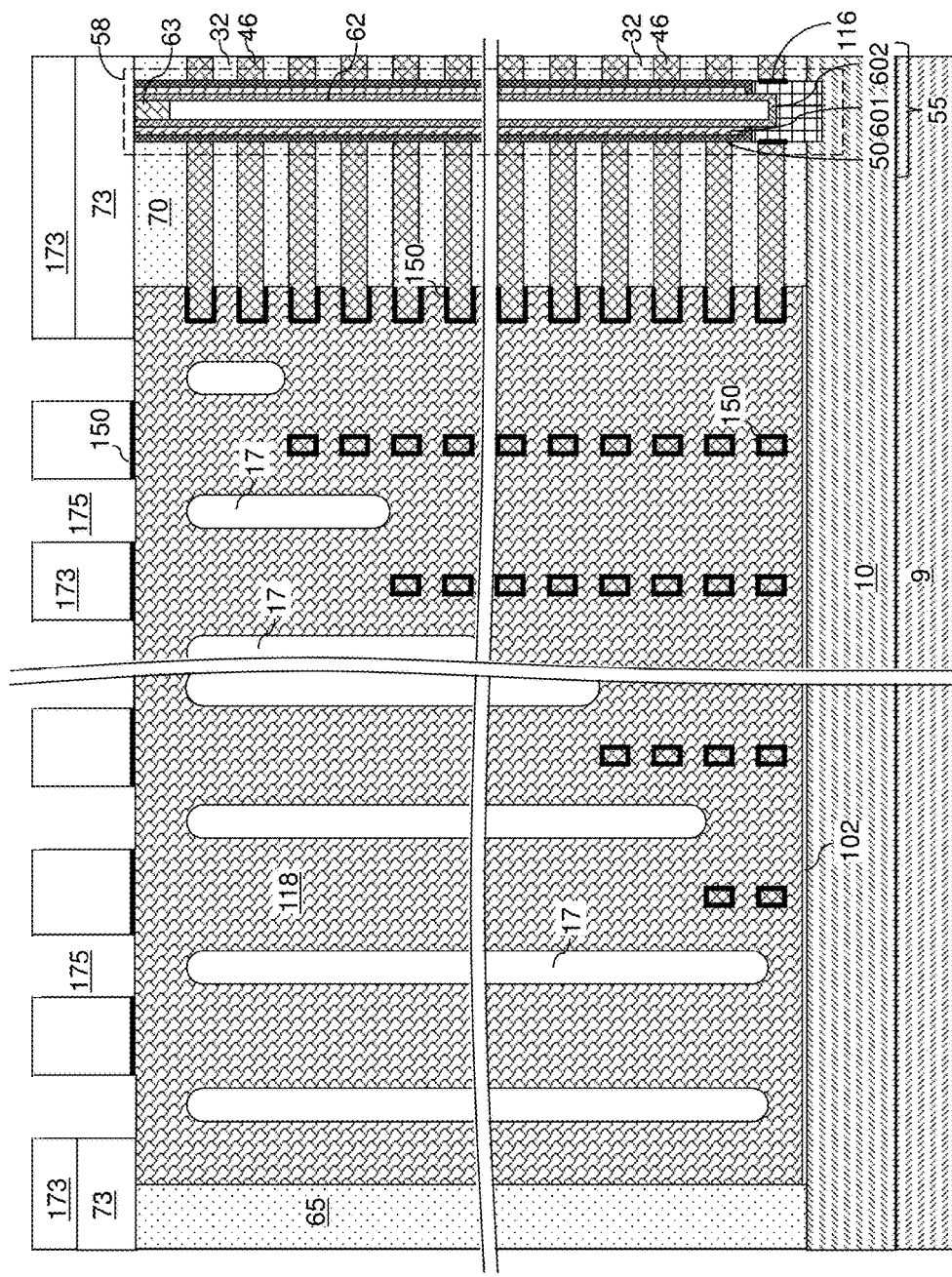
FIG. 20A is a first schematic vertical cross-sectional view of the exemplary structure after formation of etchant duct openings through the first and second contact level dielectric layers according to an embodiment of the present disclosure.
Figure 20B:
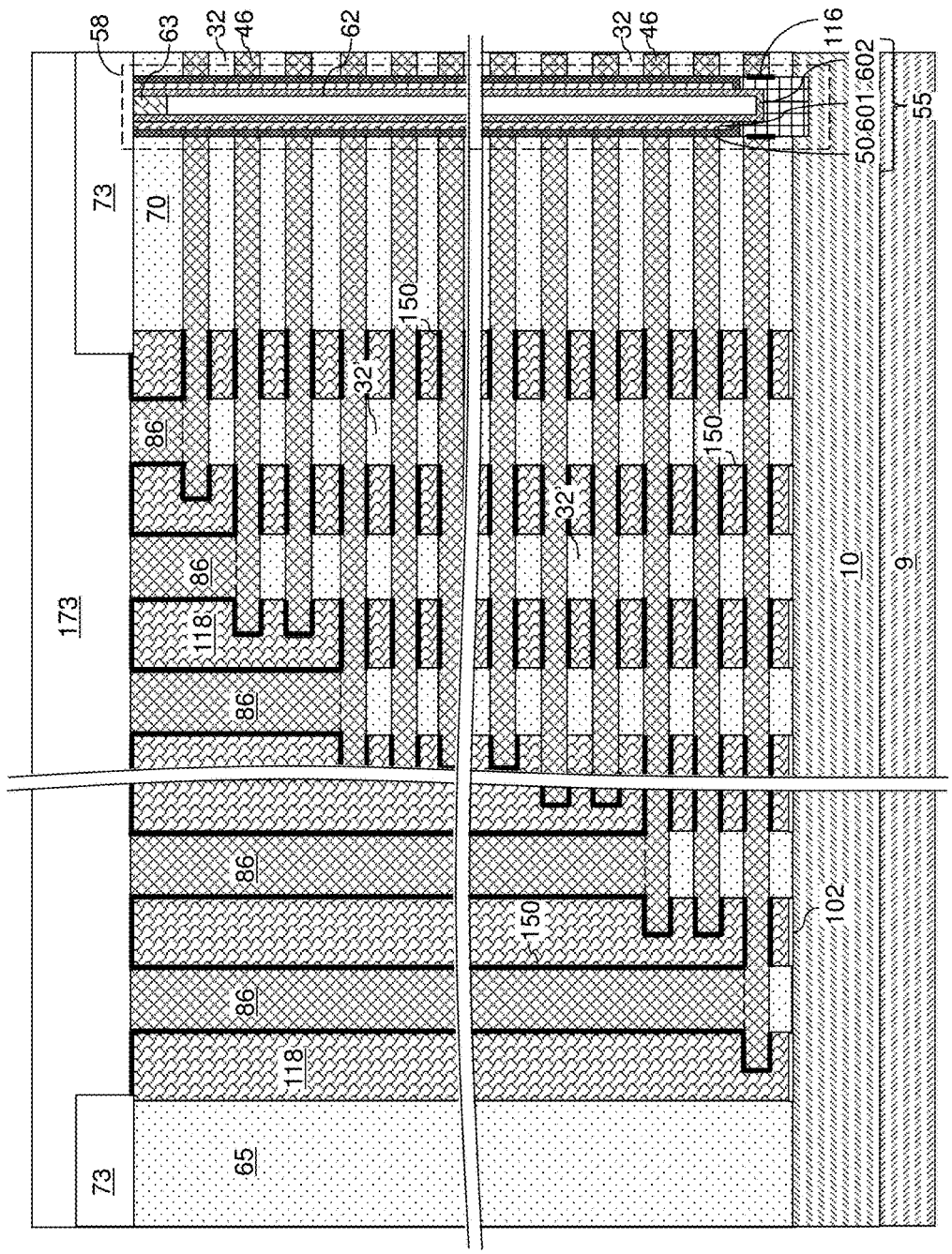
FIG. 20B is a second schematic vertical cross-sectional view of the exemplary structure of FIG. 20A.

Referring to FIGS. 20A-20C, etchant duct openings 175 are formed through the first and second contact level dielectric layers (73, 173). The etchant duct openings 175 are openings that are subsequently employed as a conduit, or a duct, for an etchant that removes the material of the continuous fill material portions 118. In an illustrative example, a photoresist layer (not shown) can be applied over the first and second contact level dielectric layers (71, 173), and can be lithographically patterned to form openings in areas that overlie the continuous fill material portions 118. The pattern of the openings in the photoresist layer can be transferred through the first and second contact level dielectric layers (73, 173) by an anisotropic etch process. The openings through the first and second contact level dielectric layers (73, 173) constitute the etchant duct openings 175. The photoresist layer can be subsequently removed, for example, by ashing. The etchant duct openings 175 may include arrays of discrete circular, elliptical, or polygonal openings, and/or include elongated openings such as line openings. In one embodiment, the width of each etchant duct opening 175 may be at, or near, lithographic minimum printable dimension (commonly referred to as a critical dimension (CD)) to make sealing of the openings easier.

Figure 21A:
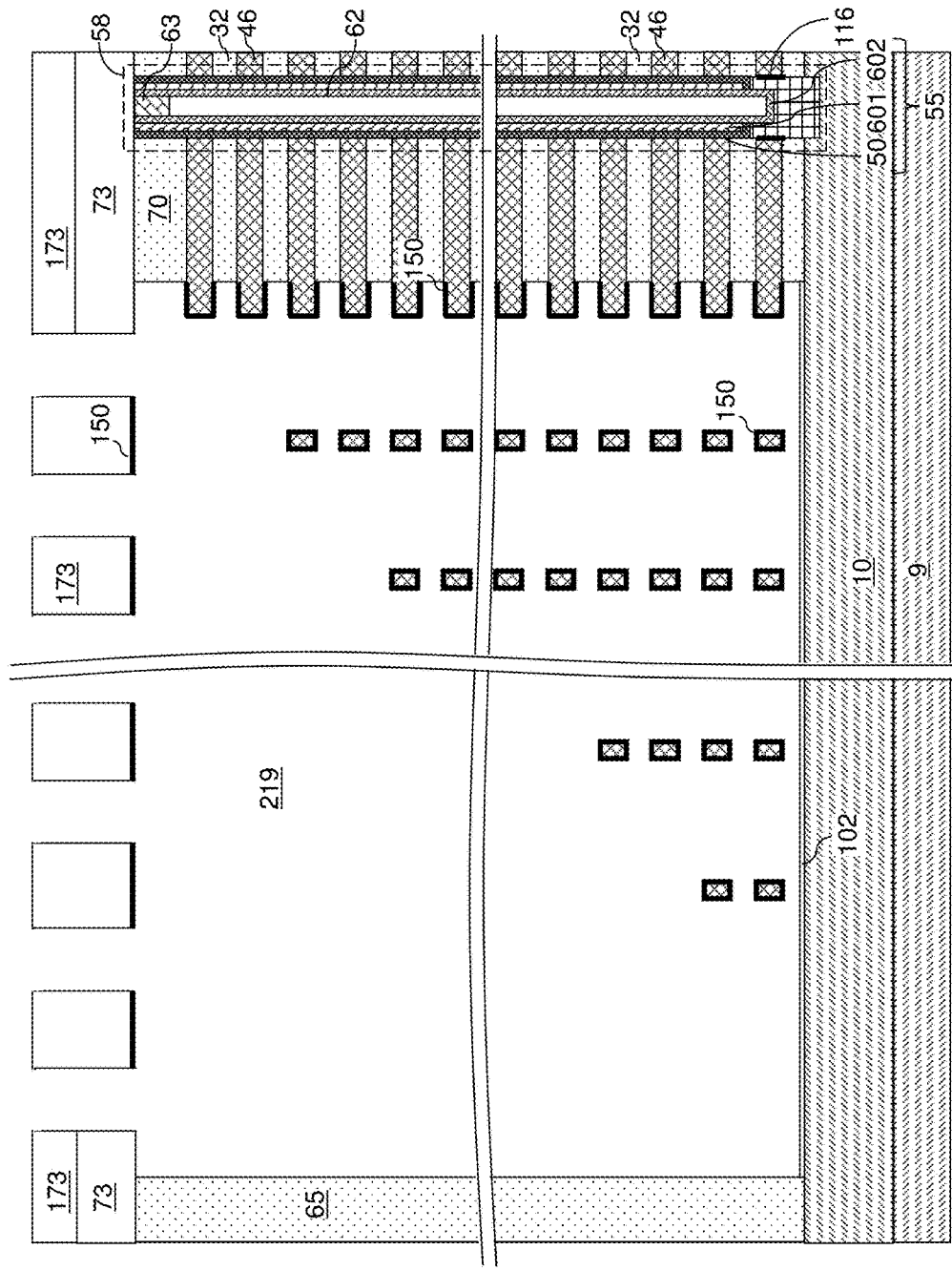
FIG. 21A is a first schematic vertical cross-sectional view of the exemplary structure after removing the continuous fill material portion selective to the insulating layers and the conductive material portions according to an embodiment of the present disclosure.
Figure 21B:
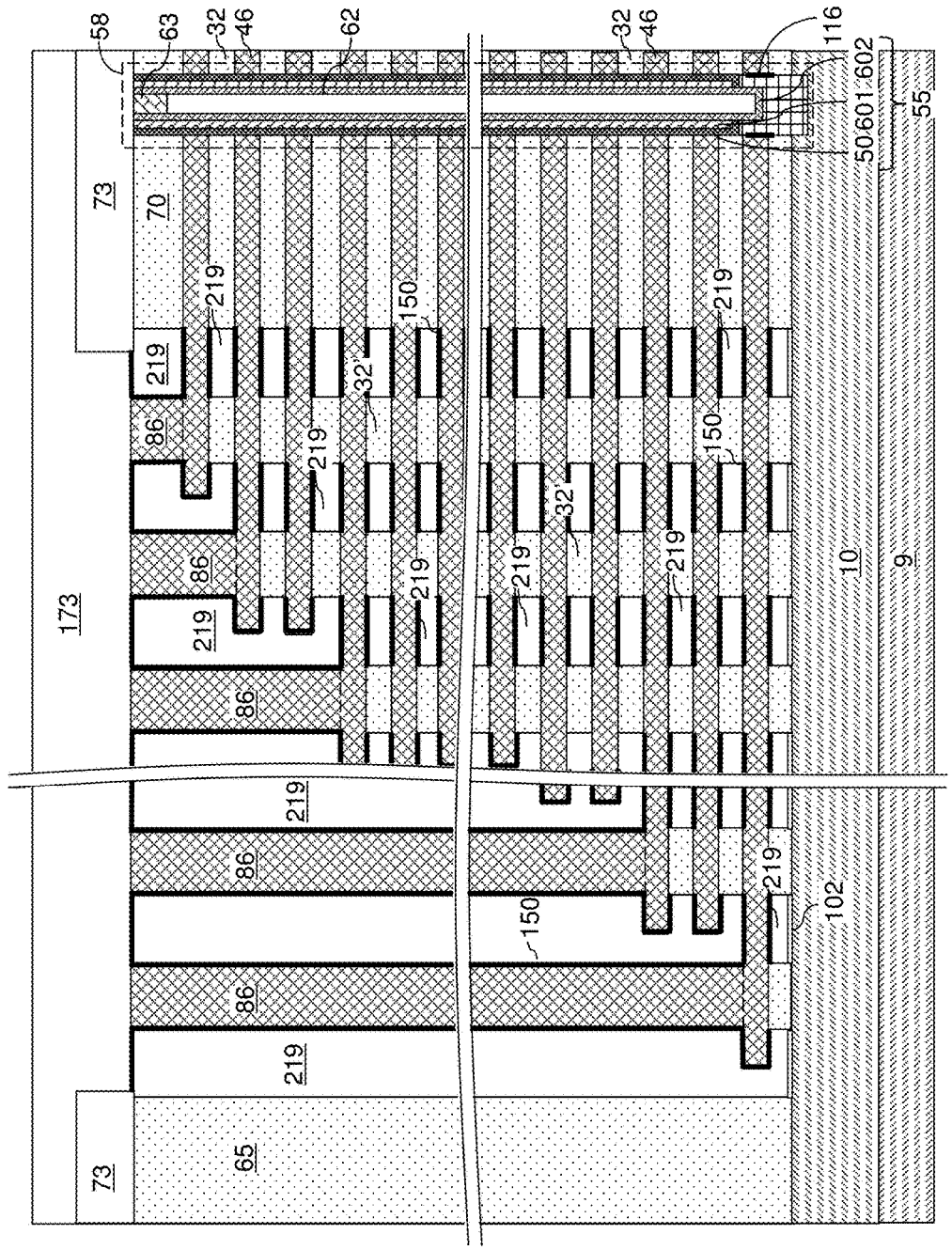
FIG. 21B is a second schematic vertical cross-sectional view of the exemplary structure of FIG. 20A.
Figure 21C:
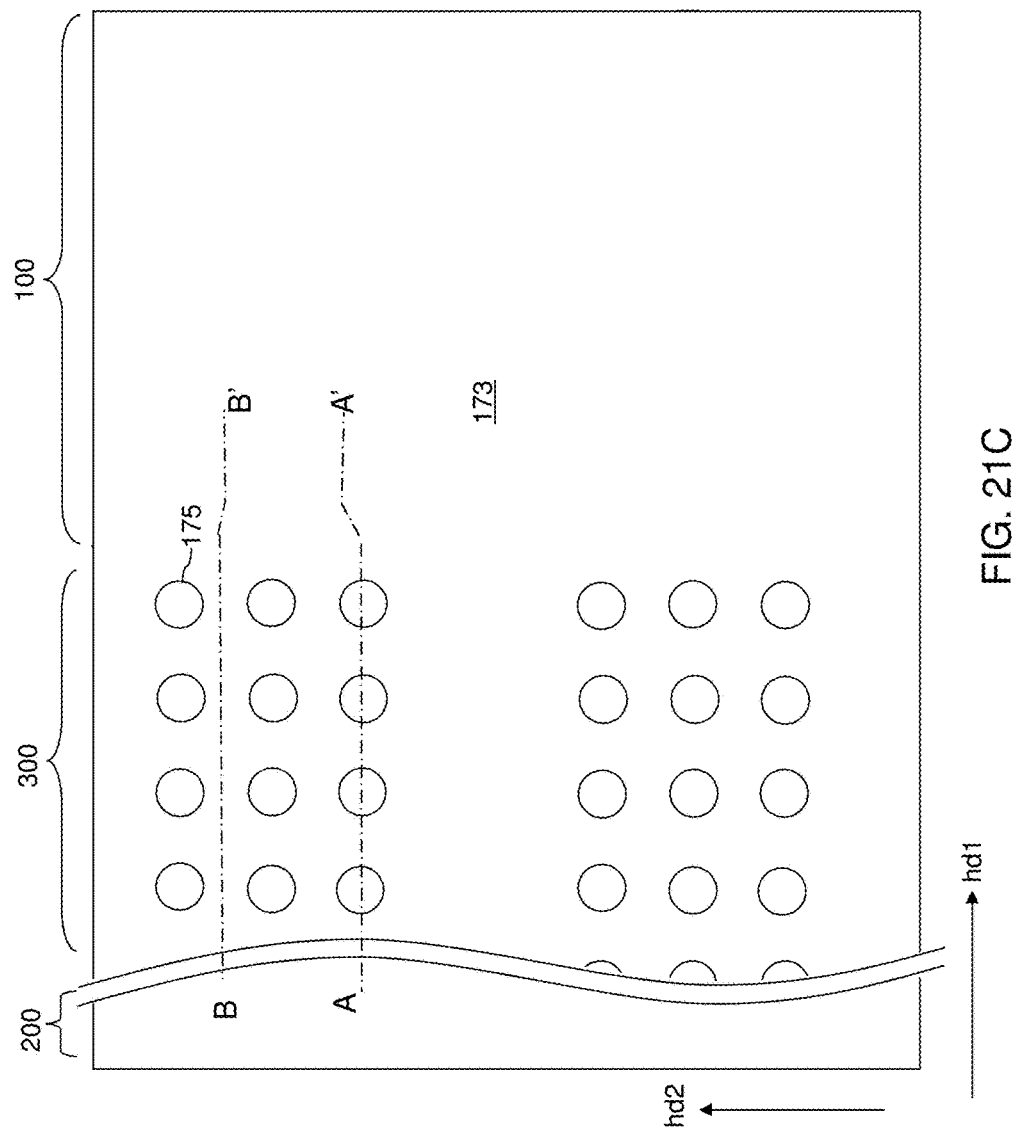
FIG. 21C is a top-down view of the exemplary structure of FIGS. 21A and 21B. The vertical plane A-A' is the plane of the view of FIG. 21A, and the vertical plane B-B' is the plane of the view of FIG. 21B.

Referring to FIGS. 21A-21C, an isotropic etch process is performed, in which an isotropic etchant is supplied through the etchant duct openings 175. The isotropic etch process etches the material of the continuous fill material portions 118 selective to materials of the insulating layers 32, the insulating pedestal portions 32', the semiconductor oxide liner 102 located on the semiconductor material layer 10, and the semiconductor oxide layers 150 located on surfaces of the electrically conductive layers 46. In an illustrative example, if the continuous fill material portions 118 include a semiconductor material such as amorphous silicon or polysilicon, a wet etch process employing a KOH solution or a trimethyl(2-hydroxyethyl)ammonium hydroxide (TMY) solution can be employed to remove the continuous fill material portions 118 selective to the insulating layers 32, the insulating pedestal portions 32', the semiconductor oxide liner 102, and the semiconductor oxide layers 150.

The entirety of each continuous fill material portion 118 can be removed to form a respective continuous cavity 219. In other words, the entire volume of each continuous fill material portion 118 becomes free of any solid material after removal of the continuous fill material portions 118. Each continuous cavity 219 laterally surrounds a respective set of insulating pedestal portions 32'.

Referring to FIGS. 22A-22F, a third contact level dielectric layer 273 can be deposited by an anisotropic deposition process. The etchant duct openings 175 can be plugged by the anisotropically deposited material of the third contact level dielectric layer 273. In one embodiment, the anisotropic deposition of the dielectric material can cause formation of a variable thickness portion on each sidewall of the etchant duct openings 175 such that the lateral thickness of the variable thickness portion increases with a vertical distance from the substrate (9, 10) until the sidewalls of the variable thickness portion merges and seals the underlying continuous cavity 219. The third contact level dielectric layer 273 can include a dielectric material such as undoped silicate glass, doped silicate glass, or organosilicate glass. The third contact level dielectric layer 273 can be deposited by plasma enhanced chemical vapor deposition (PECVD). The thickness of the third contact level dielectric layer 273, as measured above the top surface of the second contact level dielectric layer 173, can be in a range from 100 nm to 500 nm, such as from 150 nm to 400 nm, although lesser and greater thicknesses can also be employed.

Figure 22B:
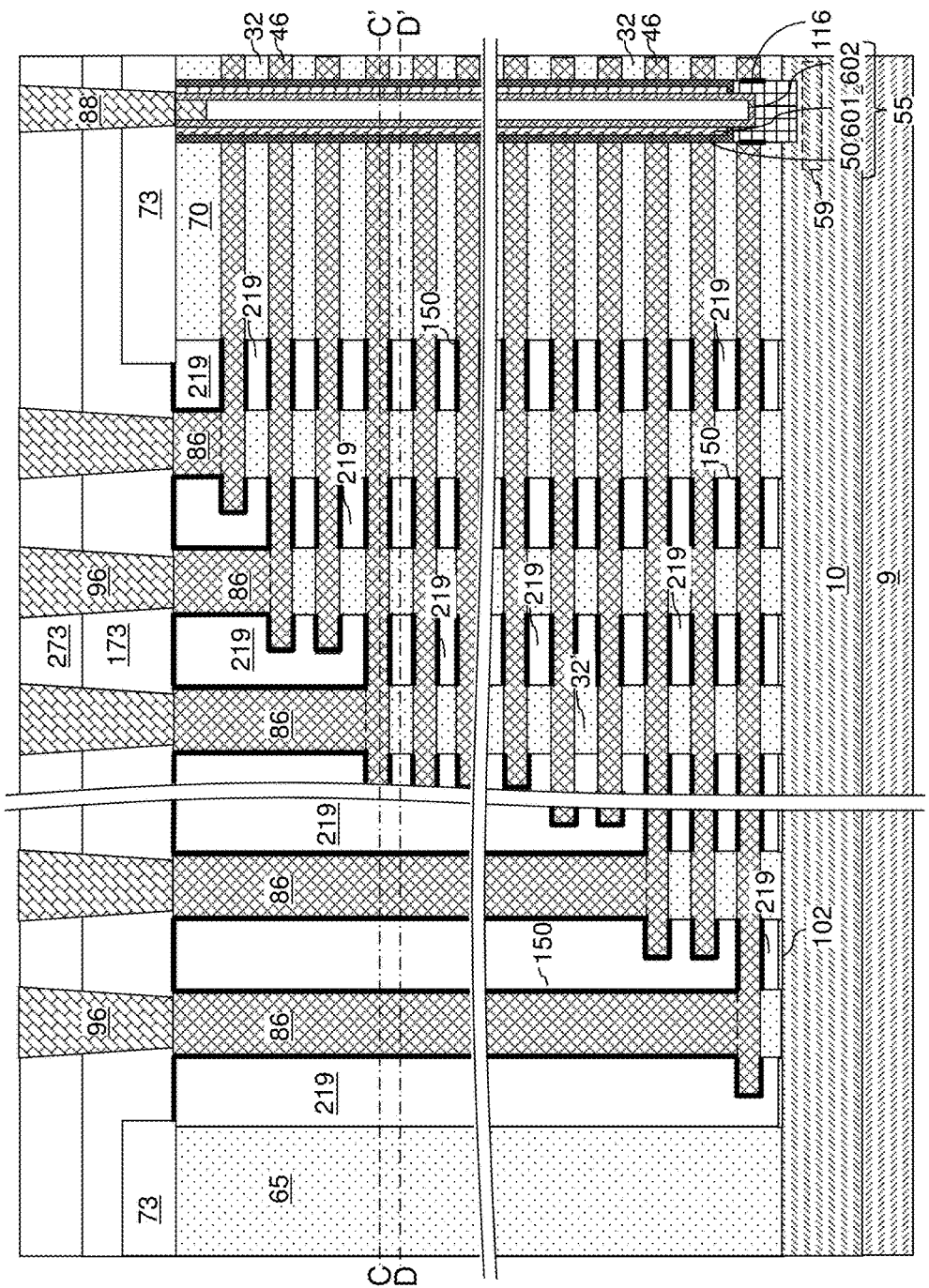
FIG. 22B is a second schematic vertical cross-sectional view of the exemplary structure of FIG. 22A.
Figure 22C:
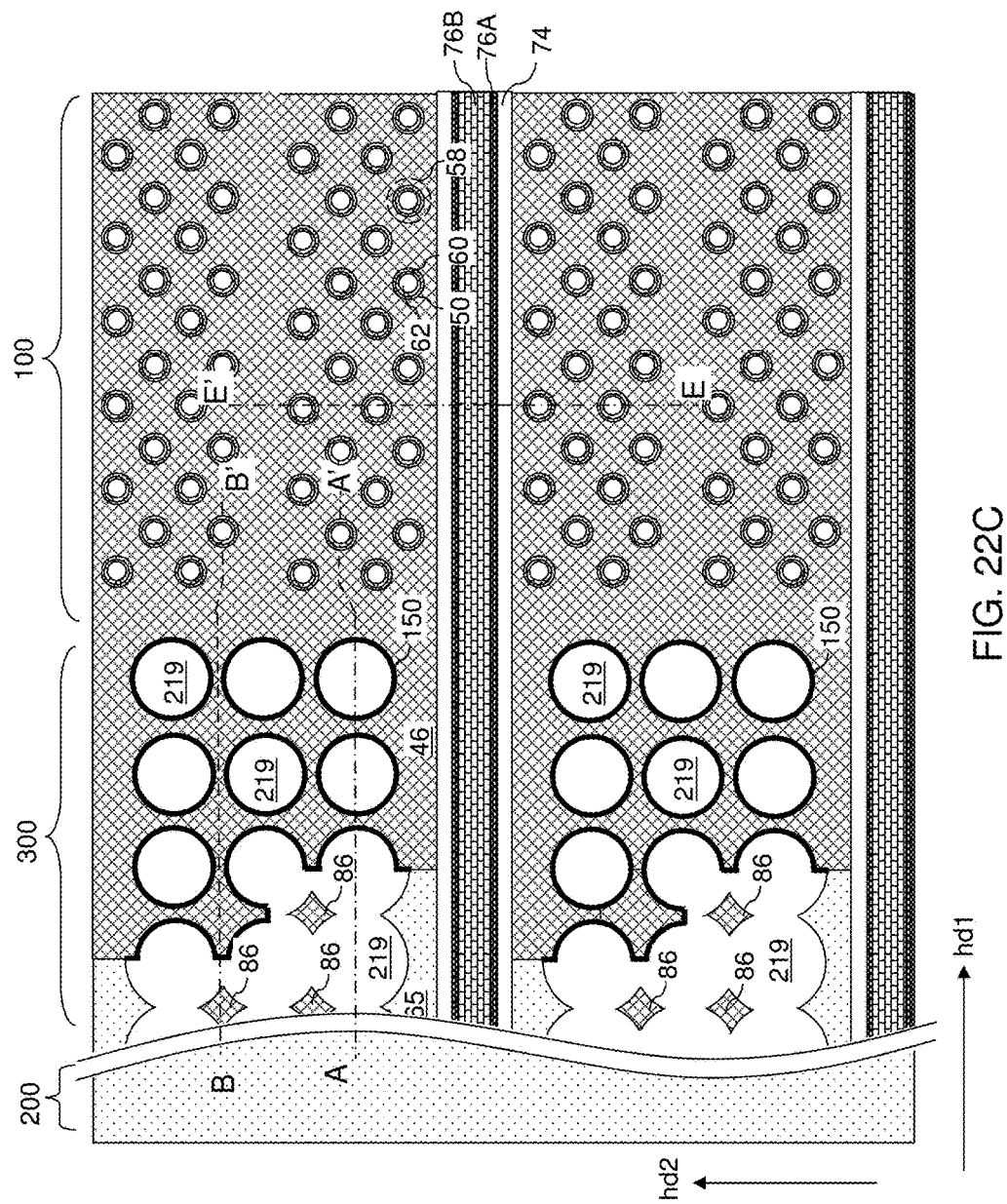
FIG. 22C is a first horizontal cross-sectional view of the exemplary structure along the horizontal plane C-C' of FIGS. 22A and 22B. The vertical plane A-A' is the plane of the view of FIG. 22A, and the vertical plane B-B' is the plane of the view of FIG. 22B.
Figure 22D:
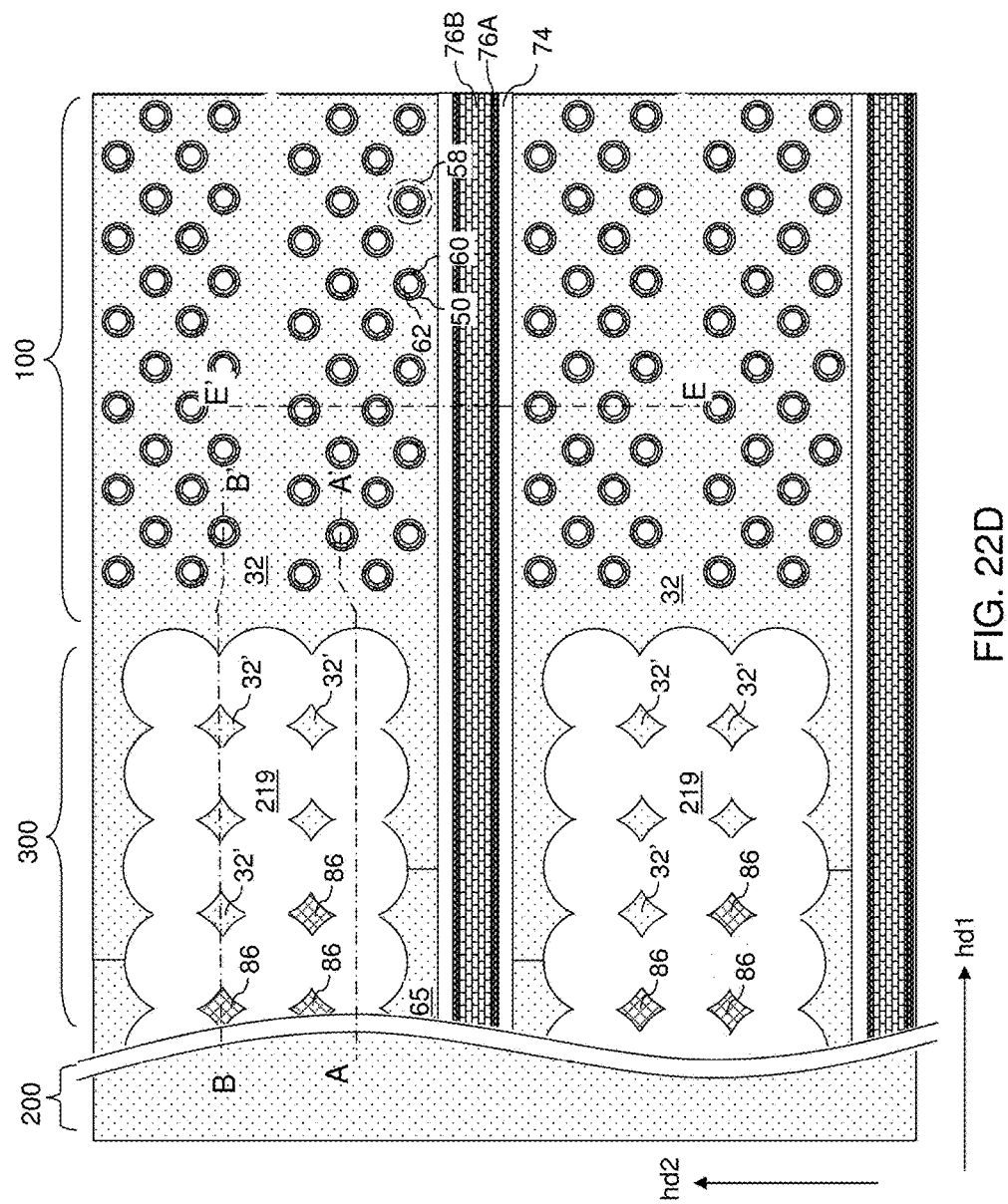
FIG. 22D is a first horizontal cross-sectional view of the exemplary structure along the horizontal plane D-D' of FIGS. 22A and 22B. The vertical plane A-A' is the plane of the view of FIG. 22A, and the vertical plane B-B' is the plane of the view of FIG. 22B.

As shown in FIG. 22B, various contact level interconnect via structures (88, 96) can be formed through the contact level dielectric layers (73, 173, 273). The various contact level interconnect via structures (88, 96) can include, for example, drain contact via structures 88 that are formed on top surfaces of the drain regions 63 and word line connection via structures 96 that are formed on the contact via structures 86, which are vertically extending portions of integrated word line and contact structures (46, 86).

As shown in FIGS. 22C to 22F, a photoresist layer (not shown) can be applied over the contact level dielectric layers (73, 173, 273), and can be lithographically patterned to form openings in areas between clusters of memory stack structures 55 and between continuous cavities 219. In one embodiment, the openings can be elongated openings that extend along the first horizontal direction hd1. The pattern in the photoresist layer can be transferred through the contact level dielectric layers (73, 173, 273), the insulating cap layer 70, the alternating stack (32, 46) of insulating layers 32 and electrically conductive layers 46, and the retro-stepped dielectric material portion 65 employing an anisotropic etch to form backside trenches. The backside trenches vertically extend from the top surface of the contact level dielectric layers (73, 173, 273) at least to the top surface of the substrate (9, 10), and laterally extend through the memory array region 100 and the contact region 300. The alternating stack (32, 46) of insulating layers 32 and electrically conductive layers 46 can be divided into a plurality of alternating stacks (32, 46) by the backside trenches. In one embodiment, the drain select level isolation structures 72 and the backside trenches can laterally extend along the first horizontal direction hd1. Each backside trench can have a uniform width that is invariant along the lengthwise direction (i.e., along the first direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench and a drain select level isolation structure 72, or between a neighboring pair of drain select level isolation structures 72. In one embodiment, the backside trenches can include a source contact opening in which a source contact via structure can be subsequently formed. The photoresist layer can be removed, for example, by ashing.

An insulating material layer can be formed in the backside trenches and over the contact level dielectric layers (73, 173, 273) by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layers (73, 173, 273) and at the bottom of each backside trench. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench.

Figure 22E:
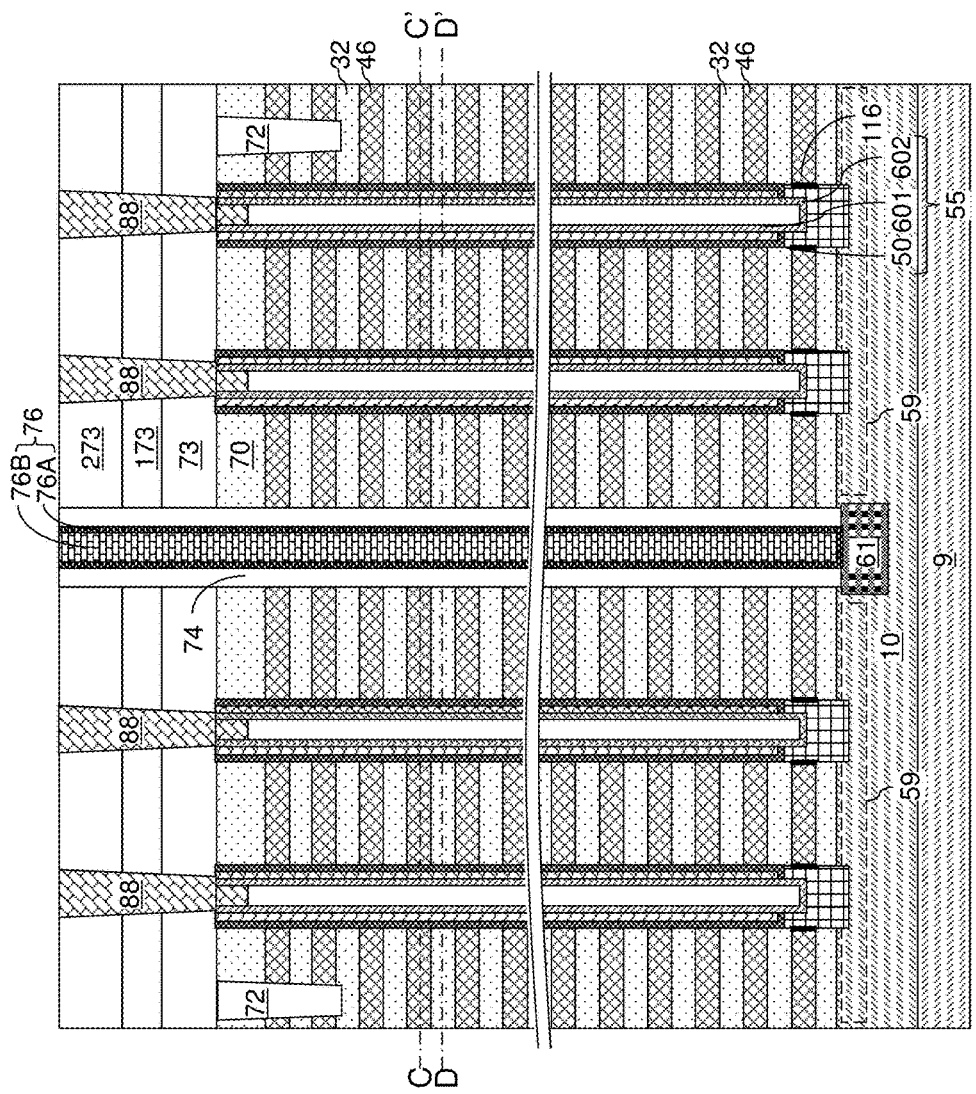
FIG. 22E is a third schematic vertical cross-sectional view along the vertical plane E-E' of the exemplary structure of FIGS. 22C and 22D.
Figure 22F:
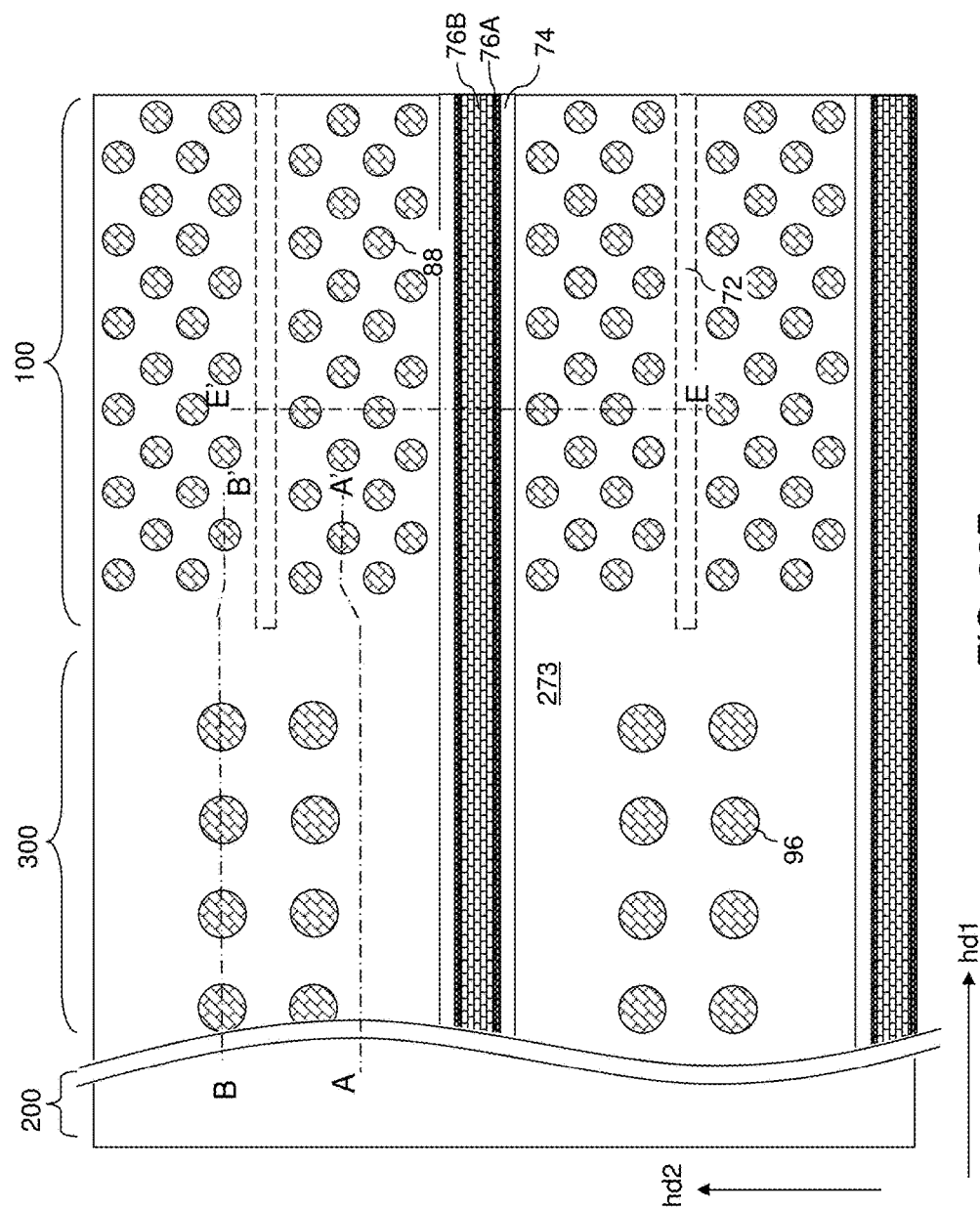
FIG. 22F is a top-down view of the exemplary structure of FIGS. 22A-22E. The vertical plane A-A' is the plane of the view of FIG. 22A, the vertical plane B-B' is the plane of the view of FIG. 22B, the vertical plane E-E' is the plane of the view of FIG. 22E.
Figure 23A:
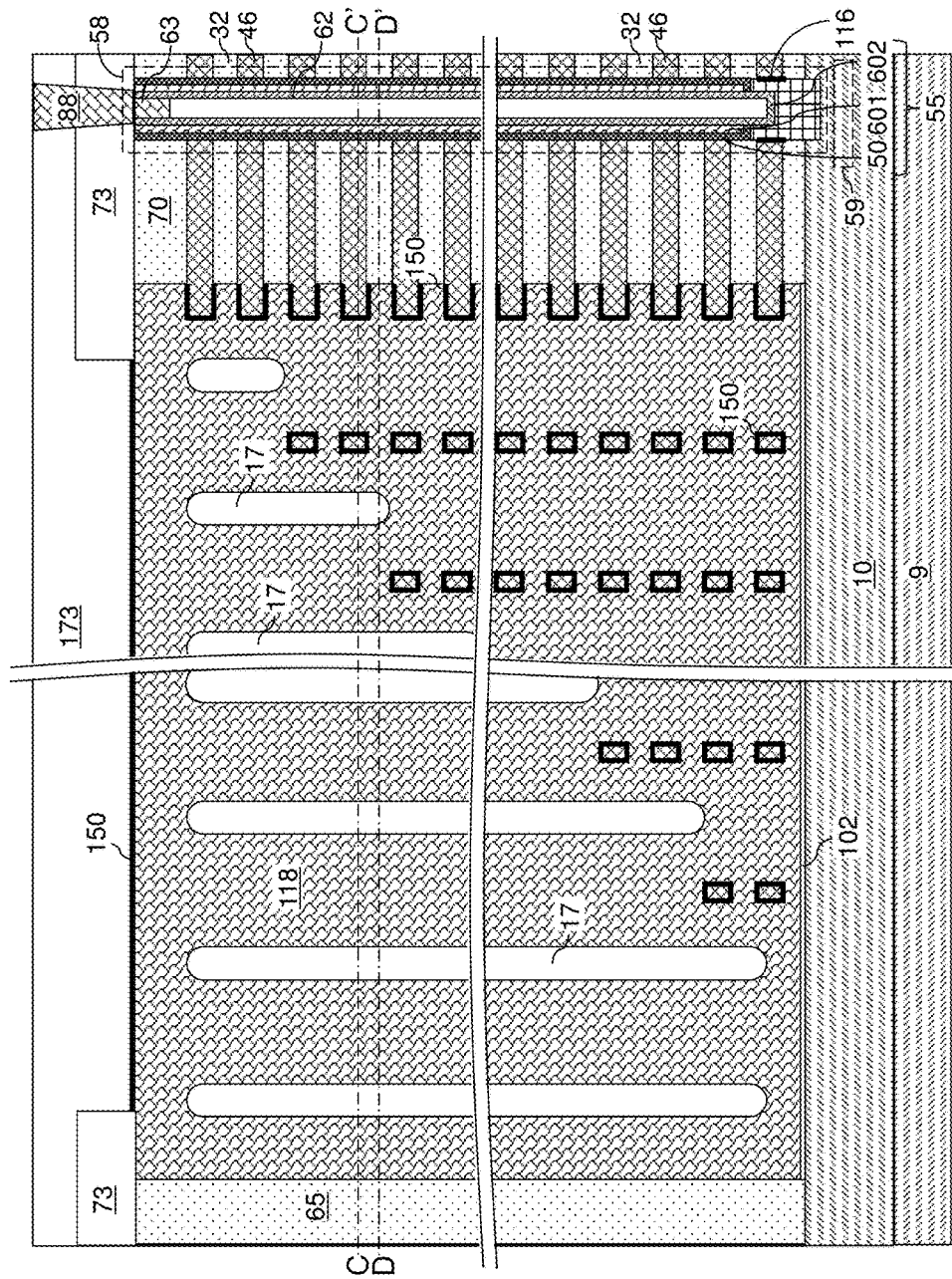
FIG. 23A is a first schematic vertical cross-sectional view of a first alternate embodiment of the exemplary structure after formation of contact level interconnect via structures according to an embodiment of the present disclosure.
Figure 23B:
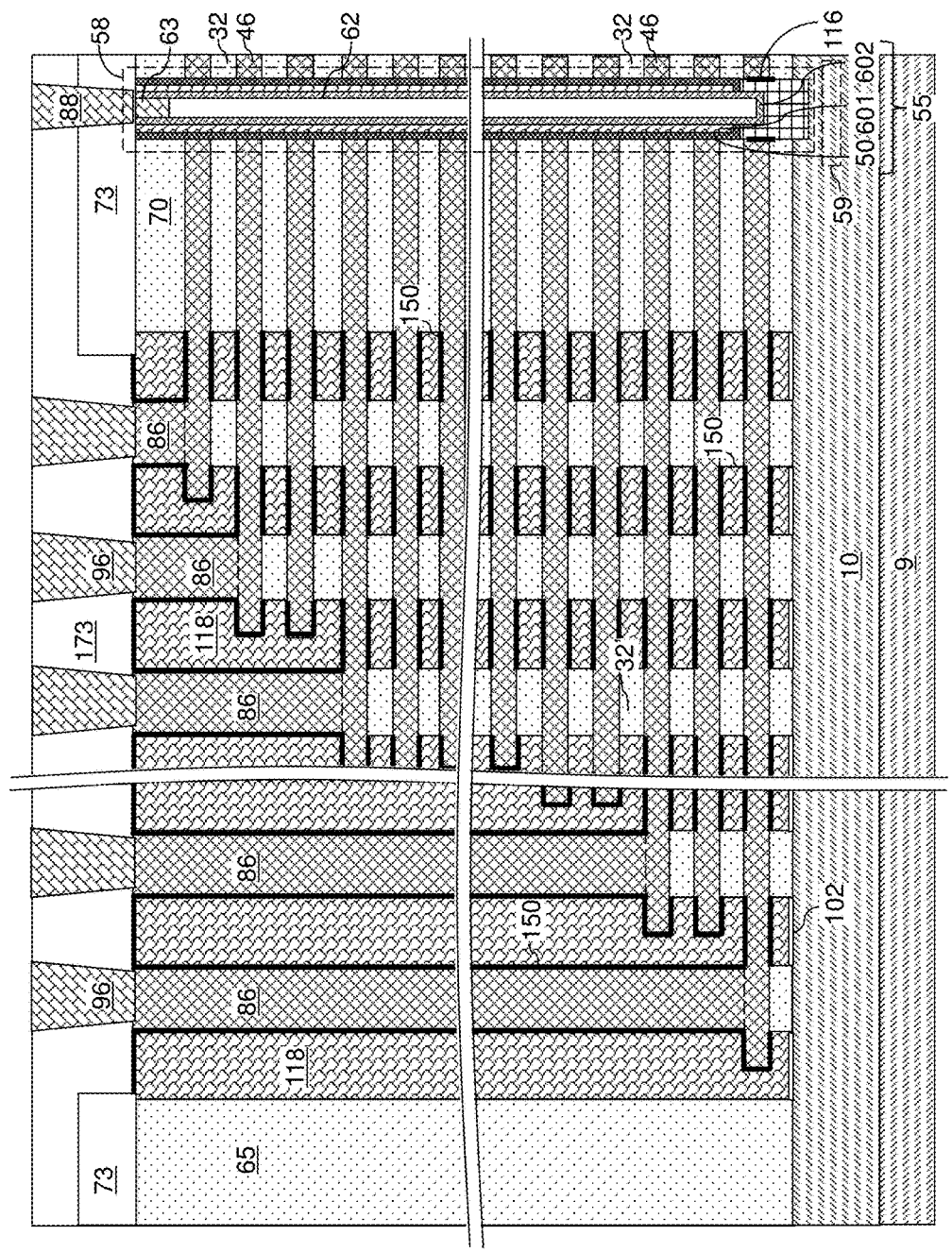
FIG. 23B is a second schematic vertical cross-sectional view of the exemplary structure of FIG. 23A.
Figure 23C:
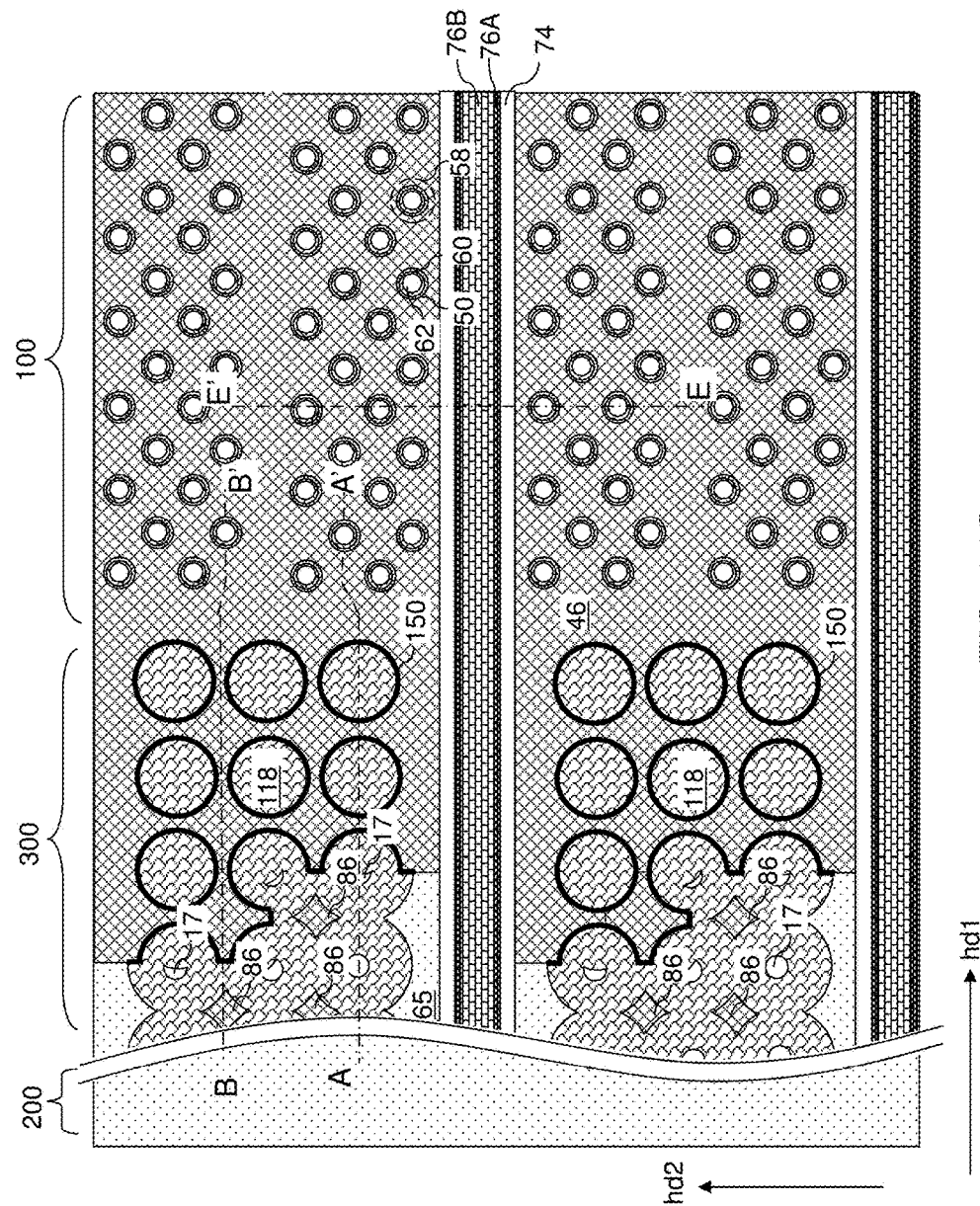
FIG. 23C is a first horizontal cross-sectional view of the exemplary structure along the horizontal plane C-C' of FIGS. 23A and 23B. The vertical plane A-A' is the plane of the view of FIG. 23A, and the vertical plane B-B' is the plane of the view of FIG. 23B.
Figure 23E:
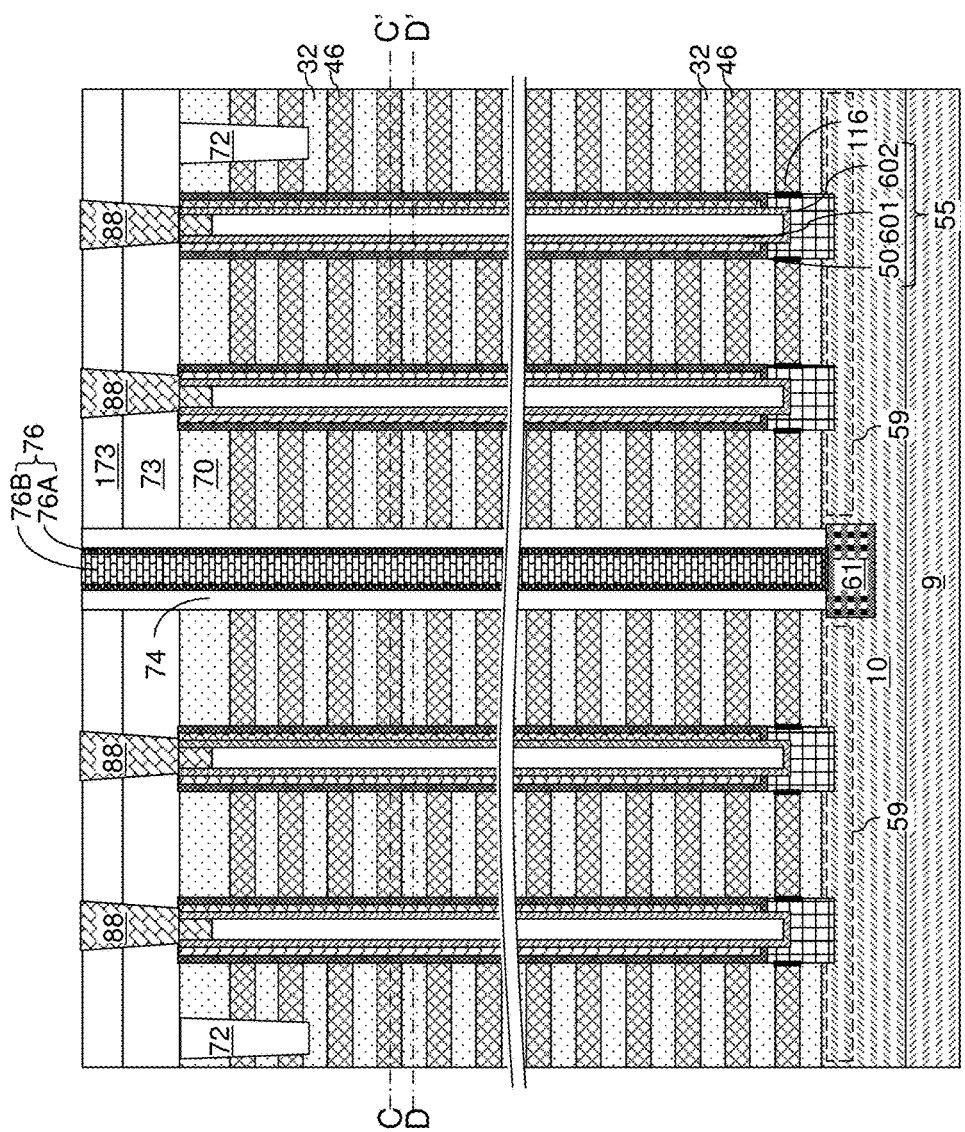
FIG. 23E is a third schematic vertical cross-sectional view along the vertical plane E-E' of the exemplary structure of FIGS. 23C and 23D.
Figure 23F:
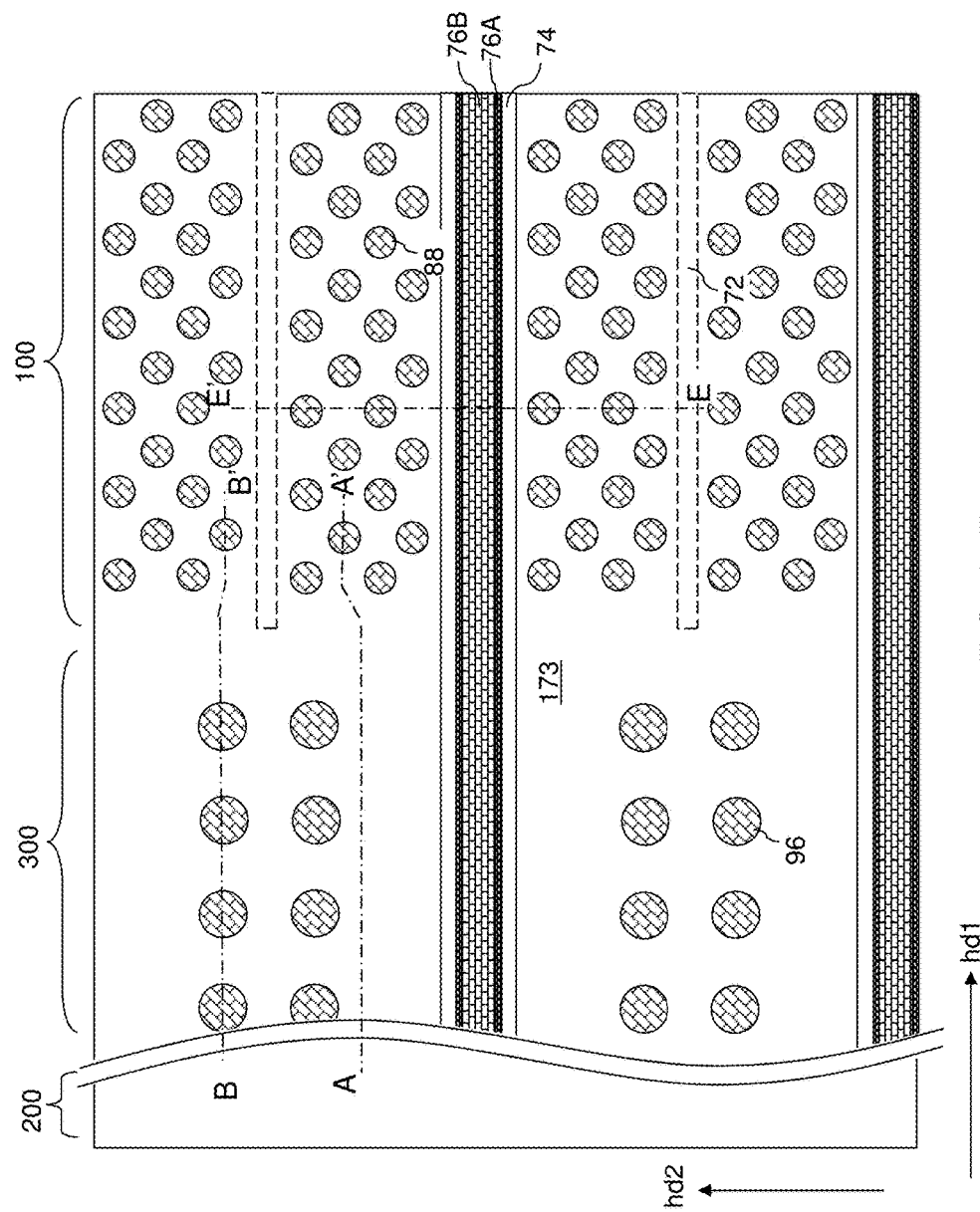
FIG. 23F is a top-down view of the exemplary structure of FIGS. 23A-23E. The vertical plane A-A' is the plane of the view of FIG. 23A, the vertical plane B-B' is the plane of the view of FIG. 23B, the vertical plane E-E' is the plane of the view of FIG. 23E.

As shown in FIG. 22E, a source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. One or more bottommost electrically conductive layers 46 provided upon formation of the electrically conductive layers 46 within the alternating stack (32, 46) can comprise a source select gate electrode for the field effect transistors. One or more topmost electrically conductive layers 46 located between (i.e., at the level of) the drain select level isolation structures 72 can comprise a drain select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. The contact via structures 76 can be formed by depositing at least one conductive material in the remaining unfilled volume (i.e., the backside cavity) of the backside trench. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layers (73, 173, 273) overlying the alternating stack (32, 46) as a stopping layer. If chemical mechanical planarization (CMP) process is employed, the contact level dielectric layers (73, 173, 273) can be employed as a CMP stopping layer. Each remaining continuous portion of the at least one conductive material in the backside trenches constitutes a backside contact via FIGS. 23A-23F illustrate a first alternate embodiment of the exemplary structure after formation of contact level interconnect via structures. The first alternate embodiment can be derived from the exemplary structure of FIGS. 19A and 19B by performing the processing steps of FIGS. 22A-22F with, or without, formation of the third contact level dielectric layer 273. The processing steps of FIGS. 20A-20C and 21A-21C are omitted in this case. If the third contact level dielectric layer 273 is omitted, the contact level interconnect via structures (88, 96) can be formed through the first and second contact level dielectric layer (73, 173). In this case, a continuous fill material portion 118 instead of the continuous cavity 219 laterally surrounds a plurality of contact via structures 86. In this case, the continuous fill material portion 118 can include a dielectric material such as undoped silicate glass, doped silicate glass, or organosilicate glass.

Figure 24:
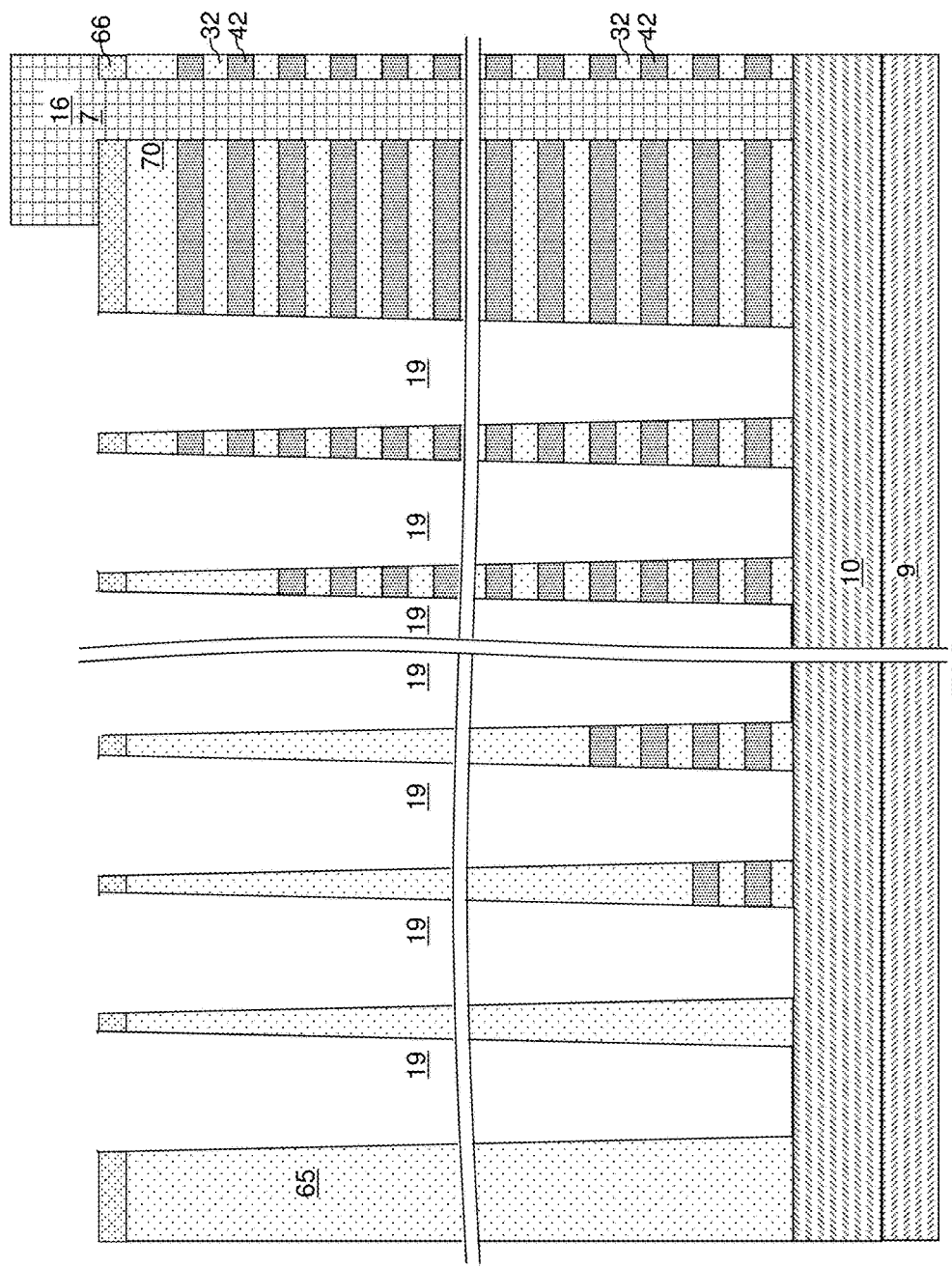
FIG. 24 is a schematic vertical cross-sectional view of a second alternate embodiment of the exemplary structure at the processing steps of FIGS. 5A-5D.

Referring to FIG. 24, a second alternate embodiment of the exemplary structure according to an embodiment of the present disclosure can be derived from the exemplary structure of FIGS. 4A-4C by inducing formation of a finite taper angle to the sidewalls of the cylindrical openings 19. The taper angle can be, for example, in a range from 0 degree to 10 degrees.

Figure 25:
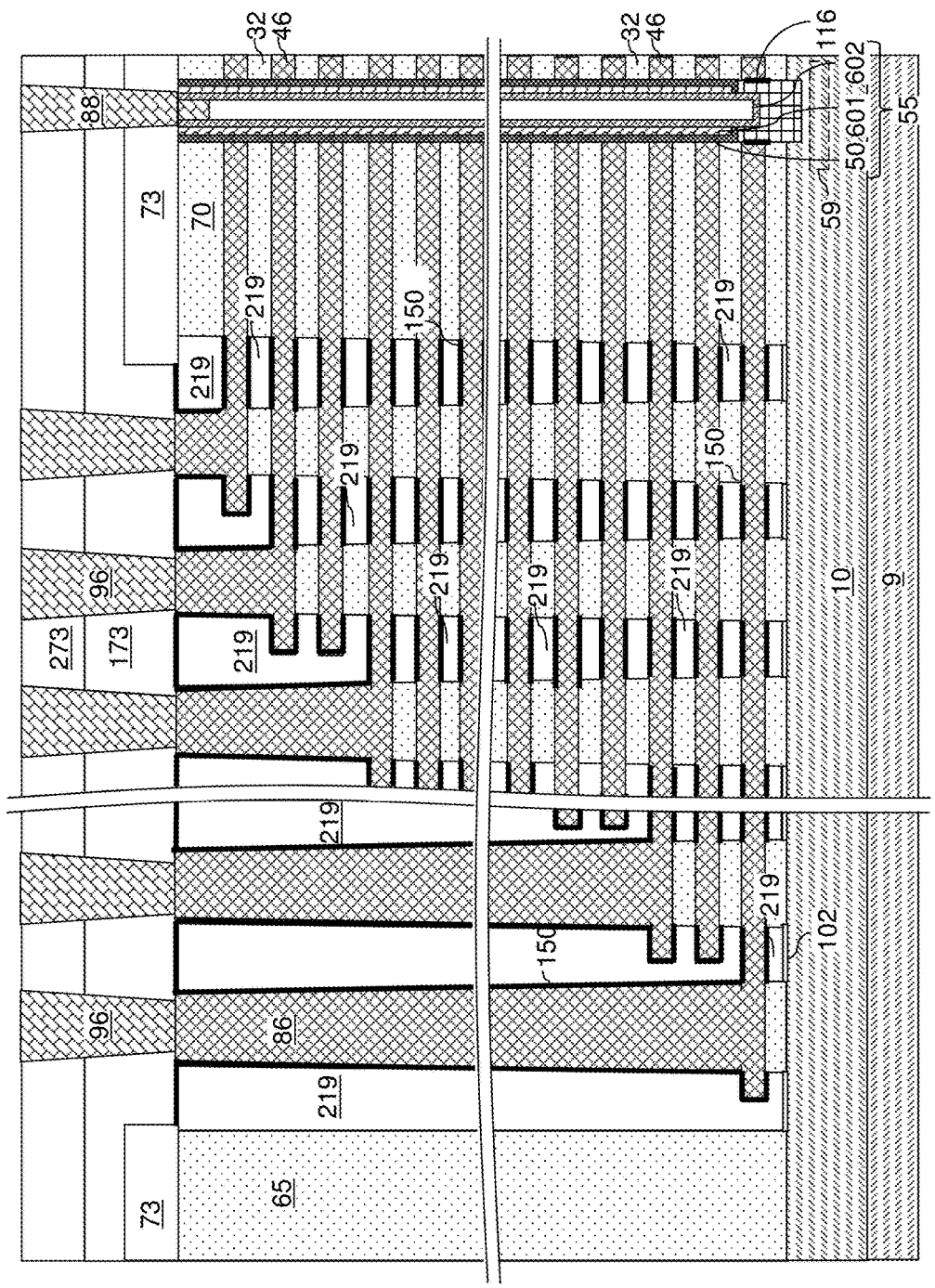
FIG. 25 is a schematic vertical cross-sectional view of the second alternate embodiment of the exemplary structure at the processing steps of FIGS. 22A-22F.

Referring to FIG. 25, subsequent processing steps can be performed as described above. If the cylindrical openings 19 are formed with a taper angle, the vertically-extending concave sidewalls of the contact via structures 86 can have a taper angle with respect to a vertical direction that is perpendicular to a top surface of the substrate (9, 10). The maximum lateral extent of each of the contact via structures 86 decreases with a vertical distance from the top surface of the substrate (9, 10).

FIGS. 26A and 26B are schematic horizontal cross sectional views of the exemplary structure at the process steps shown in FIGS. 5A and 6A, respectively. As shown in FIG. 26A, the cylindrical openings 19 can be formed at the corners of square steps having a horizontal length and width "a". For example, the middle step Gn has a length in the first horizontal direction hd1 (i.e., word line direction) of "a" and the width in the second horizontal direction hd2 of "a". In the configuration of FIG. 26A, two columns of staircases having a column width "GY" are formed for each block of memory stack structures to be subsequently formed such that one column of staircases provide physically exposed top surfaces for odd-numbered sacrificial material layers and another column of staircases provide physically exposed top surfaces for even-numbered sacrificial material layers. For example, adjacent steps Gn−2 and Gn+2 are located on opposite ends of the middle step Gn in the same column of staircases.

As shown in FIG. 26B, after formation of the continuous cavity 19C, each dielectric pillar structure 65' and each underlying dielectric pedestal portion 32' has a horizontal cross sectional area, A=0.21a$^2$ and a shape of a four pointed star with four concave sidewalls. After replacement of the dielectric pillar structure 65' with the contact via structures 86, each contact via structure 86 will have horizontal cross sectional area of 0.21a$^2$ and a shape of the four pointed star with four concave sidewalls, which provides a lower sheet resistance in contact with the electrically conductive layers 46.

FIGS. 27A and 27B are schematic horizontal cross sectional views of the second exemplary structure at the process steps shown in FIGS. 5A and 6A, respectively. As shown in FIG. 27A, the cylindrical openings 19 can be formed at sidewalls of rectangular steps having a horizontal length of "0.87a" and width of "a". One cylindrical opening is formed at the middle of the shorter side of the step which extends in the first horizontal direction hd1 and two cylindrical openings 19 are formed at ⅓ and ⅔ points of longer side of the step which extends in the second horizontal direction hd2. The cylindrical openings 19 in each step are arranged at corner points of an imaginary regular hexagon.

As shown in FIG. 27B, after formation of the continuous cavity 19C, each dielectric pillar structure 65' and each underlying dielectric pedestal portion 32' has a horizontal cross sectional area of 1.3 A and a shape of a six pointed star with six concave sidewalls. After replacement of the dielectric pillar structure 65' with the contact via structures 86, each contact via structure 86 will have horizontal cross sectional area of 1.3 A and a shape of the six pointed star with six concave sidewalls. This configuration reduces the device size by reducing the step (i.e., terrace) size and provides a larger area for the dielectric pillar structure 65' and each underlying dielectric pedestal portion 32' as well as for each contact via structure 86.

FIGS. 28A and 28B are schematic horizontal cross sectional views of the third exemplary structure at the process steps shown in FIGS. 5A and 6A, respectively. As shown in FIG. 28A, the cylindrical openings 19 can be formed at both corners and sidewalls of square steps having a horizontal length and width of "a". The cylindrical opening 19 are formed at the half way point of each side of the step and at each of the four corners of the step.

As shown in FIG. 28B, after formation of the continuous cavity 19C, each dielectric pillar structure 65' and each underlying dielectric pedestal portion 32' has a horizontal cross sectional area of 2 A and a shape of a cross having four larger concave sidewalls between the arms of the cross, and four smaller concave sidewalls at the tip of each arm of the cross. After replacement of the dielectric pillar structure 65' with the contact via structures 86, each contact via structure 86 will have horizontal cross sectional area of 2 A and a shape of a cross having four larger concave sidewalls between the arms of the cross, and four smaller concave sidewalls at the tip of each arm of the cross.

Thus, each dielectric pillar structure 65', each underlying dielectric pedestal portion 32' and each contact via structure 86 may have various horizontal cross sectional shapes. Preferably, these shapes have at least four concave sidewalls, such as four to eight concave sidewalls.

Referring to all drawings and according to various embodiments of the present disclosure, a three-dimensional memory device is provided, which comprises: an alternating stack of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60 contacting an inner sidewall of the memory film 50; and contact via structures 86 adjoined to a top surface of a respective one of the electrically conductive layers 46, wherein each of the contact via structures 86 includes a respective set of at least four vertically-extending concave sidewalls.

The alternating stack (32, 46) comprises a terrace region in which each electrically conductive layer 46 other than a topmost electrically conductive layer within the alternating stack (32, 46) laterally extends farther than an overlying electrically conductive layer within the alternating stack (32, 46); and each of the contact via structures 86 is adjoined to the top surface of the respective one of the electrically conductive layers 46 within the terrace region. In one embodiment, a conductive material having a same material composition continuously extends across each adjoined pair of an electrically conductive layer 46 and a contact via structure 86 from a memory array region including the memory stack structures 55 to a top surface of the contact via structure 86. In one embodiment, the vertically-extending concave sidewalls of the contact via structures 86 have a same radius of curvature within a horizontal plane vertically spaced from a top surface of the substrate (9, 10).

In one embodiment, the three-dimensional memory device can include a continuous cavity 219 that is free of any solid material therein and laterally surrounds a plurality of contact via structures 86 among the contact via structures 86. Insulating pedestal portions 32' can be located between a respective vertically neighboring pair of electrically conductive layers 46 and underneath a respective one of the contact via structures 86. In one embodiment, a plurality of insulating pedestal portions 32' among the insulating pedestal portions 32' is laterally surrounded by the continuous cavity 219. In one embodiment, each of the insulating pedestal portions 32' has a respective set of at least four vertically-extending concave insulating surfaces. In one embodiment, each of the insulating pedestal portions 32' has an areal overlap with an overlying one of the contact via structures 86 in a plan view along a vertical direction that is perpendicular to a top surface of the substrate (9, 10).

In one embodiment, the continuous cavity 219 extends through openings in the electrically conductive layers 46 (as illustrated, for example, in FIG. 22C); sidewalls of the electrically conductive layers 46 around the openings have concave vertical surfaces that includes a respective closed periphery; and one of the contact via structures 86 overlies a region of one of the electrically conductive layers 46 that is surrounded by a set of four neighboring openings therethrough.

In one embodiment, each of the contact via structures 86 is laterally surrounded by a respective silicon oxide liner 150; and each electrically conductive layer 46 is spaced from the continuous cavity 219 by one of the silicon oxide liners 150.

In one embodiment, the three-dimensional memory device further comprises a continuous fill material portion 118 laterally surrounding a plurality of contact via structures 86 among the contact via structures 86.

In one embodiment, the vertically-extending concave sidewalls of the contact via structures 86 have a taper angle with respect to a vertical direction that is perpendicular to a top surface of the substrate (9, 10); and a maximum lateral extent of each of the contact via structures 86 decreases with a vertical distance from the top surface of the substrate (9, 10).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The embodiments of the present disclosure provide the following non-limiting advantages over prior art contact via structures. Separate support pillars are not required in the contact region 300, which eliminates the requirement to include a photolithographic distance margin between the contact via structures 86 and the surrounding support pillar structures. This can provide smaller step/terrace size to decrease the device dimensions. Furthermore, since the word lines 46 and their respective contact via structures 86 are integral and are formed in the same deposition step by self alignment, the risk of a punch through etch through the word lines 46 is eliminated, device yield is increased and process cost is reduced. Finally, the ability to easily form cavities (e.g., air gaps) between adjacent contact via structures 86 improves the electrical isolation between adjacent contact via structures 86.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures extending through the alternating stack, wherein each of the memory stack structures comprises a memory film and a vertical semiconductor channel contacting an inner sidewall of the memory film; and
contact via structures adjoined to a top surface of a respective one of the electrically conductive layers, wherein each of the contact via structures includes a respective set of four vertically-extending concave sidewalls.

2. The three-dimensional memory device of claim 1, wherein:
the alternating stack comprises a terrace region in which each electrically conductive layer other than a topmost electrically conductive layer within the alternating stack laterally extends farther than an overlying electrically conductive layer within the alternating stack; and
each of the contact via structures is adjoined to the top surface of the respective one of the electrically conductive layers within the terrace region.

3. The three-dimensional memory device of claim 1, wherein a conductive material having a same material composition continuously extends across each adjoined pair of an electrically conductive layer and a contact via structure from a memory array region including the memory stack structures to a top surface of the contact via structure.

4. The three-dimensional memory device of claim 1, wherein:
the contact via structures have a horizontal cross sectional shape of a four pointed star with four concave sidewalls; and
the vertically-extending concave sidewalls of the contact via structures have a same radius of curvature within a horizontal plane vertically spaced from a top surface of the substrate.

5. The three-dimensional memory device of claim 1, wherein the contact via structures have a horizontal cross sectional shape of shape of the six pointed star with six concave sidewalls.

6. The three-dimensional memory device of claim 1, wherein the contact via structures have a horizontal cross sectional shape of a cross having four larger concave sidewalls between arms of the cross, and four smaller concave sidewalls at a tip of each arm of the cross.

7. The three-dimensional memory device of claim 1, further comprising a continuous cavity that is free of any solid material therein and laterally surrounds a plurality of contact via structures among the contact via structures.

8. The three-dimensional memory device of claim 7, further comprising insulating pedestal portions located between a respective vertically neighboring pair of electrically conductive layers and located underneath a respective one of the contact via structures.

9. The three-dimensional memory device of claim 8, wherein:
a plurality of insulating pedestal portions among the insulating pedestal portions is laterally surrounded by the continuous cavity;
each of the insulating pedestal portions has a respective set of four vertically-extending concave insulating surfaces; and
each of the insulating pedestal portions has an areal overlap with an overlying one of the contact via structures in a plan view along a vertical direction that is perpendicular to a top surface of the substrate.

10. The three-dimensional memory device of claim 8, wherein:
the continuous cavity extends through openings in the electrically conductive layers; and
sidewalls of the electrically conductive layers around the openings have concave vertical surfaces that includes a respective closed periphery.

11. The three-dimensional memory device of claim 8, wherein:
each of the contact via structures is laterally surrounded by a silicon oxide liner; and
each electrically conductive layer is spaced from the continuous cavity by the silicon oxide liner.

12. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *